United States Patent
Saito et al.

(10) Patent No.: US 7,750,390 B2
(45) Date of Patent: Jul. 6, 2010

(54) SPIN FET AND SPIN MEMORY

(75) Inventors: Yoshiaki Saito, Kawasaki (JP);
 Hideyuki Sugiyama, Yokohama (JP);
 Tomoaki Inokuchi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 124 days.

(21) Appl. No.: 11/610,100

(22) Filed: Dec. 13, 2006

(65) Prior Publication Data
 US 2007/0164336 A1 Jul. 19, 2007

(30) Foreign Application Priority Data
 Jan. 17, 2006 (JP) ............................... 2006-009266

(51) Int. Cl.
 *H01L 29/76* (2006.01)
 *H01L 29/94* (2006.01)

(52) U.S. Cl. ..................................... 257/314

(58) Field of Classification Search ................ 365/158, 365/171; 257/295, E27.104, E29.164, E29.272, 257/E21.208, E21.436, E21.663, E21.664, 257/E43.001–E43.007, E27.005–E27.006, 257/E27.008, E29.323; 438/3, 785, E21.208, 438/E21.436, E21.663–E21.665
 See application file for complete search history.

(56) References Cited

U.S. PATENT DOCUMENTS 5,654,566 A * 8/1997 Johnson ...................... 257/295
7,411,235 B2 * 8/2008 Saito et al. .................. 257/295
2005/0169047 A1 * 8/2005 Johnson ...................... 365/158
2005/0282379 A1 12/2005 Saito et al.
2006/0131627 A1 * 6/2006 Kondo et al. ................. 257/295
2008/0067501 A1 * 3/2008 Sugahara et al. ............. 257/38
2008/0308853 A1 * 12/2008 Sugahara et al. ............. 257/295

FOREIGN PATENT DOCUMENTS

| JP | 2001-339110 | 12/2001 |
|---|---|---|
| JP | 2004-014806 | 1/2004 |
| JP | 2004-179219 | 6/2004 |
| JP | 2004-304144 | 10/2004 |
| JP | 2005-104744 | 4/2005 |
| JP | 2005-197271 | 7/2005 |

OTHER PUBLICATIONS

U.S. Appl. No. 11/771,295, filed Jun. 29, 2007, Saito, et al.
Ch. Binek, et al., "Electrically controlled exchange bias for spintronic applications", Journal of Applied Physics 97, 10C514, 2005, pp. 1-3.
H. Zheng, et al., "Multiferroic $BaTiO_3$—$CoFe_2O_4$ Nanostructures", Science, vol. 303, Jan. 30, 2004, p. 661-663.

* cited by examiner

*Primary Examiner*—Dao H Nguyen
*Assistant Examiner*—Tram H Nguyen
(74) *Attorney, Agent, or Firm*—Oblon, Spivak, McClelland, Maier & Neustadt, L.L.P.

(57) ABSTRACT

A spin FET according to an example of the present invention includes a magnetic pinned layer whose magnetization direction is fixed, a magnetic free layer whose magnetization direction is changed, a channel between the magnetic pinned layer and the magnetic free layer, a gate electrode provided on the channel via a gate insulation layer, and a multiferroic layer which is provided on the magnetic free layer, and whose magnetization direction is changed by an electric field.

22 Claims, 39 Drawing Sheets

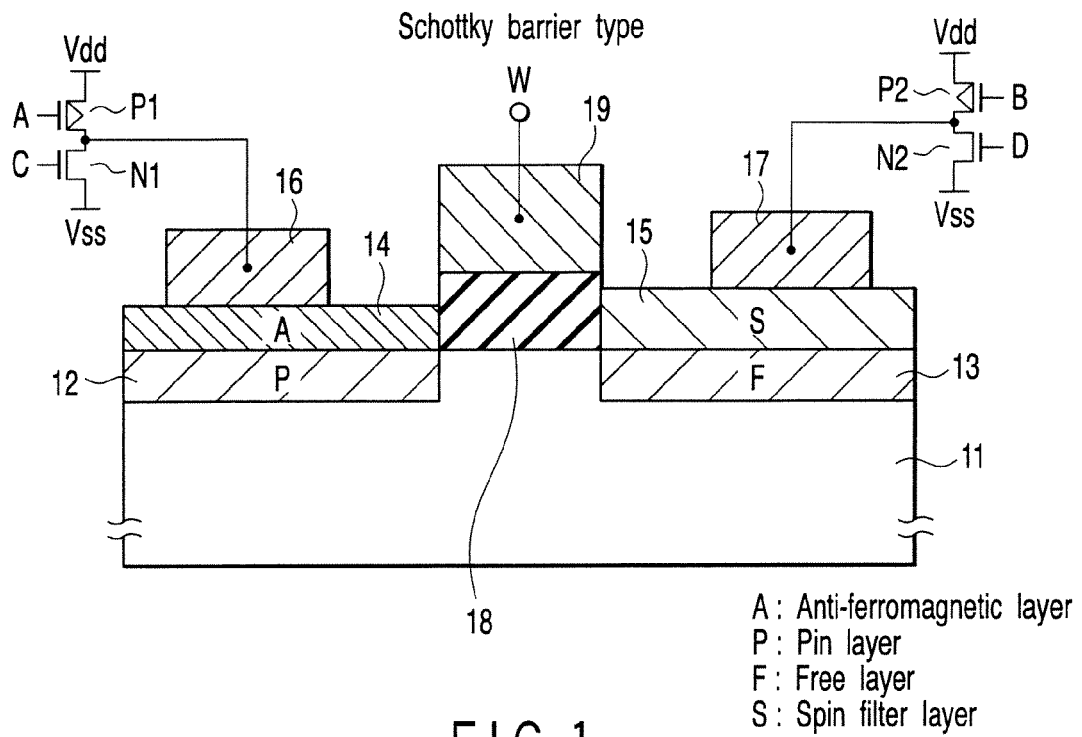
F I G. 1
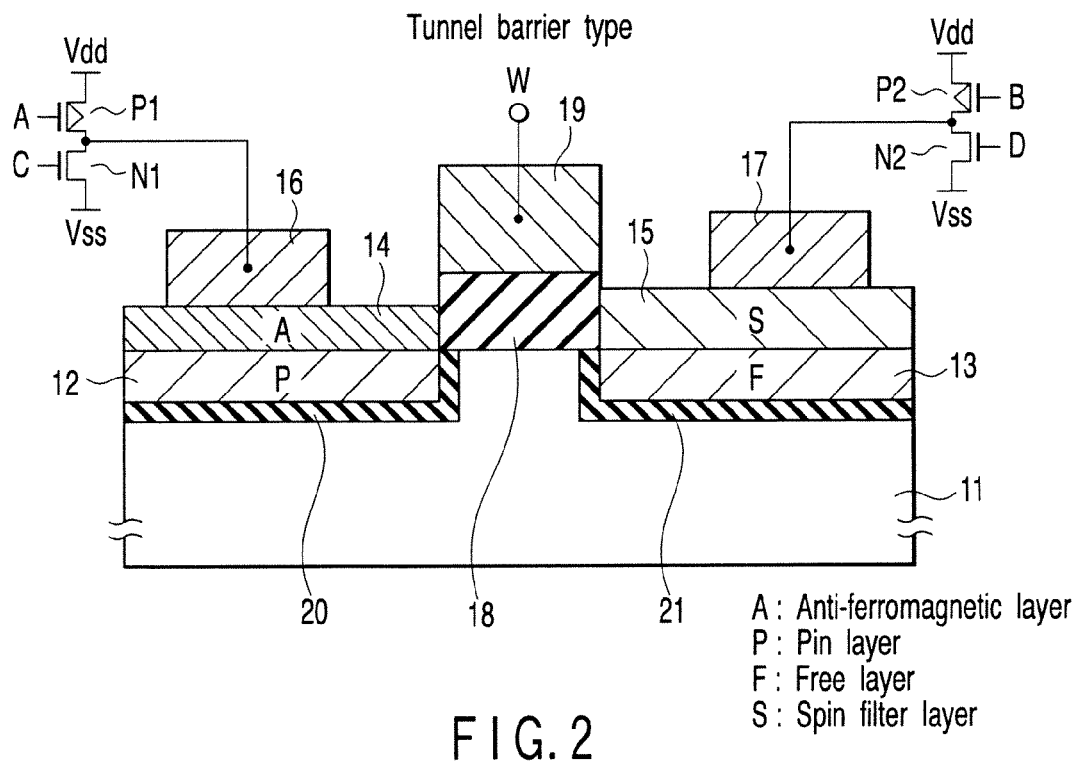
F I G. 2

Readout operation (typical example)

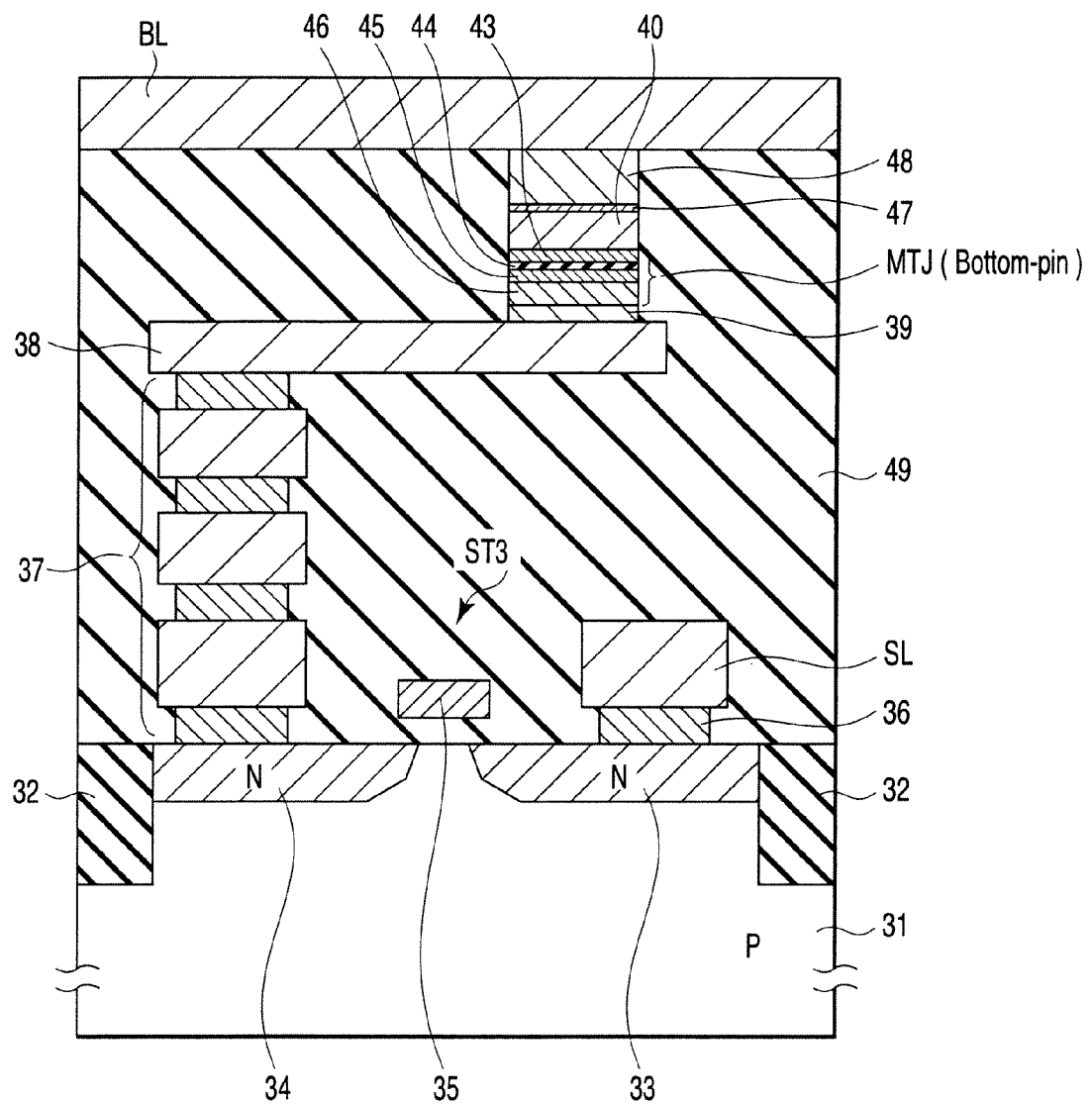
F I G. 17

Case in which pin layer 12 is half metal

E : Energy
⇧ : UP spin
⇩ : DOWN spin

Spin memory (memory cells)

P : Pin layer
F : Free layer
S : Spin filter layer

Spin memory (memory cells)

E: Energy
⇧: UP spin
⇩: DOWN spin

Case in which pin layer 12 is half metal

E : Energy
⇧ : UP spin
⇩ : DOWN spin

Spin FET

A : Anti-ferromagnetic layer
P : Pin layer
F : Free layer
S : Spin filter layer

Spin memory (memory cell)

P: Pin layer
F: Free layer
S: Spin filter layer

Spin FET

A: Anti-ferromagnetic layer
P: Pin layer
F: Free layer
S: Spin filter layer

Spin memory (memory cell)

P: Pin layer
F: Free layer
S: Spin filter layer

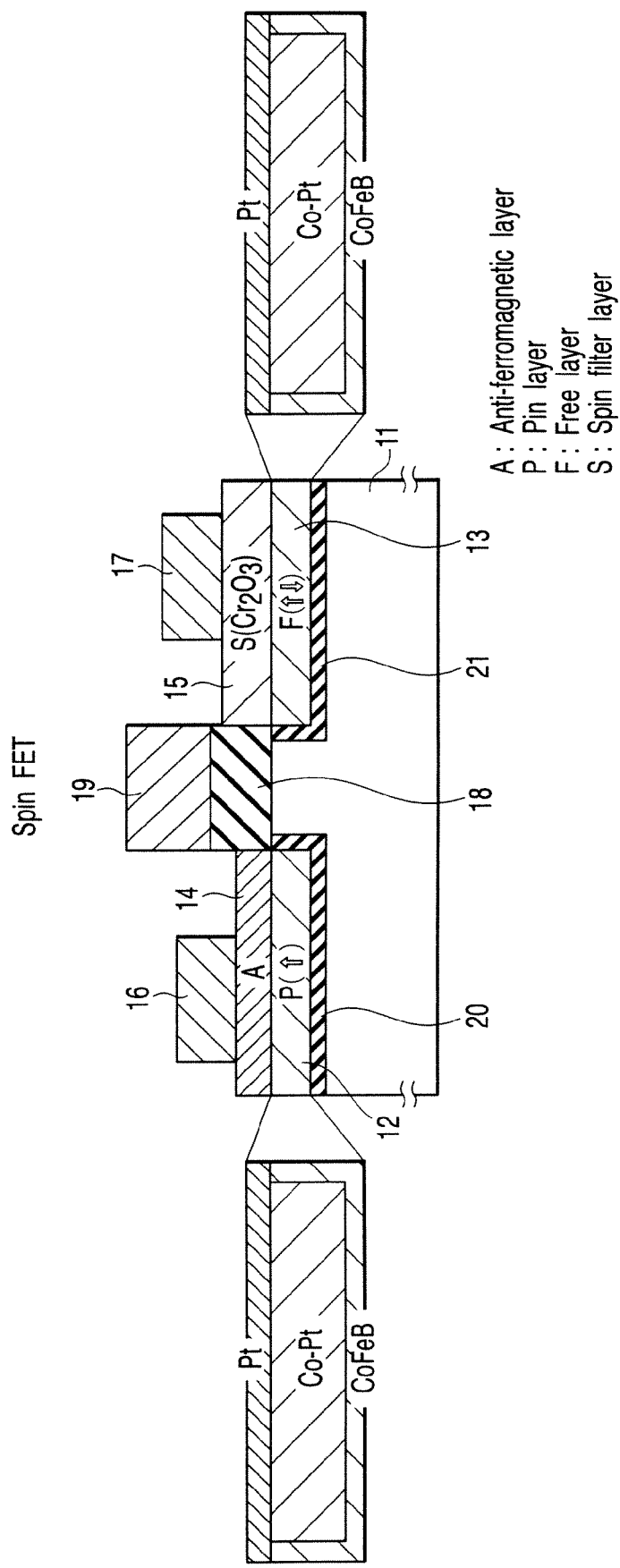
F I G. 39

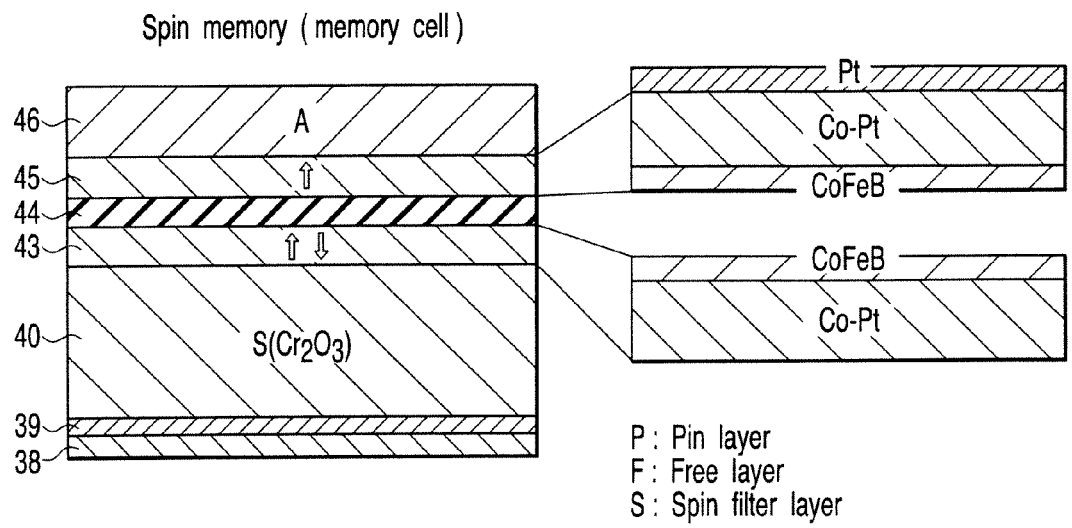
F I G. 40
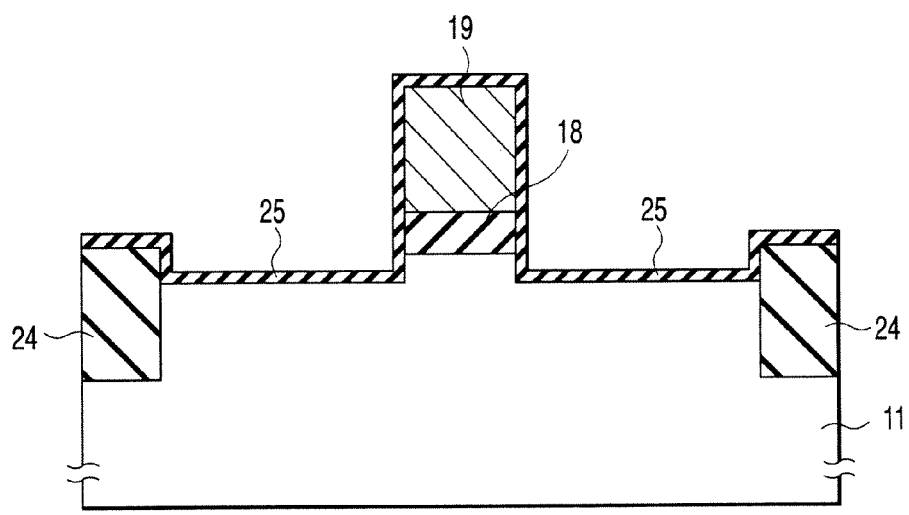
F I G. 41

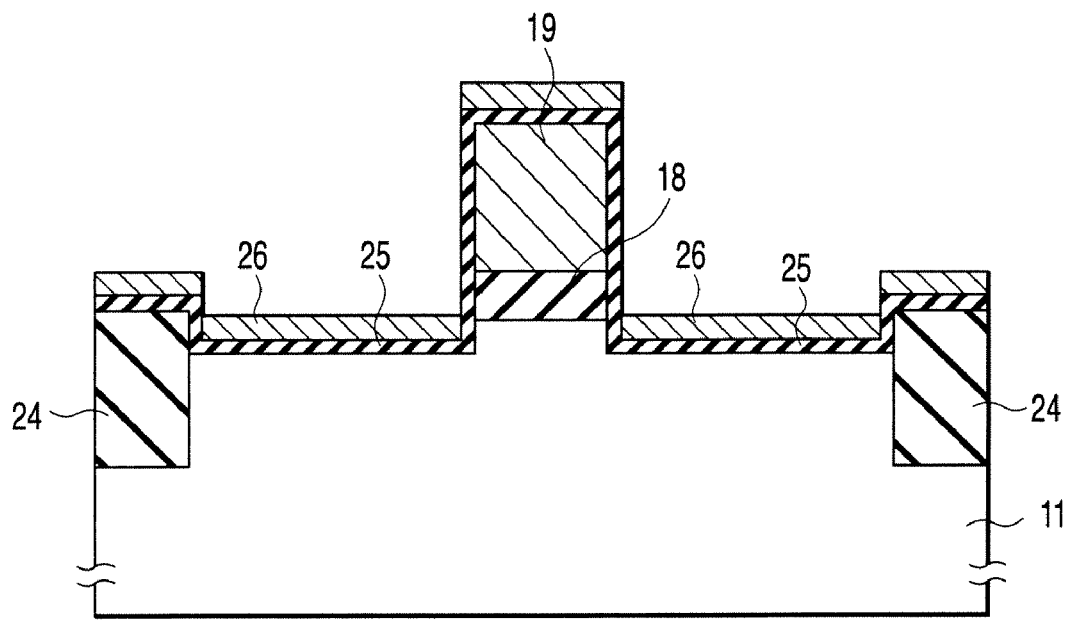
F I G. 42
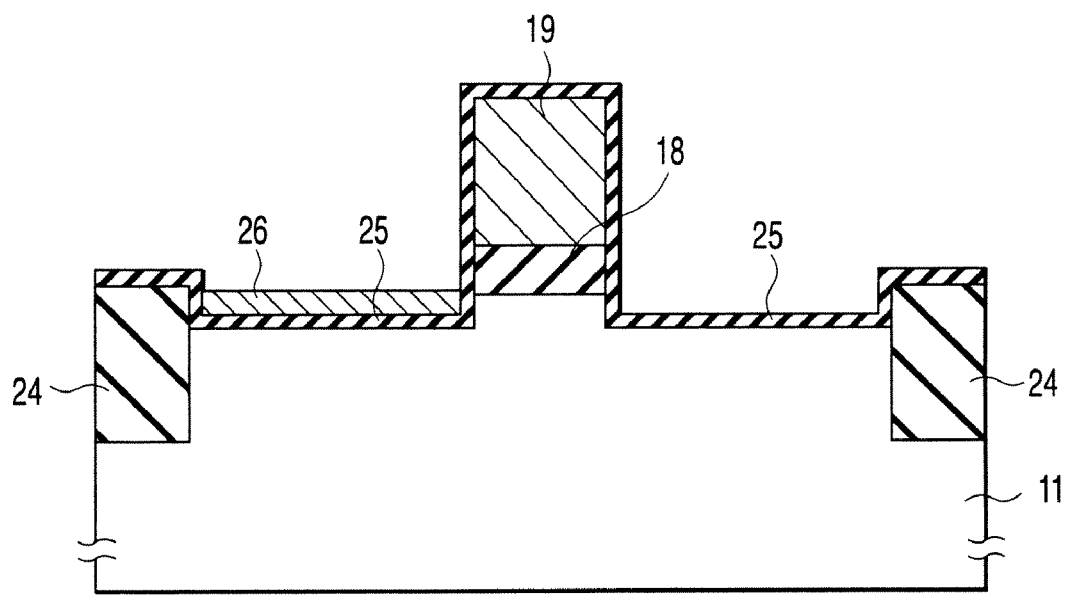
F I G. 43

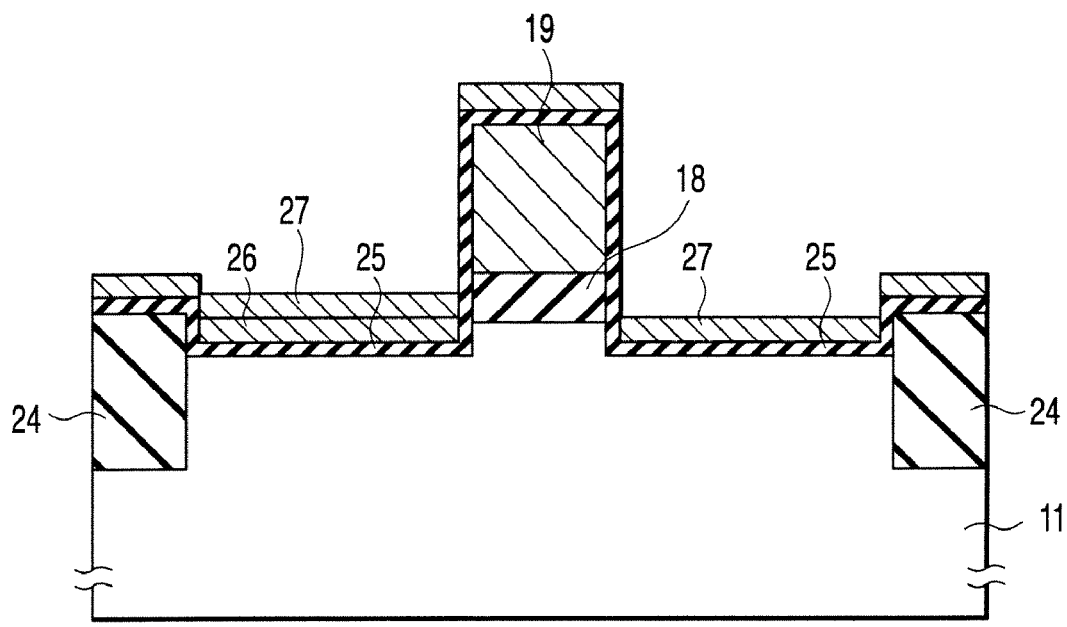
F I G. 4 4
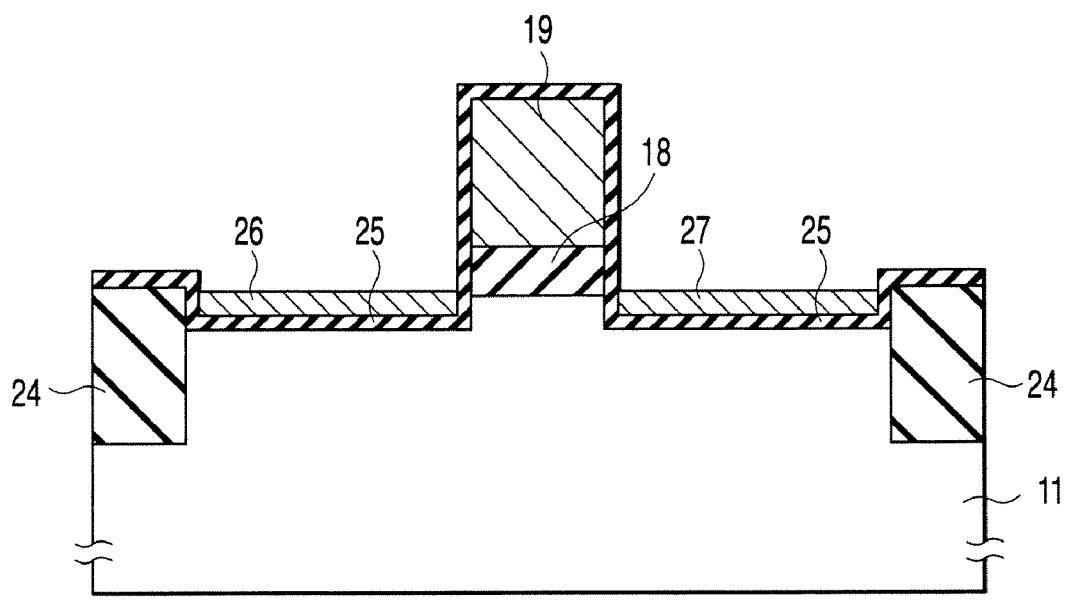
F I G. 4 5

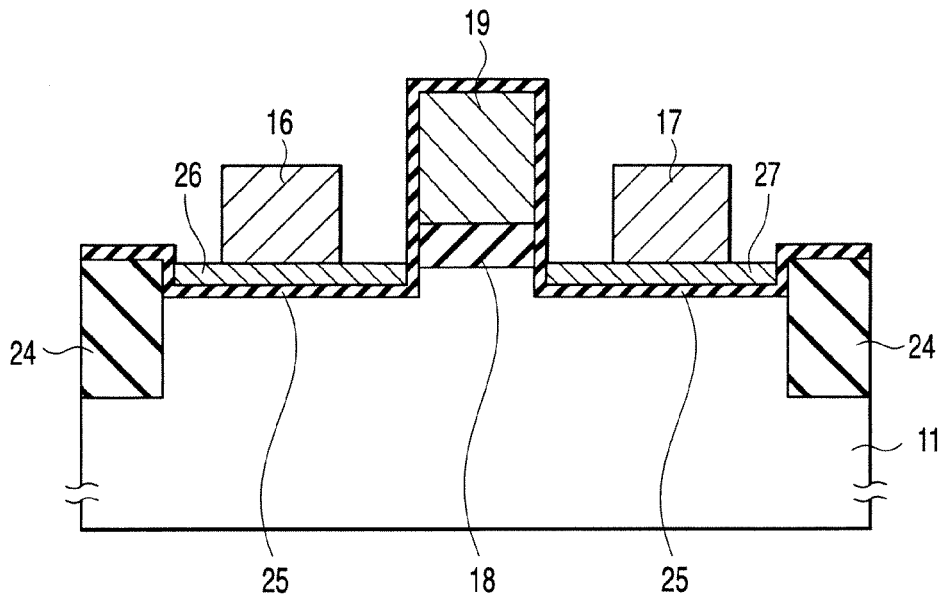
F I G. 46
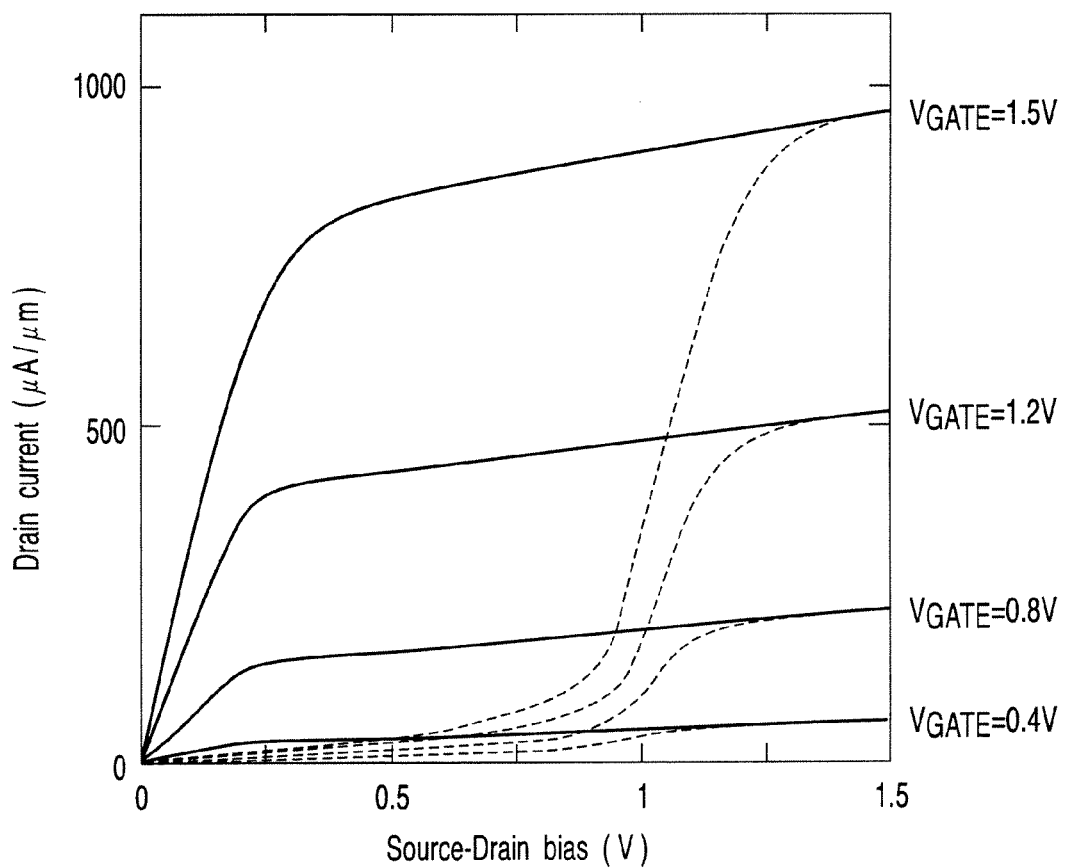
F I G. 47

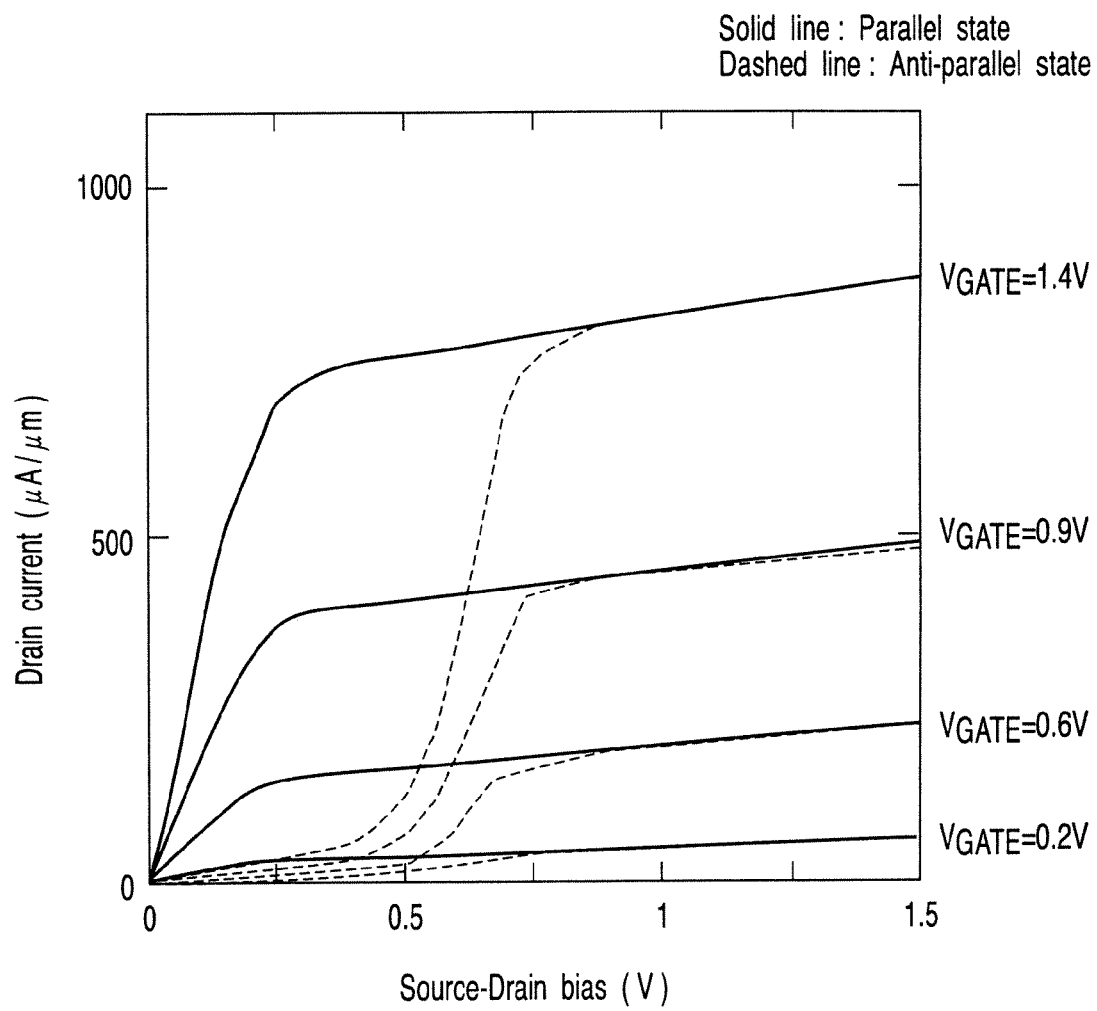
F I G. 4 8

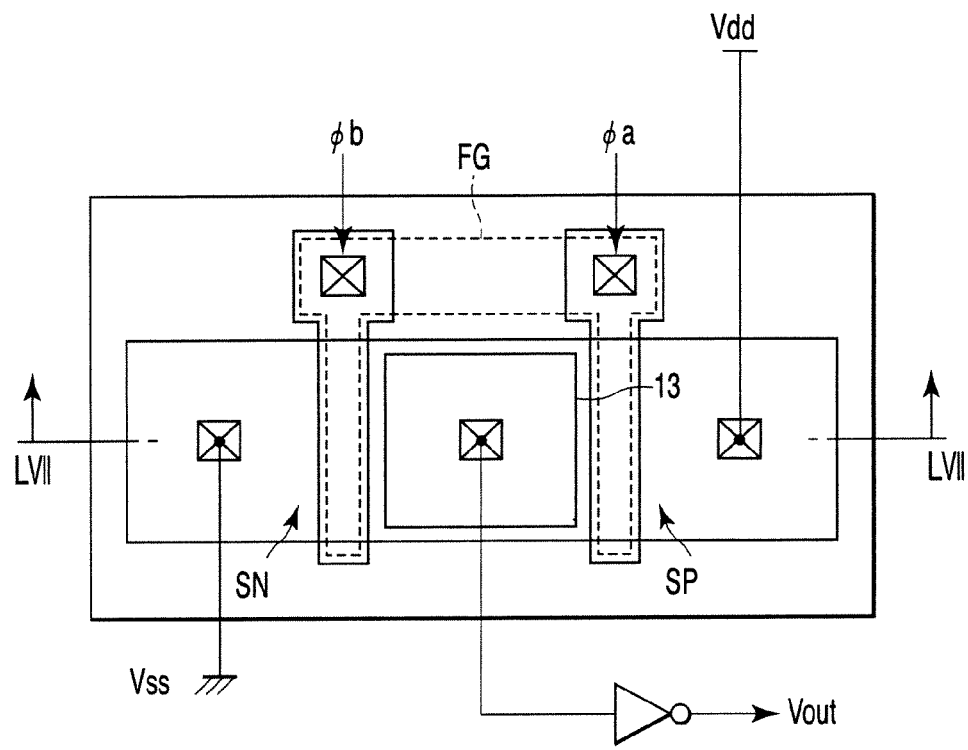
F I G. 5 6
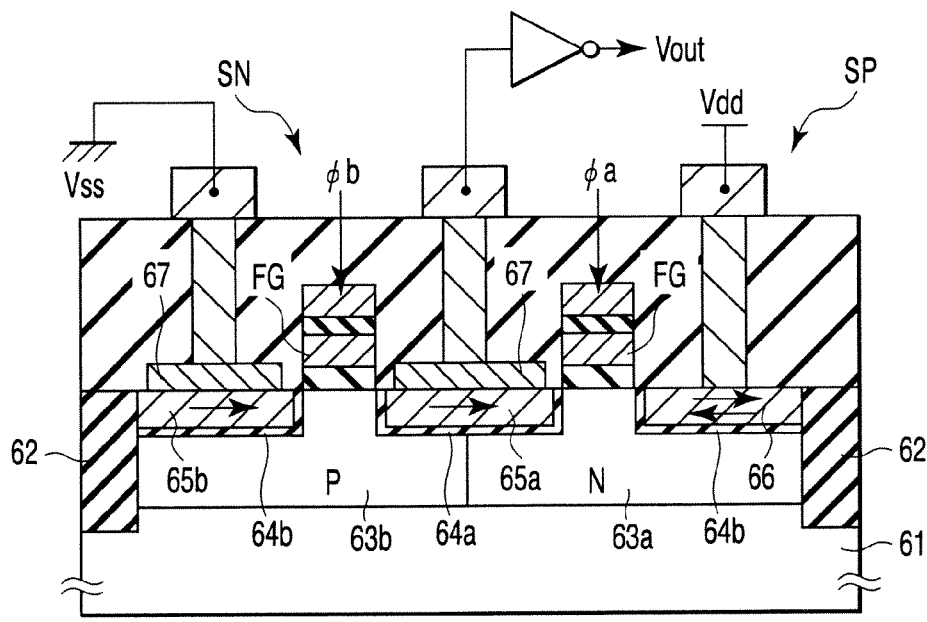
F I G. 5 7

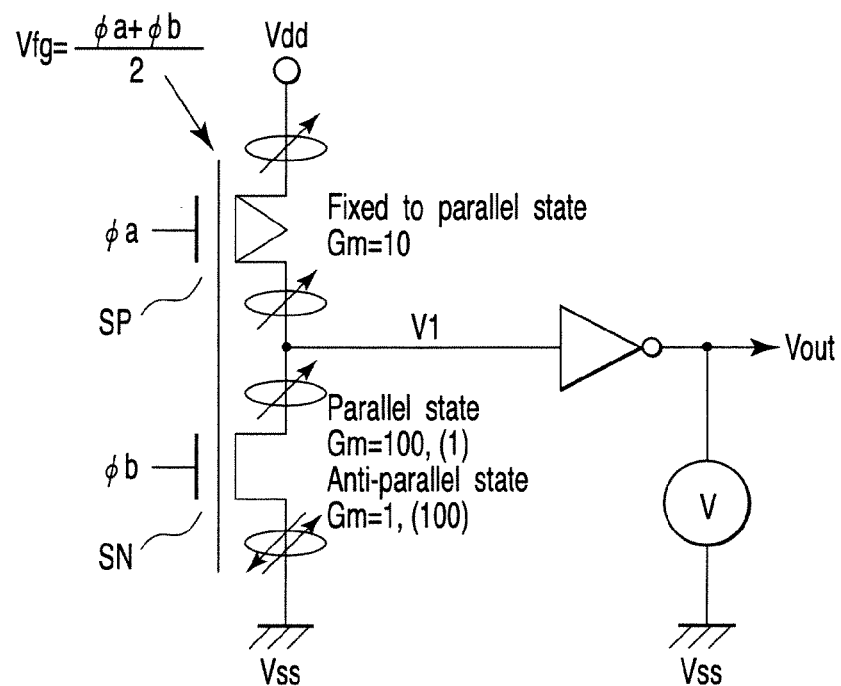
F I G. 5 8
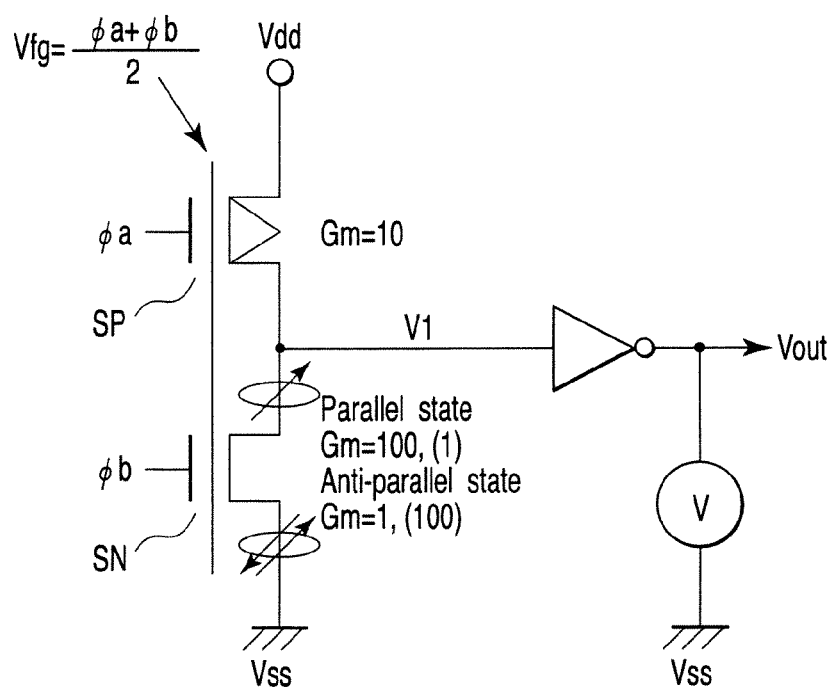
F I G. 5 9

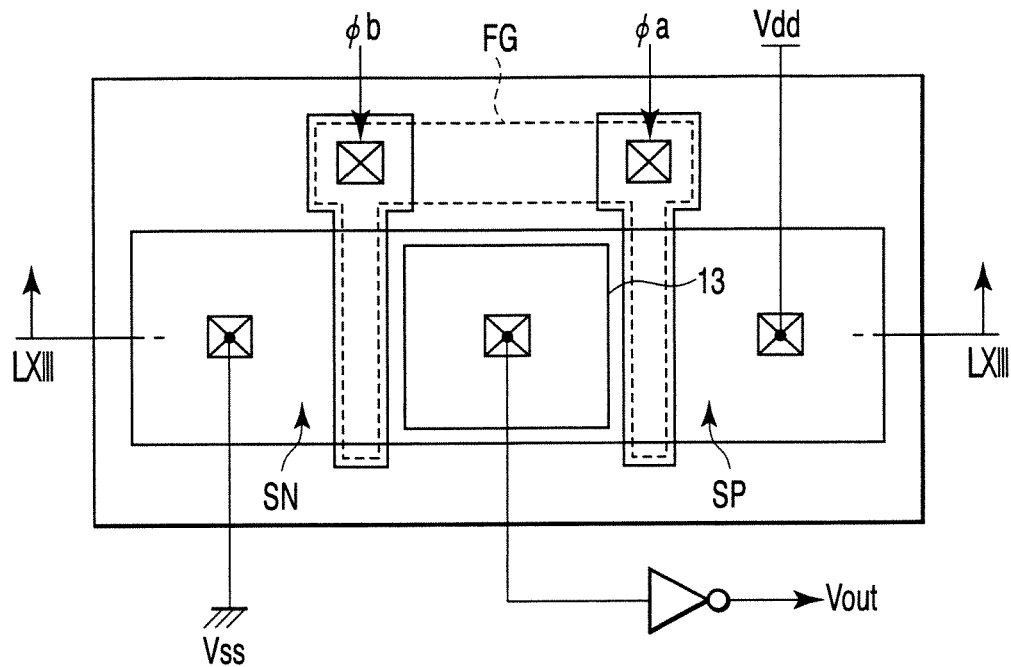
F I G. 62
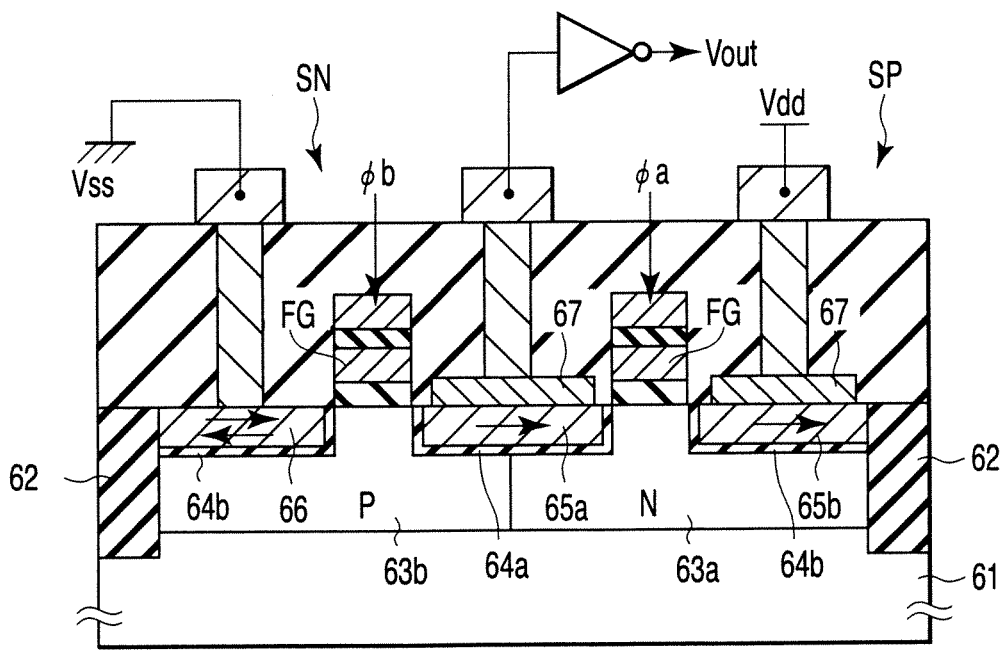
F I G. 63

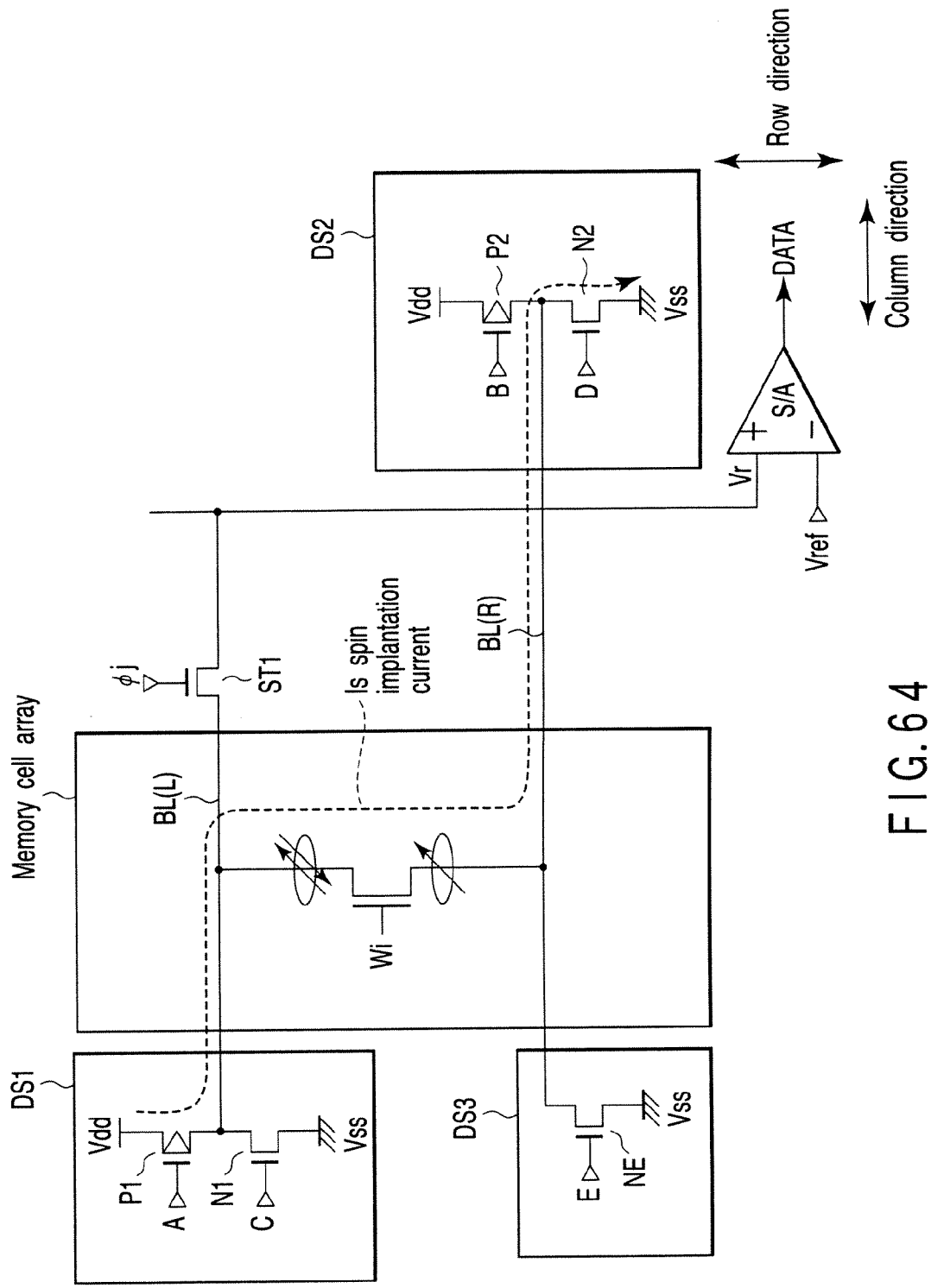
F I G. 64

SPIN FET AND SPIN MEMORY

CROSS-REFERENCE TO RELATED APPLICATIONS

This application is based upon and claims the benefit of priority from prior Japanese Patent Application No. 2006-009266, filed Jan. 17, 2006, the entire contents of which are incorporated herein by reference.

BACKGROUND OF THE INVENTION

1. Field of the Invention

The present invention relates to a spin field effect transistor (spin FET) and a spin memory based on a new principle.

2. Description of the Related Art

In recent years, research and development have been actively made for achieving practical use of a spin electronics device utilizing a free degree of a spin of an electron. For example, a device utilizing a tunnel magneto-resistance (TMR) effect of a magnetic random access memory (MRAM) or a reproduction magnetic head of a hard disk is provided as a typical example thereof.

Recently, a spin FET has been proposed as a next generation spin device.

The spin FET has a feature that it has a magnetic recording unit that stores binary data, and is used for constituent elements such as memory cells or a re-configurable logic circuit. In the case where the logic circuit is composed of the spin FET, there is a possibility that all logics such as AND, NOR, OR, and EX-OR can be selectively achieved merely by rewriting data of a magnetic recording head of one logic circuit.

When this is achieved, there is no need for changing a layout of a transistor according to a type of a logic circuit, thus making it possible to promote significant reduction of a design/development period and significant reduction of a manufacturing cost.

Therefore, it has been studied that such a logic circuit is used in combination with a nonvolatile semiconductor memory such as a magnetic random access memory or a ferroelectric random access memory (FeRAM).

However, in a current spin FET, data is written into a magnetic recording unit by a current magnetic field (a magnetic field generated by a write current) or a spin injection current (a spin polarization electron).

Thus, in the case of using the former current magnetic field, if an element size is reduced, there occurs a problem that a value of a write current increases and power consumption increases. In the case of using the latter spin injection current, there is a need for a large current density for writing data. Thus, there occurs a reliability problem that a tunnel barrier is destructed.

Such problems occur similarly in a spin memory that carries out write/read processing by utilizing a degree of freedom of a spin of an electron as well.

BRIEF SUMMARY OF THE INVENTION

A spin FET according to an aspect of the present invention comprise a magnetic pinned layer whose magnetization direction is fixed, a magnetic free layer whose magnetization direction changes, a channel between the magnetic pinned layer and the magnetic free layer, a gate electrode provided on the channel via a gate insulation layer, and a multiferroric layer which is provided on the magnetic free layer, and whose magnetization direction is changed by an electric field.

A spin FET according to an aspect of the present invention comprises a magnetic pinned layer whose magnetization direction is fixed, a magnetic free layer whose magnetization direction changes, a channel between the magnetic pinned layer and the magnetic free layer, and a gate electrode provided on the channel via a gate insulation layer, wherein the magnetic free layer is composed of a multiferroric layer whose magnetization direction is changed by an electric field.

A spin memory according to an aspect of the present invention comprises a memory cell comprising a magnetic pinned layer whose magnetization direction is fixed, a magnetic free layer whose magnetization direction changes, a tunnel barrier layer between the magnetic pinned layer and the magnetic free layer, and a multiferroric layer which is provided adjacent to the magnetic free layer, and whose magnetization direction is changed by an electric field.

A spin memory according to an aspect of the present invention comprises a memory cell comprising a magnetic pinned layer whose magnetization direction is fixed, a magnetic free layer whose magnetization direction changes, and a tunnel barrier layer between the magnetic pinned layer and the magnetic free layer, wherein the magnetic free layer is composed of a multiferroric layer whose magnetization direction is changed by an electric field.

BRIEF DESCRIPTION OF THE SEVERAL VIEWS OF THE DRAWING

FIG. 1 is a sectional view showing a first basic structure of a spin FET;

FIG. 2 is a sectional view showing a second basic structure of a spin FET;

FIG. 17 is a sectional view showing a second basic structure of a spin memory;

FIG. 39 is a sectional view showing a material example of a spin FET;

FIG. 40 is a sectional view showing a material example of memory cells of a spin memory;

FIG. 41 is a sectional view showing one step of a method for manufacturing a spin FET;

FIG. 42 is a sectional view showing one step of a method for manufacturing a spin FET;

FIG. 43 is a sectional view showing one step of a method for manufacturing a spin FET;

FIG. 44 is a sectional view showing one step of a method for manufacturing a spin FET;

FIG. 45 is a sectional view showing one step of a method for manufacturing a spin FET;

FIG. 46 is a sectional view showing one step of a method for manufacturing a spin FET;

FIG. 47 is a view showing a characteristic of a sample;

FIG. 48 is a view showing a characteristic of a sample;

FIG. 56 is a plan view showing an example of a device structure;

FIG. 57 is a sectional view taken along the line LVII-LVII shown in FIG. 56;

FIG. 58 is a circuit diagram showing a second example of a re-configurable logic circuit;

FIG. 59 is a circuit diagram showing a second example of a re-configurable logic circuit;

FIG. 62 is a plan view showing an example of a device structure;

FIG. 63 is a sectional view taken along the line LXIII-LXIII shown in FIG. 62;

FIG. 64 is a circuit diagram showing an example of a semiconductor memory using a spin FET as a memory cell;

DETAILED DESCRIPTION OF THE INVENTION

Figure 3:
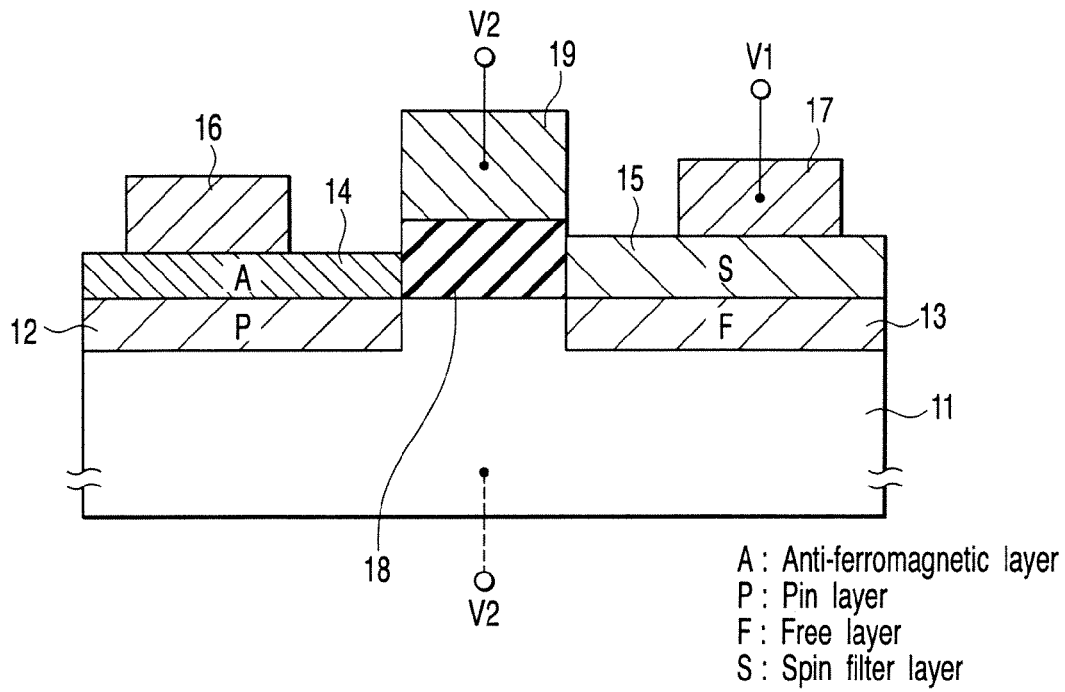
FIG. 3 is a sectional view showing a third basic structure of a spin FET.

A spin FET and a spin memory of aspects of the present invention will be described below in detail with reference to the accompanying drawings.

1. Outline

In an example of the present invention, there is proposed a new principle of controlling a value of write data, i.e., a spin orientation by at least an electric field with respect to data writing into a magnetic recording unit of a spin FET or memory cells of a spin memory.

Therefore, a multiferroric material whose magnetization direction is changed by an electric field, is used for a magnetic recording unit of a spin FET or memory cells of a spin memory.

The multiferroric material has characteristics in which the dielectric change is caused by the magnetic field and the magnetic change is caused by the electric field.

The multiferroric material is comprised by one of a ferromagnetic ferroelectric material, a ferrimagnetic ferroelectric or an anti-ferromagnetic ferroelectric material being not zero in net magnetic moment on an interface between the adjacent ferromagnetic layers, a composite material having a ferromagnetic nano-structure and a ferroelectric nano-structure.

Here, although $RMnO_3$ and $R_2MnO_5$ (where R denotes a rare earth) is known to express magnetic property by a voltage, this feature appears at a low temperature such as several tens K and does not control a magnetization direction, thus making it difficult to apply this as a device.

With respect to $Cr_2O_3$/Pt (0.7 nm)/[Co (0.3 nm) Pt (1.2 nm)]$_3$/Pt (3.1 nm) (numeric value enclosed in parenthesis designates film thickness), it is verified that, if a voltage is applied thereto at 150K, magnetization of CoPt is inverted by a zero magnetic field. (Refer to non-patent document 1).

In addition, with respect to $BaTiO_3$—$CoFe_2O_4$ nano-structure, an electromagnetic effect at a normal temperature is found out. (Refer to non-patent document 2).

Further, with respect to $Cr_2O_3$, $Bi_2FeCrO_6$, $BiFeO_3$, $Bi_{1-x}Ba_xFe_3O_4$, $PbTiO_3$—$CoFe_2O_4$ nano-structure, a magnetization direction is changed depending on an electric field.

Therefore, in an example of the present invention, a spin FET or a spin memory is configured utilizing these materials.

According to such spin FET and spin memory, a value of write data is controlled by an electric field at the time of writing data, thus making it possible to achieve low power consumption and high reliability at the same time.

2. Embodiments

Now, some embodiments that seem to be the best will be described here.

(1) Spin FET

First, a description will be given with respect to a case in which an example of the present invention has been applied to a spin FET.

A. First Basic Structure

FIG. 1 shows a first basic structure of a spin FET.

The first basic structure relates to a Schottky barrier type spin FET that executes data writing in accordance with a spin injection writing system.

Source/drain regions 12 and 13 composed of a ferromagnetic layer are formed in a semiconductor substrate 11. The source/drain region 12 is a magnetic pinned layer (a hard layer), and a magnetization direction thereof is fixedly deposited by means of an anti-ferromagnetic layer 14. The source/drain region 13 is a magnetic free layer (a soft layer) whose magnetic direction changes.

A multiferroric layer 15 whose magnetic direction is changed depending on an electric field is formed on the source/drain region 13 serving as a magnetic free layer. The multiferroric layer 15 functions as a control layer which controls a magnetization direction of the magnetic free layer. This multiferroric layer 15 is composed of a composite material or the like that is a ferromagnetic ferroelectric material, a ferrimagnetic ferroelectric or an anti-ferromagnetic ferroelectric material that is not zero in net magnetic moment on an interface between the adjacent ferromagnetic layers, a composite material having a ferromagnetic nano-structure and a ferroelectric nano-structure.

That is, the magnetization direction of the multiferroric layer 15 changes depending on an orientation of a voltage applied to the multiferroric layer 15. Then, magnetization reversal using a spin injection writing system is assisted by means of magnetic coupling due to magnetization of this multiferroric layer 15.

In addition, the multiferroric layer 15 may have a function as a spin filter layer of sampling electrons (spin polarization electrons) whose spin directions are uniform at the time of write processing, thereby inverting magnetization of the magnetic free layer.

Electrodes 16 and 17 are formed on the anti-ferromagnetic layer 14 and the multiferroric layer 15, respectively.

The electrode 16 is connected to a driver/sinker for generating a spin injection current, i.e., to a P-channel MOS transistor P1 and an N-channel MOS transistor N1. Similarly, the electrode 17 is connected to a driver/sinker for generating a spin injection current, i.e., to a P-channel MOS transistor P2 and an N-channel MOS transistor N2.

A gate electrode 19 is formed via a gate insulation layer 18 on a channel between the source/drain regions 12 and 13.

In a spin FET having such a structure, data is written by applying a write gate voltage W to the gate electrode 19; reducing thickness of a Schottky barrier generated between the semiconductor substrate 11 and each of the source/drain regions 12 and 13; and then, supplying a spin injection current to the source/drain region 13 serving as a magnetic free layer.

A value of write data is determined by an orientation of a spin injection current. The orientation of the spin injection current is controlled by turning ON/OFF the P-channel MOS transistors P1 and P2 and the N-channel MOS transistors N1 and N2 using control signals A, B, C, and D.

Here, at the time of spin injection write processing, a predetermined voltage is applied to the multiferroric layer 15, and an electric field is generated inside thereof. Due to this electric field, distortion occurs in the multiferroric layer 15, and first, magnetization of the multiferroric layer 15 is inverted. Then, magnetization of the multiferroric layer 15 assists magnetization reversal of the source/drain region 13 serving as a magnetic free layer.

For example, when magnetic moments of the source/drain regions 12 and 13 are made anti-parallel to each other (reversed in magnetization direction), a spin injection current is supplied from the P-channel MOS transistor P1 to the N-channel MOS transistor N2.

At this time, an electric field which becomes positive in the source/drain region 13 and which becomes negative on the side of the electrode 17 is generated in the multiferroric layer 15. First, magnetization of the multiferroric layer 15 is made anti-parallel to magnetization of the source/drain region 12 serving as a magnetic pinned layer.

Therefore, magnetization of the source/drain region 13 serving as a magnetic free layer is easily oriented in a direction identical to magnetization of the multiferroric layer 15 by means of magnetic coupling with the multiferroric layer 15.

In this state, spin polarization electrons are implanted into the source/drain region 13 from the multiferroric layer 15 serving as a spin filter layer. In addition, spin polarization electrons reflected in the source/drain region 12 serving as a magnetic fixed depositing layer are implanted into the source/drain region 13. As a result, magnetization of the source/drain region 13 is made anti-parallel to magnetization of the source/drain region 12.

In addition, when the magnetic moments of the source/drain regions 12 and 13 are parallel to each other (identical in magnetic direction), a spin injection current is supplied from the P-channel MOS transistor P2 to the N-channel MOS transistor N1.

At this time, in the multiferroric layer 15, an electric filed that becomes negative on the side of the source/drain region 13 and that becomes positive on the side of the electrode 17 is generated, and then, magnetization of the multiferroric layer 15 is made parallel to magnetization of the source/drain region 12 serving as a magnetic pinned layer.

Therefore, magnetization of the source/drain region 13 serving as a magnetic free layer is easily oriented in a direction identical to magnetization of the multiferroric layer 15 by means of magnetic coupling with the multiferroric layer 15.

In this state, spin polarization electrodes are implanted from the source/drain region 12 serving as a magnetic pinned layer to the source/drain region 13 serving as a magnetic free layer. As a result, magnetization of the source/drain region 13 is made parallel to magnetization of the source/drain region 12.

Thus, according to a first basic structure, the multiferroric layer 15 assists spin injection magnetization reversal. Therefore, the current density of a spin injection current can be reduced more significantly than that in a case in which magnetization reversal is carried out in accordance with only a spin injection writing system, making it possible to promote low power consumption and improvement of reliability.

Figure 11:
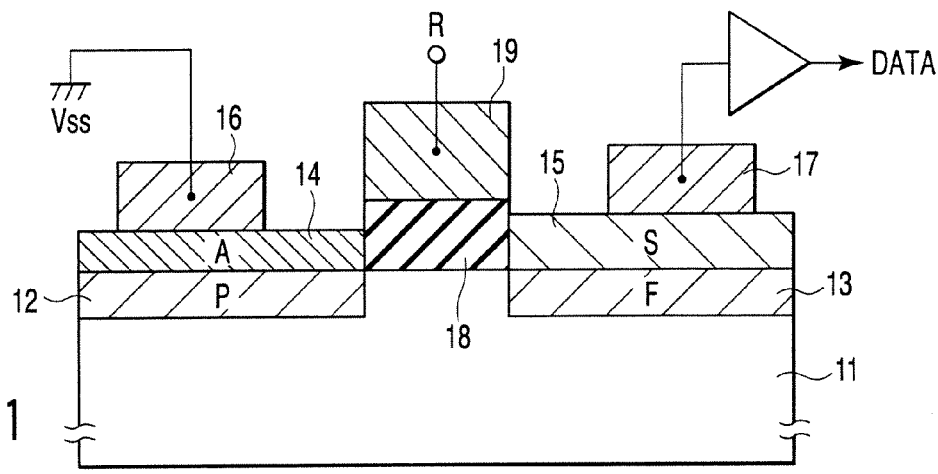
FIG. 11 is a sectional view showing an appearance at the time of read of a spin FET.

Data is read out by applying a read gate voltage R to the gate electrode 19, and then, supplying a read current to the source/drain region 13 serving as a magnetic free layer, for example, as shown in FIG. 11.

The read current is set at a value smaller than a spin injection current in order to prevent erroneous write processing at the time of read processing.

In the case where the magnetic moments of the source/drain regions 12 and 13 are parallel to each other, it becomes identical to a case in which the source/drain regions 12 and 13 are composed of a general metal. Thus, a large read current flows in a spin FET.

In addition, in the case where the magnetic moments of the source/drain regions 12 and 13 are anti-parallel to each other, an UP spin and a DOWN spin tunnel an UP spin band and a DOWN spin band, respectively, via a Schottky barrier. As a result, the read current that flows in a spin FET becomes extremely small.

Therefore, according to the first basic structure, depending on data written in a magnetic recording unit, a spin FET can be selectively used as a normal transistor whose switching is controlled by a gate voltage or as a transistor always established in an OFF state regardless of the gate voltage. In addition, a re-configurable logic circuit can be achieved by rewriting data contained in the magnetic recording unit.

It is preferable that the source/drain regions 12 and 13 be composed of a highly resistive ferromagnetic material such as a magnetic semiconductor or a magnetic compound in order to achieve a large MR (magneto-resistive) ratio.

In addition, in the case of a Schottky barrier type spin FET, it is preferable to use an intrinsic semiconductor for a semiconductor substrate 11. However, slight impurities may coexist in the semiconductor substrate 11.

As has been described above, according to the first basic structure, a spin FET of a new writing principle utilizing a multiferroric layer whose magnetization direction is changed by an electric field can be achieved. In this manner, a re-configurable logic circuit with low power consumption and high reliability can be achieved.

B. Second Basic Structure

FIG. 2 shows a second basic structure of a spin FET.

The second basic structure relates to a tunnel barrier type spin FET that executes data writing in accordance with a spin injection writing system.

In comparison, the second basic structure is identical to a basic structure except that tunnel barrier layers (insulation layers) 20 and 21 are provided between the semiconductor substrate 11 and each of the source/drain regions 12 and 13 in the second basic structure.

As in the first basic structure, data is written by applying a write gate voltage W to a gate electrode 19, and controlling a band end of Si-valence electron band, thereby implanting spin polarization electrons generated thereby into the source/drain region 13 serving as a magnetic free layer. At this time, behavior of the multiferroric layer 15 is identical to the case of the first basic structure.

As in the first basic structure, data is read out by applying a read gate voltage R to the gate electrode 19, and then, supplying a read current to the source/drain region 13 serving as a magnetic free layer.

In the case of a tunnel barrier type spin FET, the source/drain regions 12 and 13 can be selected from a magnetic semiconductor, a magnetic compound, a ferromagnetic metal (including a metal, an alloy, and a compound) or the like.

In addition, the semiconductor substrate 11 does not come into direct contact with the source/drain regions 12 and 13, thus making it possible to select from an intrinsic semiconductor, an n-type or p-type impurities doped semiconductor and the like.

According to the second basic structure, an advantageous effect similar to that of the first basic structure can be attained. In addition, the semiconductor substrate 11 and the source/drain regions 12 and 13 are separated from each other by means of tunnel barrier layers 20 and 21. Thus, an option of selecting a material configuring the semiconductor substrate 11 and the source/drain regions 12 and 13 broadens, and then, a degree of freedom in element design increases.

C. Third Basic Structure

FIG. 3 shows a third basic structure of a spin FET.

The third basic structure relates to a Schottky barrier type spin FET of a new principle that executes data writing by only an electric field.

A device structure is identical to that of the first basic structure. Thus, a description thereof is omitted here.

In the third basic structure, data writing into a magnetic recording unit is executed in only an electric field without utilizing a spin injection writing system.

Specifically, data is written by applying a write voltage V1 to an electrode 17, applying a write voltage V2 to a gate electrode 19, and then, generating an electric field inside a multiferroric layer 15.

For example, when magnetic moments of source/drain regions 12 and 13 are made anti-parallel to each other, a relationship between the voltages V1 and V2 is V2>V1.

At this time, an electric field that is positive at the side of the source/drain region 13 and that is negative at the side of the electrode 17 is generated inside the multiferroric layer 15. Magnetization of the multiferroric layer 15 is made anti-parallel to magnetization of the source/drain region 12 serving as a magnetic pinned layer. Concurrently, magnetization of the source/drain region 13 serving as a magnetic free layer is also made anti-parallel to magnetization of the source/drain region 12 serving as a magnetic pinned layer by means of the magnetic coupling with the multiferroric layer 15.

In addition, when magnetic moments of the source/drain regions 12 and 13 are made parallel to each other, a relationship between the voltages V1 and V2 is V1>V2.

At this time, an electric field that is negative at the side of the source/drain region 13 and that is positive at the side of the electrode 17 is generated inside the multiferroric layer 15, and then, magnetization of the multiferroric layer 15 is also made parallel to magnetization of the source/drain region 12 serving as a magnetic pinned layer. Concurrently, magnetization of the source/drain region 13 serving as a magnetic free layer is also made parallel to magnetization of the source/drain region 12 serving as a magnetic pinned layer serving as a magnetic free layer by means of the magnetic coupling with the multiferroric layer 15.

Thus, according to the third basic structure, only by acting an electric field on the multiferroric layer 15, data can be written into a magnetic recording unit of a spin FET, thus making it possible to achieve low power consumption and high reliability.

As in the first basic structure, data is read out by applying a read gate voltage R to a gate electrode 19, and then, supplying a read current to the source/drain region 13 serving as a magnetic free layer.

In the case where the magnetic moments of the source/drain regions 12 and 13 are parallel to each other, it becomes identical to a case in which the source/drain regions 12 and 13 are composed of a normal metal. Thus, a large read current flows in a spin FET.

In addition, in the case where the magnetic moments of the source/drain regions 12 and 13 are anti-parallel to each other, an UP spin and a DOWN spin tunnel an UP spin band and a DOWN spin band, respectively, via a Schottky barrier. As a result, the read current flowing in a spin FET is extremely small.

Therefore, according to the third basic structure, depending on data written into a magnetic recording unit, a spin FET can be selectively used as a normal transistor whose switching is controlled by a gate voltage or as a transistor that is always in an OFF state regardless of a gate voltage. In addition, a re-configurable logic circuit can be achieved by rewriting data contained in the magnetic recording unit.

A voltage V2 serving as a back gate bias may be applied to the semiconductor substrate instead of applying the voltage V2 to the gate electrode 19. In addition, the voltage V2 may be applied to both of the semiconductor substrate 11 and the gate electrode 19.

In addition, it is preferable that the source/drain regions 12 and 13 be composed of a highly resistive ferromagnetic material such as a magnetic semiconductor or a magnetic compound in order to achieve a large MR ratio.

In addition, in the case of a Schottky barrier type spin FET, it is preferable that the semiconductor substrate 11 should use an intrinsic semiconductor. However, slight impurities may coexist in the semiconductor substrate 11.

As has been described above, according to the third basic structure, a spin FET in a new writing principle utilizing a multiferroric layer whose magnetization direction is changed by an electric field can be achieved. In this manner, a re-configurable logic circuit with low power consumption and high reliability can be achieved.

D. Fourth Basic Structure

Figure 4:
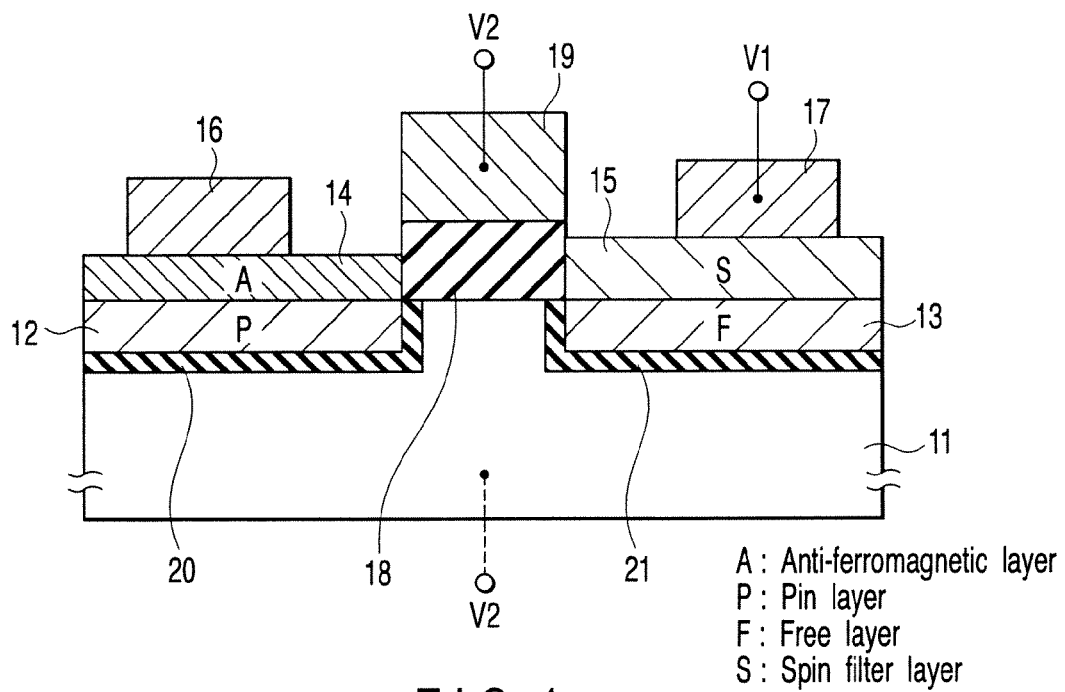
FIG. 4 is a sectional view showing a fourth basic structure of a spin FET.

FIG. 4 shows a fourth basic structure of a spin FET.

The fourth basic structure relates a tunnel barrier type spin FET of a new principle that executes data writing by only an electric field.

In comparison, the fourth basic structure is identical to the third basic structure except that tunnel barrier layers (insulation layers) 20 and 21 are provided, respectively, between the semiconductor substrate 11 and each of the source/drain regions 12 and 13 in the fourth basic structure.

As in the third basic structure, data is written by applying a write voltage V1 to an electrode 17, applying a write voltage V2 to a gate electrode 19, and then, generating an electric field inside a multiferroric layer 15.

As in the first basic structure, data is read out by applying a read gate voltage R to a gate electrode 19, and then, supplying a read current to a source/drain region 13 serving as a magnetic free layer.

The voltage V2 may be applied as a back gate bias to the semiconductor substrate 11 instead of applying the voltage V2 to the gate electrode 19. In addition, the voltage V2 may be applied to both of the semiconductor substrate 11 and the gate electrode 19.

In addition, in the case of a tunnel barrier type spin FET, a material configuring the source/drain regions 12 and 13 can be selected from a magnetic semiconductor, a magnetic compound, a ferromagnetic metal (including a metal, an alloy, and a compound) or the like.

In addition, the semiconductor substrate 11 does not come into direct contact with the source/drain regions 12 and 13, thus making it possible to select a material of the semiconductor substrate 11 from an intrinsic semiconductor, an n-type or p-type impurity doped semiconductor and the like.

According to the fourth basic structure, an advantageous effect similar to that of the third basic structure can be attained. In addition, the semiconductor substrate 11 and the source/drain regions 12 and 13 are separated from each other by means of the tunnel barrier layers 20 and 21. Thus, an option of selecting a material configuring the semiconductor substrate 11 and the source/drain regions 12 and 13 broadens, and then, a degree of freedom of element design increases.

E. Fifth Basic Structure

Figure 5:
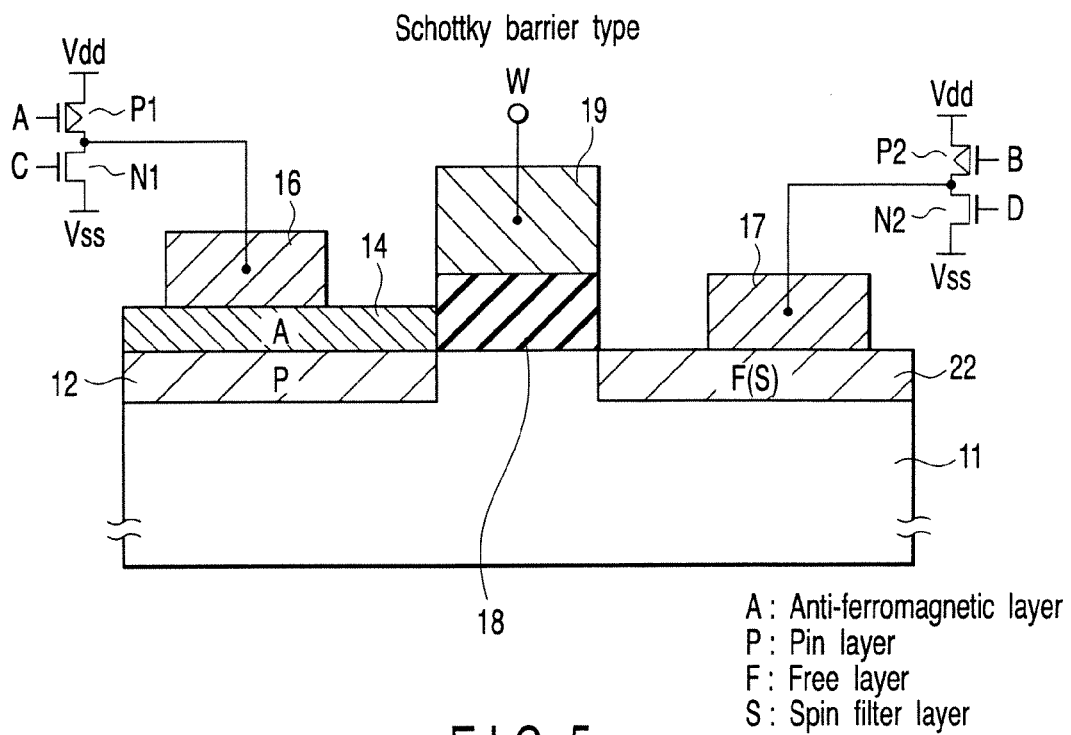
FIG. 5 is a sectional view showing a fifth basic structure of a spin FET.

FIG. 5 shows a fifth basic structure of a spin FET.

The fifth basic structure relates to a Schottky barrier type spin FET that executes data writing in accordance with a spin injection writing system.

Source/drain regions 12 and 23 composed of a ferromagnetic layer are formed in a semiconductor substrate 11. The source/drain region 12 is a magnetic fixedly depositing later (a hard layer), and a magnetization direction thereof is fixedly deposited by means of an anti-ferromagnetic layer 14. The source/drain region 22 is a magnetic free layer (a soft layer) whose magnetic direction changes.

The source/drain region 22 serving as a magnetic free layer is composed of a composite material or the like that is a multiferroric layer whose magnetization direction is changed by an electric field, for example, a ferromagnetic ferroelectric material, a ferrimagnetic ferroelectric or an anti-ferromagnetic ferroelectric material that is not zero in net magnetic moment on an interface between the adjacent ferromagnetic layers, a composite material having a ferromagnetic nano-structure and a ferroelectric nano-structure.

That is, the magnetization direction of the source/drain region 22 changes depending on an orientation of a voltage applied to the source/drain region 22. In addition, the source/drain region 22 may have a function as a pin filter layer that samples electrons (spin polarization electrons) that are uniform in a spin direction at the time of write processing.

Electrodes 16 and 17 are formed on the anti-ferromagnetic layer 14 and the source/drain region 22, respectively.

The electrode 16 is connected to a driver/sinker for generating a spin injection current, i.e., to a P-channel MOS transistor P1 and an N-channel MOS transistor N1. Similarly, the electrode 17 is connected to a driver/sinker for generating a spin injection current, i.e, to a P-channel MOS transistor P2 and an N-channel MOS transistor N2.

On a channel between the source/drain regions 12 and 22, a gate electrode 19 is formed via a gate insulation layer 18.

In a spin FET with such a structure, data is written by applying a write gate voltage W to the gate electrode 19; reducing thickness of a wall of a Schottky barrier generated between the semiconductor substrate 11 and each of the source/drain regions 12 and 22; and then, supplying a spin injection current to the source/drain region 22 serving as a magnetic free layer.

A value of write data is determined depending on an orientation of the spin injection current, and then, an orientation of the spin injection current is controlled by turning ON/OFF the P-channel MOS transistors P1 and P2 and the N-channel MOS transistors N1 and N2 using control signals A, B, C, and D.

Here, at the time of spin injection write processing, a pre-determined voltage is applied to the source/drain region 22, and an electric field is generated inside thereof. Due to this electric field, distortion occurs in the source/drain region 22, thus facilitating spin injection magnetization reversal.

For example, when the magnetic moments of the source/drain regions 12 and 22 are made anti-parallel to each other, a spin injection current is supplied from the P-channel MOS transistor P1 to the N-channel MOS transistor N2.

At this time, spin polarization electrons are generated in accordance with a principle similar to that according to the first embodiment and an electric field that is positive at the side of the semiconductor substrate 11 and that is negative at the side of the electrode 17 is generated in the source/drain region 22. As a result, magnetization of the source/drain region 22 is made anti-parallel to magnetization of the source/drain region 12 serving as a magnetic fixed depositing layer.

In addition, when the magnetic moments of the source/drain regions 12 and 22 are made parallel to each other, a spin injection current is supplied from the P-channel MOS transistor P2 to the N-channel MOS transistor N1.

At this time, spin polarization electrons are generated in accordance with a principle similar to that according to the first embodiment and an electric field that is negative at the side of the semiconductor substrate 11 and that is positive at the side of the electrode 17 is generated in the source/drain region 22. As a result, magnetization of the source/drain region 22 is made parallel to magnetization of the source/drain region 12 serving as a magnetic pinned layer.

Thus, according to the fifth basic structure, the current density of a spin injection current can be reduced more significantly than that in a case in which magnetization reversal is carried out in accordance with only a spin injection writing system, making it possible to promote low power consumption and improvement of reliability.

Data can be read out in the same manner as that in the first basic structure.

It is preferable to ensure that the source/drain regions 12 and 22 are composed of a ferromagnetic material with a high resistance such as a magnetic semiconductor or a magnetic compound in order to achieve a large MR ratio.

In addition, in the case of a Schottky barrier type spin FET, it is preferable to use an intrinsic semiconductor for the semiconductor substrate 11. However, slight impurities may coexist in the semiconductor substrate 11.

As has been described above, according to the fifth basic structure, a spin FET in a new writing principle utilizing a multiferroric layer changed in a magnetic direction by an electric field can be achieved. In this manner, a re-configurable logic circuit with low power consumption and high reliability can be achieved.

F. Sixth Basic Structure

Figure 6:
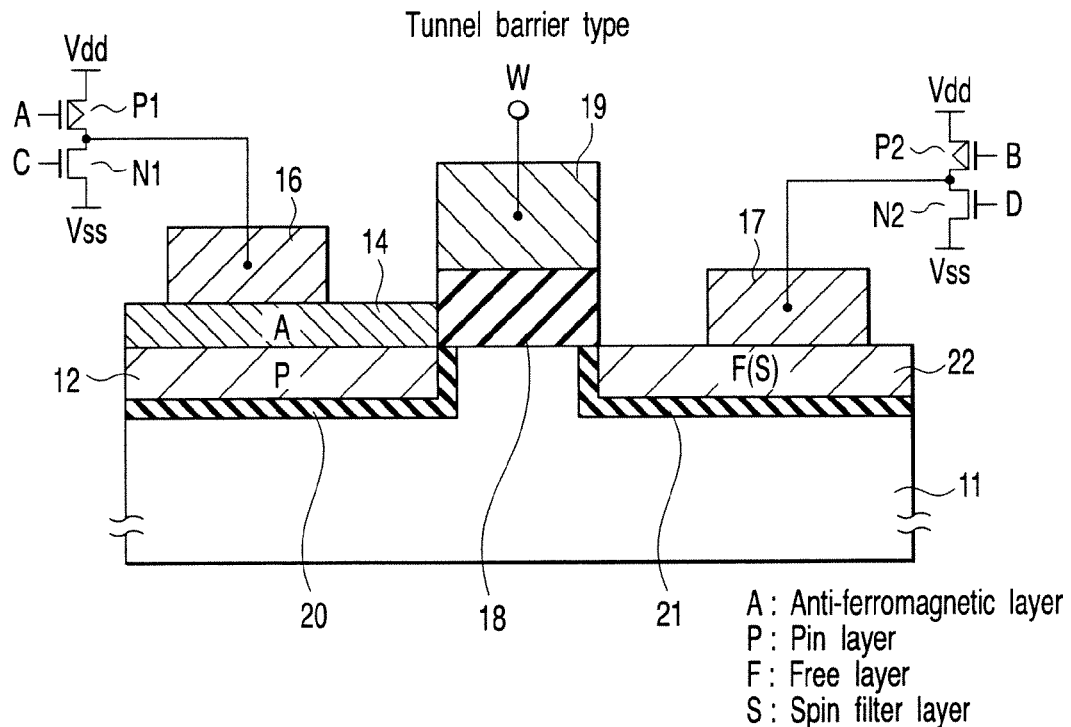
FIG. 6 is a sectional view showing a sixth basic structure of a spin FET.

FIG. 6 shows a sixth basic structure of a spin FET.

The six basic structure relates to a tunnel barrier type spin FET that executes data writing in accordance with spin injection writing system.

In comparison, the sixth basic structure is identical to the fifth basic structure except that tunnel barrier layers (insulation layer) 20 and 21 each are provided between a semiconductor substrate 11 and each of source/drain regions 12 and 22 in the sixth basic structure.

As in the fifth basic structure, data is written by applying a write gate voltage W to a gate electrode 19, controlling a band end of an Si-valence electron band, and then, implanting the spin polarization electrons generated thereby into the source/drain region 22 serving as a magnetic free layer. The behavior of the source/drain region 22 at this time is identical to the case of the fifth basic structure.

In the case of the tunnel barrier type spin FET, the source/drain region 12 can be selected from a magnetic semiconductor, a magnetic compound, a ferromagnetic metal (including a metal, an alloy, and a compound) or the like.

In addition, the semiconductor substrate 11 does not come into direct contact with the source/drain regions 12 and 13. Thus, this substrate can be selected from an intrinsic semiconductor, an n-type or p-type impurity doped semiconductor or the like.

According to the sixth basic structure, an advantageous effect similar to that according to the fifth basic structure can be attained. In addition, the semiconductor substrate 11 and the source/drain regions 12 and 13 are separated from each other by means of the tunnel barrier layers 20 and 21. Thus, an option of selecting a material configuring the semiconductor substrate 11 and the source/drain regions 12 and 13 broadens, and the degree of freedom for element design increases.

G. Seventh Basic Structure

Figure 7:
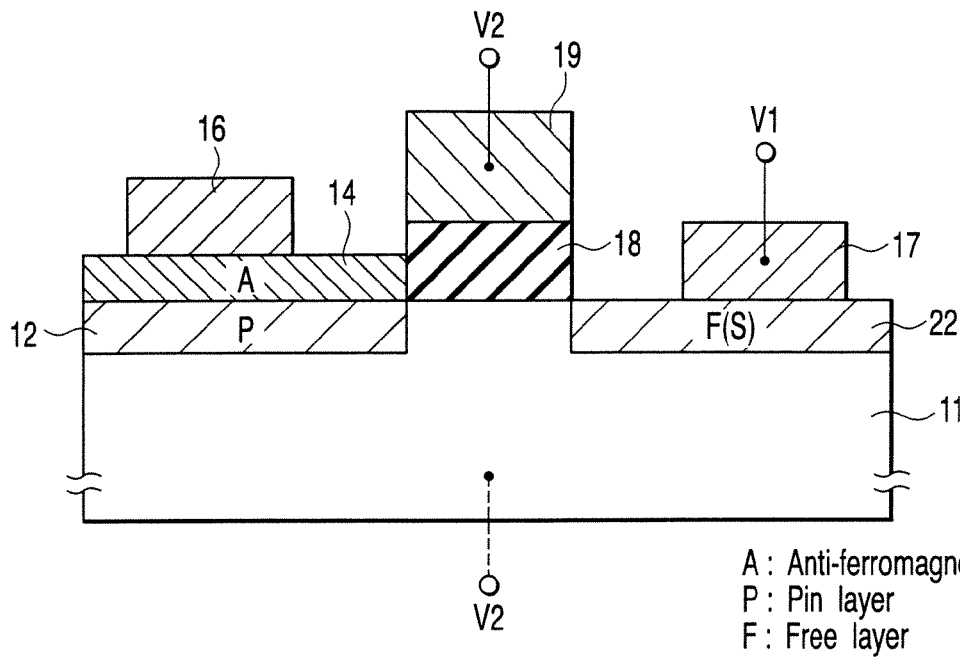
FIG. 7 is a sectional view showing a seventh basic structure of a spin FET

FIG. 7 shows a seventh basic structure of a spin FET.

The seventh basic structure relates to a Schottky barrier type spin FET in a new principle that executes data writing by only an electric field.

A device structure is identical to that according to the fifth basic structure. Here, a duplicate description thereof is omitted.

In the seventh basic structure, data writing into a magnetic recording unit is executed by only an electric field instead of utilizing a spin injection writing system.

Specifically, data is written by applying a write voltage V1 to an electrode 17, applying a write voltage V2 to a gate electrode 19, and generating an electric field inside a multiferroric layer 15.

For example, when the magnetic moments of the source/drain regions 12 and 22 are made anti-parallel to each other, a relationship between the voltages V1 and V2 is V2>V1.

At this time, an electric field that is positive at the side of the semiconductor substrate 11 and that is negative at the side of the electrode 17 is generated inside the source/drain region 22. As a result, magnetization of the source/drain region 22 is made anti-parallel to that of the source/drain region 12 serving as a magnetic pinned layer.

In addition, when the magnetic moments of the source/drain regions 12 and 22 are made parallel to each other, a relationship between the voltages V1 and V2 is V1>V2.

At this time, an electric field that is negative at the side of the semiconductor substrate 11 and that is positive at the side of the electrode 17 is generated inside the source/drain region 22. As a result, magnetization of the source/drain region 22 is made parallel to that of the source/drain region 12 serving as a magnetic pinned layer.

In this manner, according to the seventh basic structure, data can be written into a magnetic recording unit of a spin FET only by acting an electric field on the source/drain region 22, thus making it possible to achieve low power consumption and high reliability.

Data can be read out in the same manner as that in the first basic structure.

The voltage V2 serving as a back gate bias may be applied to the semiconductor substrate 11 instead of applying the voltage V2 to the gate electrode 19. In addition, the voltage V2 may be applied to both of the semiconductor substrate 11 and the gate electrode 19.

It is preferable that the source/drain region 12 be composed of a ferromagnetic material with a high resistance such as a magnetic semiconductor or a magnetic compound.

In addition, in the case of a Schottky barrier type spin FET, it is preferable to use an intrinsic semiconductor as the semiconductor substrate 11. However, slight impurities may coexist in the semiconductor substrate 11.

As has been described above, according to the seventh basic structure, a spin FET can be achieved in accordance with a new writing principle utilizing a multiferroric layer whose a magnetization direction is changed by an electric field. In this manner, a re-configurable logic circuit with low power consumption and high reliability can be achieved.

H. Eighth Basic Structure

Figure 8:
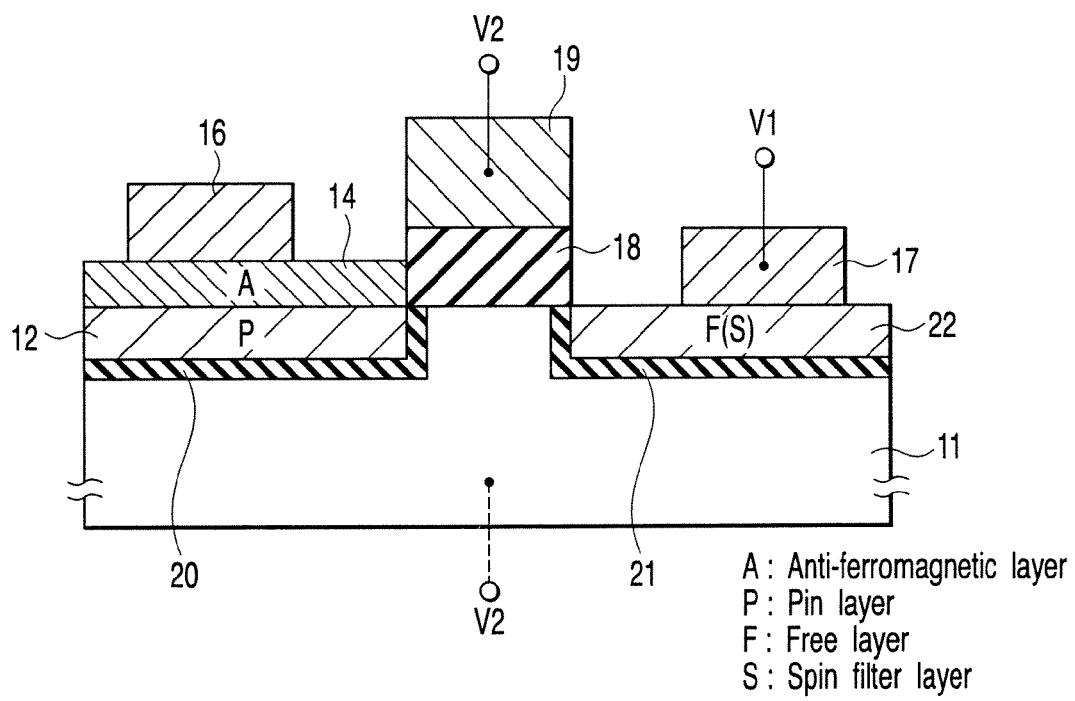
FIG. 8 is a sectional view showing an eighth basic structure of a spin FET.

FIG. 8 shows an eighth basic structure of a spin FET.

The eighth basic structure relates to a tunnel barrier type spin FET in a new principle that executes data writing by only an electric field.

In comparison, the eighth basic structure is identical to the seventh basic structure except that tunnel barriers layers (insulation layers) 20 and 21 each are provided between a semiconductor substrate 11 and each of source/drain regions 12 and 13 in the eighth basic structure.

As in the seventh basic structure, data is written by applying a write voltage V1 to an electrode 17, applying a write voltage V2 to a gate electrode 19, and then, generating an electric field inside the source/drain region (spin filter layer) 22.

As in the seventh basic structure, the voltage V2 serving as a back gate bias may be applied to the semiconductor substrate 11 instead of applying the voltage V2 to the gate electrode 19. In addition, the voltage V2 may be applied to both of the semiconductor substrate 11 and the gate electrode 19.

In addition, in the case of a tunnel barrier type spin FET, a material configuring the source/drain region 12 can be selected from a magnetic semiconductor, a magnetic compound, a ferromagnetic metal (including a metal, an alloy, and a compound) or the like.

In addition, the semiconductor substrate 11 does not come into direct contact with the source/drain regions 12 and 13. Thus, the substrate 11 can be selected from an intrinsic semiconductor, an n-type or p-type impurity doped semiconductor and the like.

According to the eighth basic structure, an advantageous effect similar to that according to the seventh basic structure can be attained. In addition, the semiconductor substrate 11 and the source/drain regions 12 and 13 are separated from each other by means of the tunnel barrier layers 20 and 21. Thus, an option of selecting a material configuring the semiconductor substrate 11 and the source/drain regions 12 and 13 broadens, and the degree of freedom for element design increases.

I. Ninth Basic Structure

Figure 9:
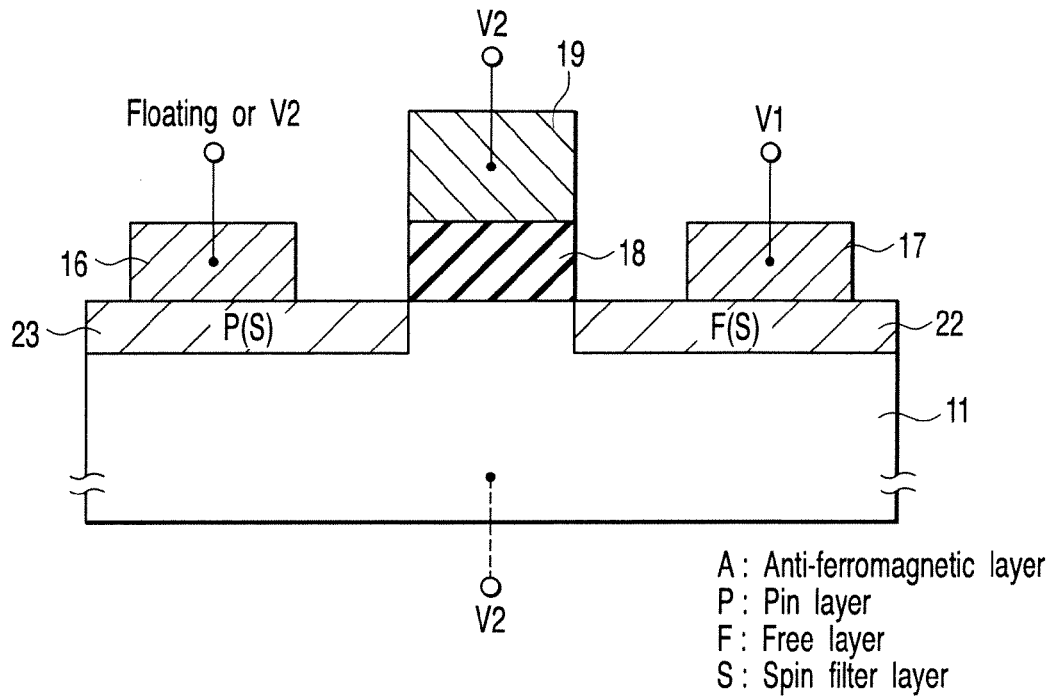
FIG. 9 is a sectional view showing a ninth basic structure of a spin FET.

FIG. 9 shows a ninth basic structure of a spin FET.

The ninth basic structure relates to a Schottky barrier type spin FET that executes data writing by only an electric field in accordance with a new principle.

In comparison, the ninth basic structure is identical to the seventh basic structure except that a source/drain region 23 serving as a magnetic pinned layer is composed of the same material as that for a source/drain region 22 serving as a magnetic free layer in the ninth basic structure.

In the ninth basic structure, data writing into a magnetic recording unit is executed by only an electric field instead of utilizing a spin injection writing system.

Specifically, data is written by applying a write voltage V1 to an electrode 17, applying a write voltage V2 to a gate electrode 19, and then, generating an electric field inside the source/drain region 22.

For example, when the magnetic moments of the source/drain regions 22 and 23 are made anti-parallel to each other, a relationship between the voltages V1 and V2 is V2>V1.

At this time, an electric field that is positive at the side of the semiconductor substrate 11 and that is negative at the side of the electrode 17 is generated inside the source/drain region 22. As a result, magnetization of the source/drain region 22 is made anti-parallel to that of the source/drain region 23.

In addition, when the magnetic moments of the source/drain regions 22 and 23 are made parallel to each other, a relationship between the voltages V1 and V2 is V1>V2.

At this time, an electric field that is negative at the side of the semiconductor substrate 11 and that is positive at the side of the electrode 17 is generated inside the source/drain region 22. As a result, magnetization of the source/drain region 22 is made parallel to that of the source/drain region 23.

Here, at the time of data writing, it is preferable to set an electrode 16 in a floating state or to apply a voltage V2 thereto so that an electric field is not generated inside the source/drain region 23.

Therefore, according to the ninth basic structure, data can be written into a magnetic recording unit of a spin FET only by acting an electric field on the source/drain region 22, thus making it possible achieve low power consumption and high reliability.

Data can be read out in the same manner as that in the first basic structure.

The voltage V2 serving as a back gate bias may be applied to the semiconductor substrate 11 instead of applying the voltage V2 to the gate electrode 19. In addition, the voltage V2 may be applied to both of the semiconductor substrate 11 and the gate electrode 19.

In addition, in the case of a Schottky barrier type spin FET, it is preferable to use an intrinsic semiconductor as the semiconductor substrate 11. However, slight impurities may coexist in the semiconductor substrate 11.

As has been described above, according to the ninth basic structure, a spin FET can be achieved in accordance with a new writing principle utilizing a multiferroric layer whose magnetization direction is changed by an electric field. In this manner, a re-configurable logic circuit with low power consumption and high reliability can be achieved.

J. Tenth Basic Structure

Figure 10:
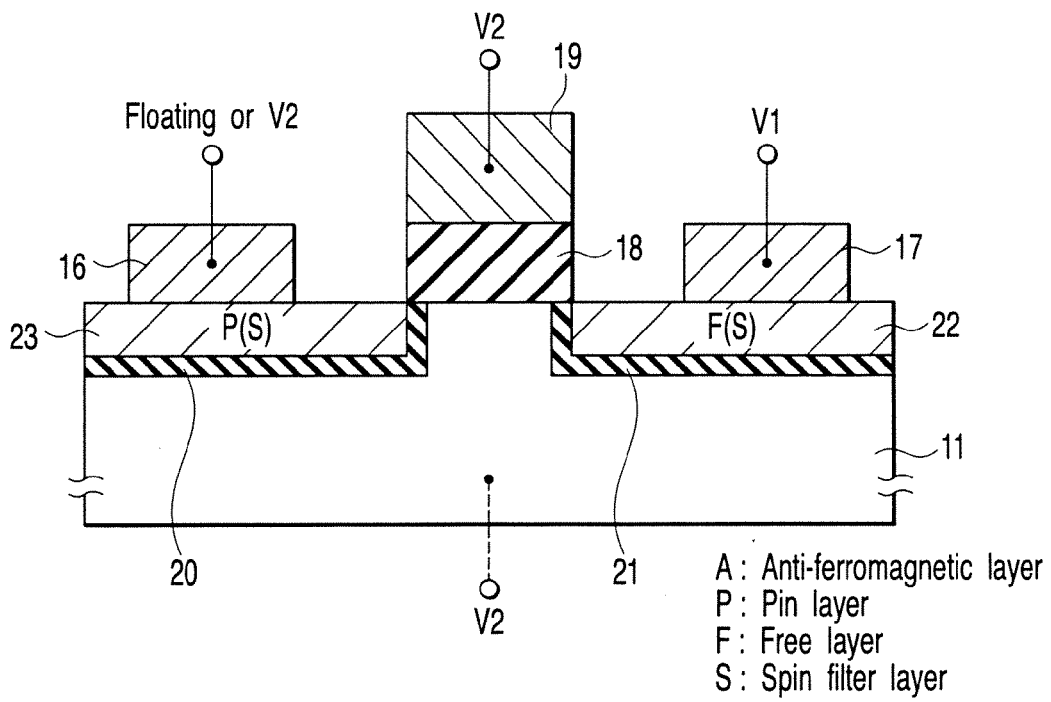
FIG. 10 is a sectional view showing a tenth basic structure of a spin FET.

FIG. 10 shows a tenth basic structure of a spin FET.

The tenth basic structure relates to a tunnel barrier type spin FET that executes data writing by only an electric field in accordance with a new principle.

In comparison, the tenth basic structure is identical to the ninth basic structure except that tunnel barrier layers (insulation layers) 20 and 21 each are provided between the semiconductor substrate 11 and each of the source/drain regions 12 and 13 in the tenth basic structure.

As in the ninth basic structure, data is written by applying a write voltage V1 to an electrode 17, applying a write voltage V2 to a gate electrode 19, and then, generating an electric field inside a source/drain region 22.

The voltage V2 serving as a back gate bias may be applied to the semiconductor substrate 11 instead of applying the voltage V2 to the gate electrode 19. In addition, the voltage V2 may be applied to both of the semiconductor substrate 11 and the gate electrode 19.

In addition, the semiconductor substrate 11 does not come into direct contact with the source/drain regions 22 and 23. Thus, this substrate can be selected from an intrinsic semiconductor, an n-type or p-type impurity doped semiconductor or the like.

According to the tenth basic structure, an advantageous effect similar to that according to the ninth basic structure can be attained. In addition, the semiconductor substrate 11 and the source/drain regions 22 and 23 are separated from each other by means of the tunnel barrier layers 20 and 21. Thus, an option of selecting a material configuring the semiconductor substrate 11 and the source/drain regions 22 and 23 broadens, and the degree of freedom for element design increases.

(2) Spin Memory

Now, a description will be given with respect to a case in which an example of the present invention is applied to a spin memory.

When applying an example of the present invention, a typical example of a memory cell array to which an example of the present invention can be applied will be first described for the purpose of simplification without being limited to a structure of a memory cell array in particular.

Figure 12:
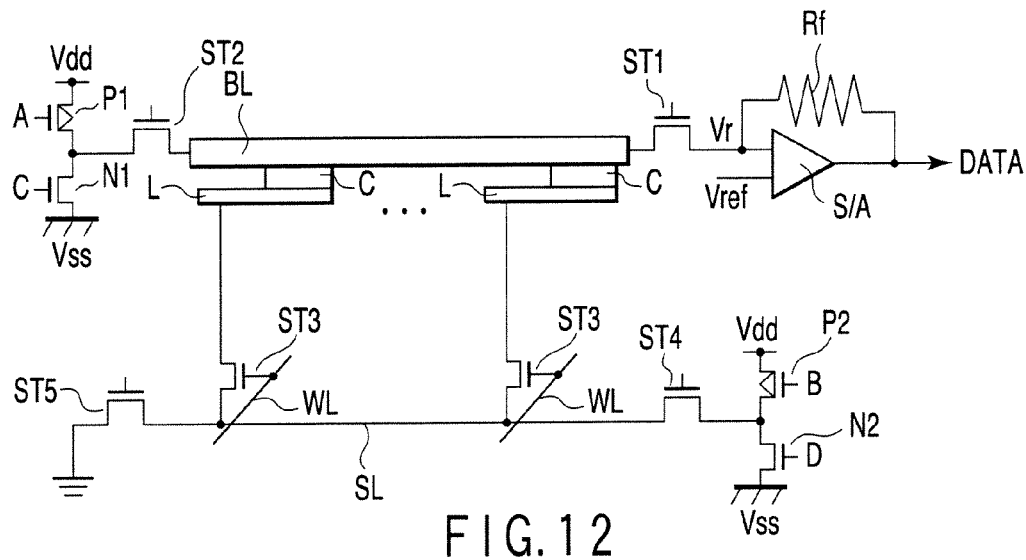
FIG. 12 is a circuit diagram showing an example of a memory cell array of a spin memory.

FIG. 12 shows an example of a memory cell array.

One end of a memory cell C is connected to a bit line BL.

One end of the bit line BL is connected to a sense amplifier S/A via an N-channel MOS transistor serving as a selector switch. The sense amplifier S/A compares a read electric potential Vr and a reference electric potential Vref with each other from the memory cell C, and then, outputs an output signal DATA. Rf is a return resistance.

The other end of the bit line BL is connected to a P-channel MOS transistor P1 and an N-channel MOS transistor N1 via an N-channel MOS transistor ST2 serving as a selector switch.

The other end of the memory cell C is connected to a lower electrode L. The lower electrode L is connected to a source line SL via a MOS transistor ST3 serving as a selector switch. The source line SL is connected to the P-channel MOS transistor P2 and the N-channel MOS transistor N2 via an N-channel MOS transistor ST4 serving as a selector switch.

In addition, the source line SL is connected to a grounding point Vss via an N-channel MOS transistor ST5 serving as a selector switch. A gate of the MOS transistor ST3 is connected to a word line WL. The word line WL extends in a direction crossing a direction in which the bit line BL extends.

In the thus structured spin memory, data is written in accordance with a spin injection writing system, for example. That is, data writing is executed by controlling an orientation of a spin injection current that flows in a memory cell C by turning ON/OFF the P-channel MOS transistors P1 and P2 and the N-channel MOS transistors N1 and N2 using control signals A, B, C, and D.

In addition, the memory cell C includes a composite material that is a multiferroric layer whose magnetization direction is changed by an electric field, for example, a ferromagnetic ferroelectric material, a ferrimagnetic ferroelectric or an anti-ferromagnetic ferroelectric material that is not zero in net magnetic moment on an interface between the adjacent ferromagnetic layers, a composite material having a ferromagnetic nano-structure and a ferroelectric nano-structure.

A multiferroric layer whose magnetization direction is changed by an electric field assists magnetization reversal using a spin injection writing system. Thus, current density of a spin injection current can be reduced more significantly than that in a case in which magnetization reversal is carried out by only the spin injection writing system, making it possible to promote low power consumption and improvement of reliability.

For data writing, a principle of executing data writing into the memory cell C by only an electric field can be adopted instead of the spin injection writing system.

Figure 13:
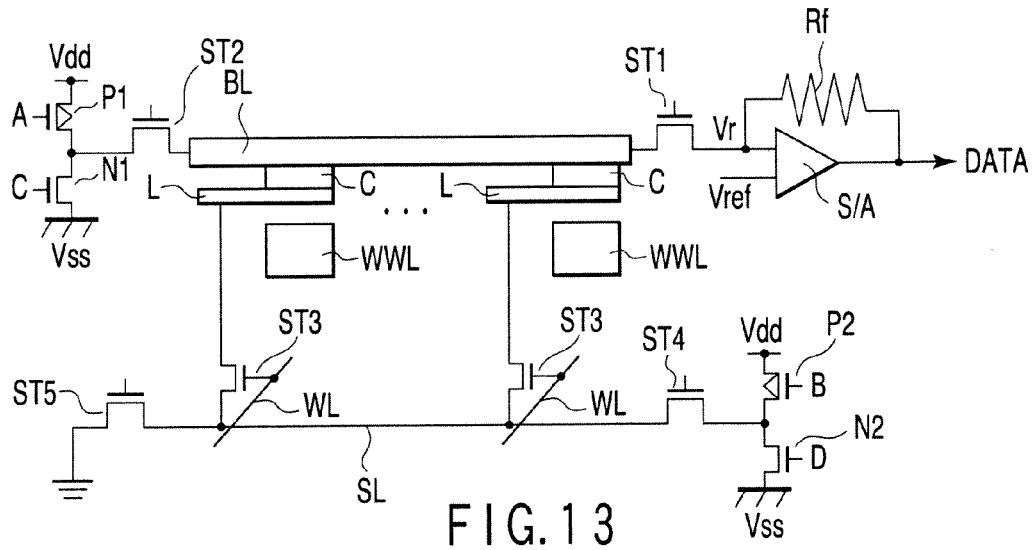
FIG. 13 is a circuit diagram showing an example of a memory cell array of a spin memory.

In addition, for example, as shown in FIG. 13, a write current line WWL is provided in a memory cell array, and a magnetic field generated by a write current that flows in the write current line WWL may be further used as an assistance of magnetization reversal.

Hereinafter, a basic structure of memory cells in a spin memory according to an example of the present invention will be described by way of example of the memory cell array shown in FIG. 12.

A. First Basic Structure

Figure 14:
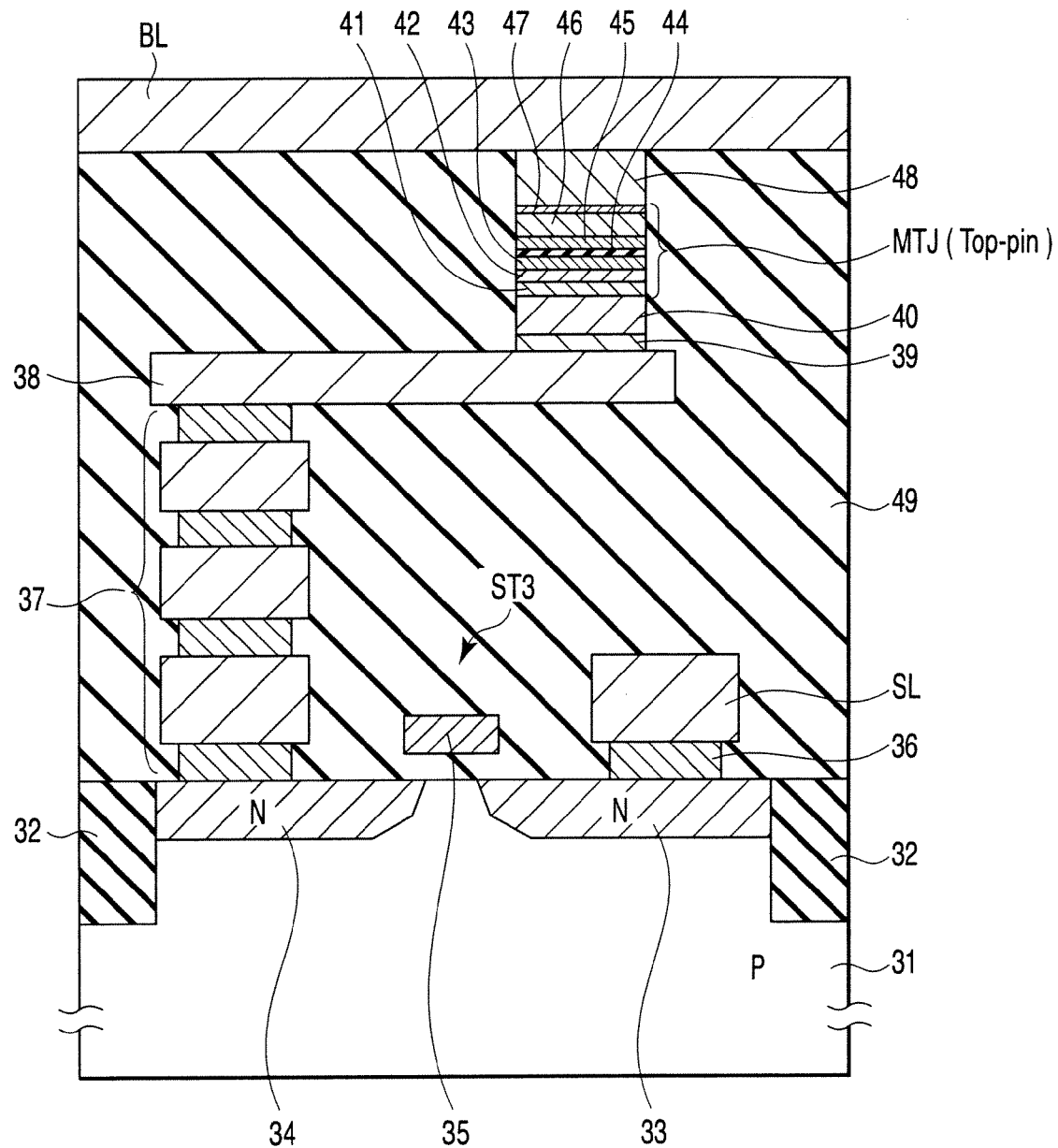
FIG. 14 is a sectional view showing a first basic structure of a spin memory.

FIG. 14 shows a first basic structure of a spin memory.

The first basic structure relates to a spin memory that executes data writing in accordance with a spin injection writing system or by only an electric field.

An element separation layer 32 having an STI (shallow trench isolation) is formed in a semiconductor substrate 11. An N-channel MOS transistor ST3 serving as a selector switch is formed in an element region enclosed by the element separation layer 32.

The MOS transistor ST3 has a source diffusion region 33, a drain diffusion region 34, and a gate electrode 35 formed at an upper part of a channel therebetween. The gate electrode 35 corresponds to a word line WL shown in FIG. 12.

The source diffusion region 33 is connected to a source line SL via a contact flag 36. The drain diffusion region 34 is connected to a lower electrode 38 via an intermediate layer 37.

On the lower electrode 38, a memory cell according to an example of the present invention is formed via an amorphous buffer layer 39.

The memory cell is composed of a top pin type MTJ (magnetic tunnel junction) element and a multiferroric layer 40 whose magnetization direction is changed by an electric field.

The multiferroric layer 40 is provided on the amorphous buffer layer 39. For example, this multiferroric layer is composed of a composite material or the like, for example, a ferromagnetic ferroelectric material, a ferrimagnetic ferroelectric or an anti-ferromagnetic ferroelectric material that is not zero in net magnetic moment on an interface between the adjacent ferromagnetic layers, a composite material having a ferromagnetic nano-structure and a ferroelectric nano-structure. The multiferroric layer 40 assists a magnetization reversal using a spin injection current.

In addition, the multiferroric layer 40 may have a function serving as a spin filter layer of sampling electrons (spin polarization electrons) that are uniform in a spin direction at the time of writing, thereby inverting magnetization of a magnetic free layer of an MTJ element.

Although a structure of the MTJ element is not limited in particular, in the present example, the MTJ element is composed of: a ferromagnetic layer 41 on the multiferroric layer 40; a nonmagnetic layer 42 on the ferromagnetic layer 41; a ferromagnetic layer 43 on the nonmagnetic layer 42; a tunnel barrier layer 44 on the ferromagnetic layer 43; a ferromagnetic layer 45 on the tunnel barrier layer 44; and an anti-ferromagnetic layer 46 on the ferromagnetic layer 45.

A magnetic free layer is composed of a laminate of the ferromagnetic layer 41, the nonmagnetic layer 42, and the ferromagnetic layer 43, and has a so called SAF (synthetic anti-ferromagnetic) structure. That is, the two ferromagnetic layers 41 and 43 are magnetically coupled with each other by means of anti-ferromagnetic interaction.

A magnetic pinned layer is composed of the ferromagnetic layer 45, and the magnetization direction is fixedly deposited by means of the anti-ferromagnetic layer 46. The magnetization direction of the magnetic pinned layer can also be fixedly deposited by increasing a coercive force of the ferromagnetic layer 45 instead of applying the anti-ferromagnetic layer 46. However, from the viewpoints of stability and long-term reliability, it is preferable to fixedly deposit the magnetization direction of the magnetic pinned layer by means of the anti-ferromagnetic layer 46.

An upper face of the MTJ element is connected to a bit line BL via a cap layer 47 and a contact layer (for example, metal) 48 having a function of protecting the MTJ element. The memory cell and selector switch are covered with an insulation layer 49, and then, the bit line BL is provided on the insulation layer 49, for example.

In the thus structured spin memory, data is written by turning ON a MOS transistor ST3, for example, and then, supplying a spin injection current to a memory cell.

A value of write data is determined by controlling an orientation of the spin injection current by turning ON/OFF the P-channel MOS transistors P1 and P2 and the N-channel MOS transistors N1 and N2 shown in FIG. 12, for example.

Here, at the time of spin injection writing, a predetermined voltage is applied to the multiferroric layer 40, and an electric field is generated inside thereof. Due to this magnetic field, distortion occurs in the multiferroric layer 40. First, magnetization of the multiferroric layer 40 is inverted. Then, magnetization of the multiferroric layer 40 assists magnetization reversal of the magnetic free layer of the MTJ element.

That is, the magnetic free layer of the MTJ element is magnetically coupled with the multiferroric layer 40. Thus, the magnetization is prone to be oriented in a direction identical to the magnetization direction of the multiferroric layer 40. Therefore, with respect to the magnetic free layer of the MTJ element, magnetization reversal using spin polarization electrons is facilitated.

In addition, in the case of the structure according to the present example, data writing can be executed by only an electric field instead of a spin injection writing system. In this case, magnetization of a magnetic free layer of the MTJ element is inverted together with magnetization reversal of the multiferroric layer 40.

Data is read out by turning ON the MOS transistor ST3, for example, and then, supplying a read current to a memory cell. The read current is set at a value smaller than a spin injection current in order to prevent erroneous writing at the time of read.

Therefore, according to the first basic structure, the current density of the spin injection current can be reduced more significantly than in a case in which magnetization reversal is carried out in accordance with only the spin injection writing system, making it possible to promote low power consumption and improvement of reliability.

Figure 15:
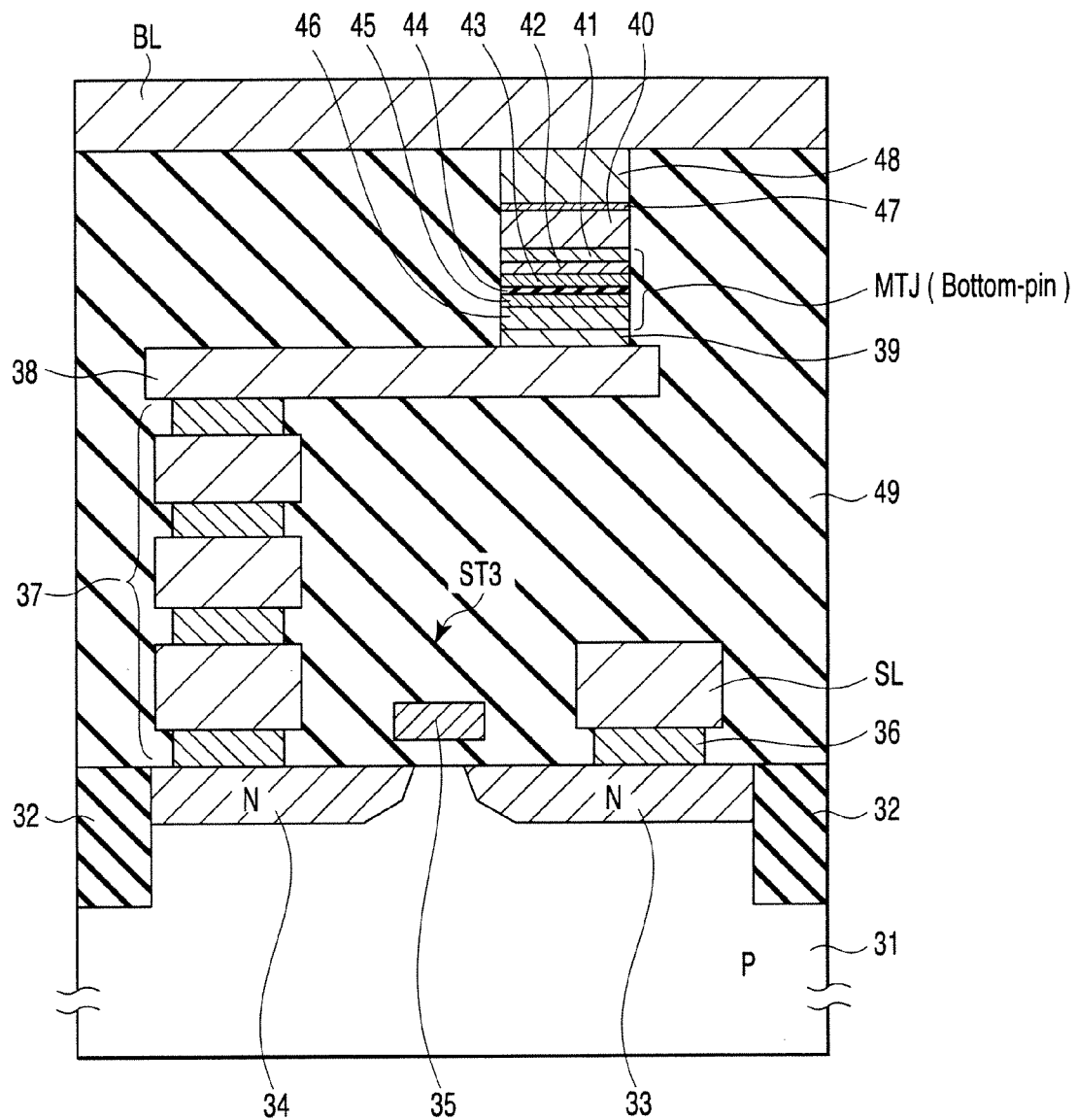
FIG. 15 is a sectional view showing a first basic structure of a spin memory.

In the present example, although the MTJ element is of top pin type, this element may be of bottom pin type, as shown in FIG. 15, for example, without being limited thereto.

In the case of the top pin type, as shown in FIG. 14, a multiferroric layer (spin filter layer) 40, a ferromagnetic layer 41, a nonmagnetic layer 42, a ferromagnetic layer 43, a tunnel barrier layer 44, a ferromagnetic layer 45, and an anti-ferromagnetic layer 46 are formed on an amorphous buffer 39 in this order.

In contrast, in the case of the bottom pin type, as shown in FIG. 15, an anti-ferromagnetic layer 46, a ferromagnetic layer 45, a tunnel barrier layer 44, a ferromagnetic layer 43, a nonmagnetic layer 42, a ferromagnetic layer 41, and a multiferroric layer (spin filter layer) 40 are formed on the amorphous buffer 39 in this order.

The other structure is the same in both cases.

The top pin type MTJ element is more preferable than the bottom pin type MTJ element in terms of a manufacturing process and characteristics.

As has been described above, according to the first basic structure, a spin memory with low power consumption and high reliability can be achieved in accordance with a new writing principle utilizing a multiferroric layer whose magnetization direction is changed by an electric field.

B. Second Basic Structure

Figure 16:
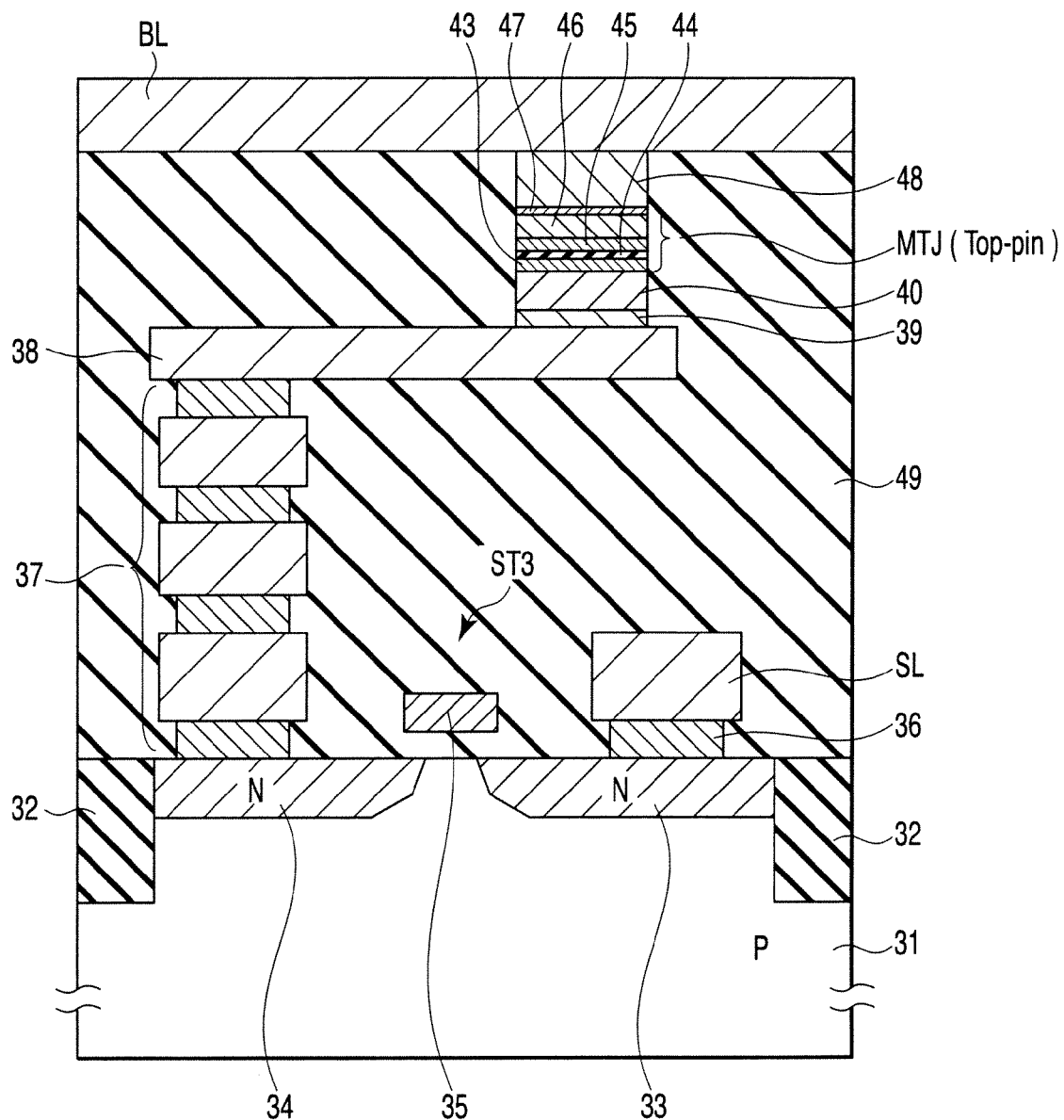
FIG. 16 is a sectional view showing a second basic structure of a spin memory.

FIG. 16 shows a second basic structure of a spin memory.

The second basic structure relates to a spin memory that executes data writing in accordance with a spin injection writing system or an electric field.

An element separation layer 32 having an STI structure is formed in a semiconductor substrate 11. An N-channel MOS transistor ST3 serving as a selector switch is formed in an element region enclosed by the element separation layer 32. A structure of the MOS transistor ST3 is identical to the first basic structure.

On a lower electrode 38, memory cells according to an example of the present invention are formed via an amorphous buffer layer 39.

Each memory cell is composed of a top pin type MTJ element and the multiferroric layer 40 whose magnetization direction is changed by an electric field.

The multiferroric layer 40 is disposed on the amorphous buffer layer 39 and is composed of a composite material or the like that is a ferromagnetic ferroelectric material, a ferrimagnetic ferroelectric or an anti-ferromagnetic ferroelectric material that is not zero in net magnetic moment on an interface between the adjacent ferromagnetic layers, a composite material having a ferromagnetic nano-structure and a ferroelectric nano-structure. The multiferroric layer 40 assists magnetization reversal using a spin injection writing system, for example.

In addition, the multiferroric layer 40 may have a function as a spin filter layer that samples electrons (spin polarization electrons) that are uniform in a spin direction at the time of writing, thereby inverting magnetization of a magnetic free layer of the MTJ element.

The MTJ element is composed of: a ferromagnetic layer 43 on the multiferroric layer 40; a tunnel barrier layer 44 on the ferromagnetic layer 43; a ferromagnetic layer 45 on the tunnel barrier layer 44; and an anti-ferromagnetic layer 46 on the ferromagnetic layer 45. The magnetic free layer is composed of the ferromagnetic layer 43, and a magnetic pinned layer is composed of the ferromagnetic layer 45.

The magnetization direction of the ferromagnetic layer 45 is fixedly deposited by means of the anti-ferromagnetic layer 46. The magnetization direction of the ferromagnetic layer 45 layer can also be fixedly deposited by increasing a coercive force of the ferromagnetic layer 45 instead of applying the anti-ferromagnetic layer 46.

However, from the viewpoints of stability and long-term reliability, it is preferable to fixedly deposit the magnetization direction of the magnetic pinned layer by means of the anti-ferromagnetic layer 46.

An upper face of the MTJ element is connected to a bit line BL via a cap layer 47 and a contact layer (for example, metal) 48 having a function of protecting the MTJ element. The memory cell and selector switch are covered with an insulation layer 49, and then, the bit line BL is provided on the insulation layer 49, for example.

In the thus structured spin memory, data is written by turning ON a MOS transistor ST3, for example, and then, supplying a spin injection current to a memory cell.

A value of write data is determined by controlling an orientation of the spin injection current by turning ON/OFF the P-channel MOS transistors P1 and P2 and the N-channel MOS transistors N1 and N2 shown in FIG. 12, for example.

Here, at the time of spin injection writing, a predetermined voltage is applied to the multiferroric layer 40, and an electric field is generated inside thereof. Due to this magnetic field, distortion occurs in the multiferroric layer 40. First, magnetization of the multiferroric layer 40 is inverted. Then, magnetization of the multiferroric layer 40 assists magnetization reversal of the magnetic free layer of the MTJ element.

That is, the magnetic free layer of the MTJ element is magnetically coupled with the multiferroric layer 40. Thus, the magnetization is prone to be oriented in a direction identical to the magnetization direction of the multiferroric layer 40. Therefore, with respect to the magnetic free layer of the MTJ element, magnetization reversal using spin polarization electrons is facilitated.

In addition, in the case of the structure according to the present example, data writing can be executed by only an electric field instead of a spin injection writing system. In this case, magnetization of a magnetic free layer of the MTJ element is inverted together with magnetization reversal of the multiferroric layer 40.

Data is read out by turning ON the MOS transistor ST3, for example, and then, supplying a read current to a memory cell. The read current is set at a value smaller than a spin injection current in order to prevent erroneous writing at the time of read.

Therefore, according to the second basic structure, the current density of the spin injection current can be reduced more significantly than that of a case in which magnetization reversal is carried out in accordance with only the spin injection writing system, making it possible to achieve low power consumption and improvement of reliability.

In the present example, although the MTJ element is of a top pin type, the element may be of a bottom pin type, as shown in FIG. 17, for example, without being limited thereto.

In the case of the top pin type, as shown in FIG. 16, a multiferroric layer (spin filter layer) 40, a ferromagnetic layer 43, a tunnel barrier layer 44, a ferromagnetic layer 45, and an anti-ferromagnetic layer 46 are formed in this order on the amorphous buffer 39.

In contrast, in the case of the bottom pin type, as shown in FIG. 17, an anti-ferromagnetic layer 46, a ferromagnetic layer 45, a tunnel barrier layer 44, a ferromagnetic layer 43, and a multiferroric layer (spin filter layer) 40 are formed in this order on the amorphous buffer 39.

Both of them are identical to each other with respect to other constituent elements.

The top pin type MTJ element is more preferable than the bottom pin type MTJ element in terms of a manufacturing process and characteristics.

As has been described above, according to the second basic structure, a spin memory with low power consumption and high reliability can be achieved in accordance with a new writing principle utilizing a multiferroric layer whose magnetization direction is changed by an electric field.

C. Third Basic Structure

Figure 18:
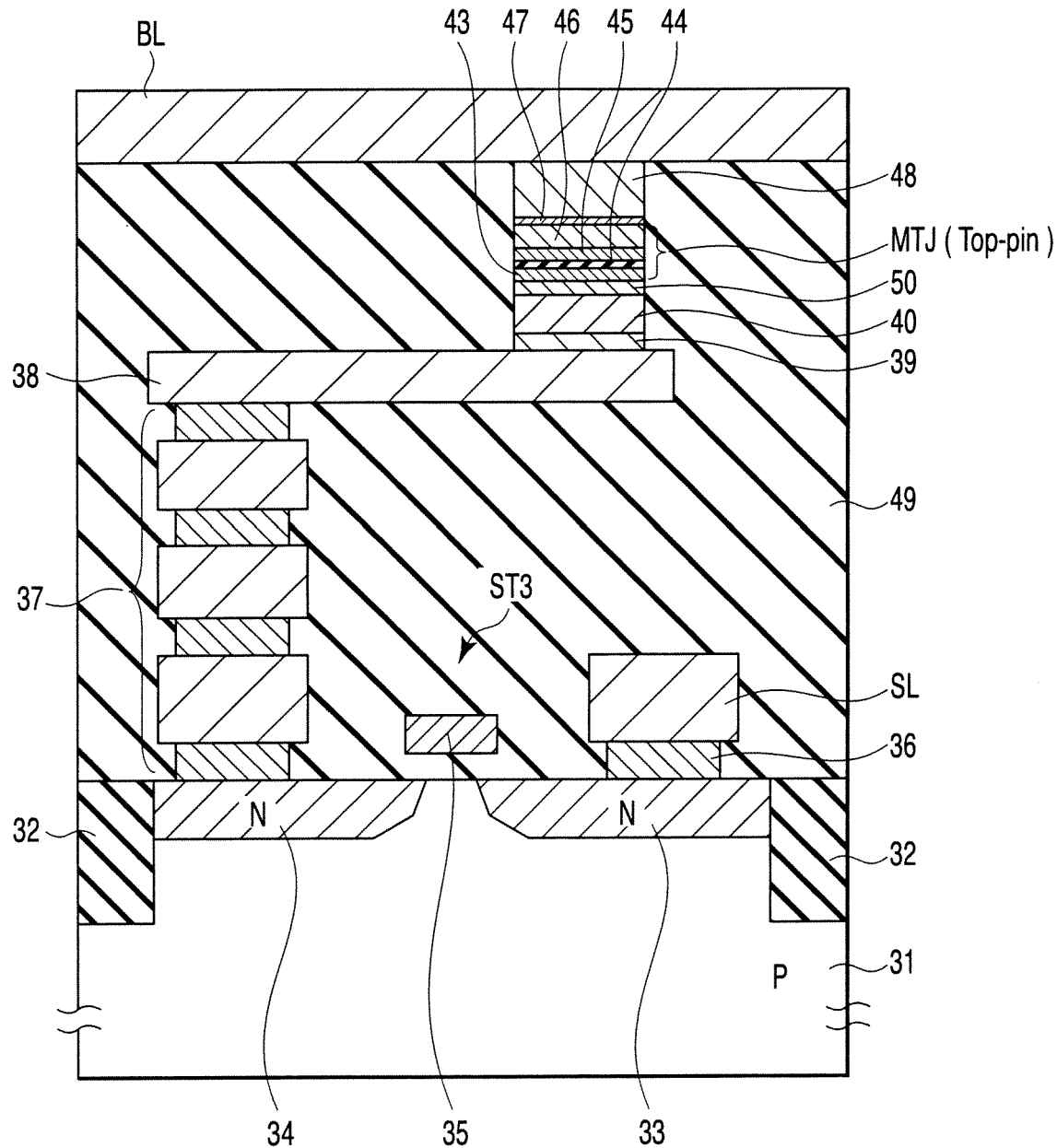
FIG. 18 is a sectional view showing a third basic structure of a spin memory.

FIG. 18 shows a third basic structure of a spin memory.

The third basic structure relates to a spin memory that executes data writing in accordance with a spin injection writing system or an electric field.

An element separation layer 32 having an STI structure is formed in a semiconductor substrate 11. An N-channel MOS transistor ST3 serving as a selector switch is formed in an element region enclosed by the element separation layer 32. A structure of the MOS transistor ST3 is identical to the first basic structure.

On a lower electrode 38, memory cells according to an example of the present invention are formed via an amorphous buffer layer 39.

Each memory cell is composed of a top pin type MTJ element and a multiferroric layer 40 whose magnetization direction is changed by an electric field.

The multiferroric layer 40 is disposed on the amorphous buffer layer 39, and is composed of a composite material or the like that is a ferromagnetic ferroelectric material, a ferrimagnetic ferroelectric or an anti-ferromagnetic ferroelectric material that is not zero in net magnetic moment on an interface between the adjacent ferromagnetic layers, a composite material having a ferromagnetic nano-structure and a ferroelectric nano-structure. The multiferroric layer 40 assists magnetization reversal using a spin injection writing system, for example.

In addition, the multiferroric layer 40 may have a function as a spin filter layer that samples electrons (spin polarization electrons) that are uniform in a spin direction at the time of writing, thereby inverting magnetization of a magnetic free layer of the MTJ element.

The MTJ element is composed of: a ferromagnetic layer 43; a tunnel barrier layer 44 on the ferromagnetic layer 43; a ferromagnetic layer 45 on the tunnel barrier layer 44; and an anti-ferromagnetic layer 46 on the ferromagnetic layer 45. The magnetic free layer is composed of the ferromagnetic layer 43, and a magnetic pinned layer is composed of the ferromagnetic layer 45.

The magnetization direction of the ferromagnetic layer 45 is fixedly deposited by means of the anti-ferromagnetic layer 46. The magnetization direction of the ferromagnetic layer 45 layer can also be fixedly deposited by increasing a coercive force of the ferromagnetic layer 45 instead of applying the anti-ferromagnetic layer 46.

However, from the viewpoints of stability and long-term reliability, it is preferable to fixedly deposit the magnetization direction of the magnetic pinned layer by means of the anti-ferromagnetic layer 46.

Between the multiferroric layer 40 and the ferromagnetic layer 43, a nonmagnetic layer 50 for adjusting strength of magnetic coupling therebetween is provided. A material for the nonmagnetic layer 50 is not limited in particular, and thus, an insulation element, an electrically conductive element or the like can be used, for example.

An upper face of the MTJ element is connected to a bit line BL via a cap layer 47 and a contact layer (for example, metal) 48 having a function of protecting the MTJ element. The memory cell and selector switch are covered with an insulation layer 49, and then, the bit line BL is provided on the insulation layer 49, for example.

In the thus structured spin memory, data is written by turning ON a MOS transistor ST3, for example, and then, supplying a spin injection current to a memory cell.

A value of write data is determined by controlling an orientation of the spin injection current by turning ON/OFF the P-channel MOS transistors P1 and P2 and the N-channel MOS transistors N1 and N2 shown in FIG. 12, for example.

Here, at the time of spin injection writing, a predetermined voltage is applied to the multiferroric layer 40, and an electric field is generated inside thereof. Due to this magnetic field, distortion occurs in the multiferroric layer 40. First, magnetization of the multiferroric layer 40 is inverted. Then, magnetization of the multiferroric layer 40 assists magnetization reversal of the magnetic free layer of the MTJ element.

That is, the magnetic free layer of the MTJ element is affected by the magnetization of the multiferroric layer 40. Thus, the magnetization is prone to be oriented in a direction identical to the magnetization direction of the multiferroric layer 40. Therefore, with respect to the magnetic free layer of the MTJ element, magnetization reversal using spin polarization electrons is facilitated.

In addition, in the case of the structure according to the present example, data writing can be executed by only an electric field instead of a spin injection writing system. In this case, magnetization of a magnetic free layer of the MTJ element is inverted together with magnetization reversal of the multiferroric layer 40.

Data is read out by turning ON the MOS transistor ST3, for example, and then, supplying a read current to a memory cell.

The read current is set at a value smaller than a spin injection current in order to prevent erroneous writing at the time of read.

Therefore, according to the third basic structure, the current density of the spin injection current can be reduced more significantly than that of a case in which magnetization reversal is carried out in accordance with only the spin injection writing system, making it possible to achieve low power consumption and improvement of reliability.

Figure 19:
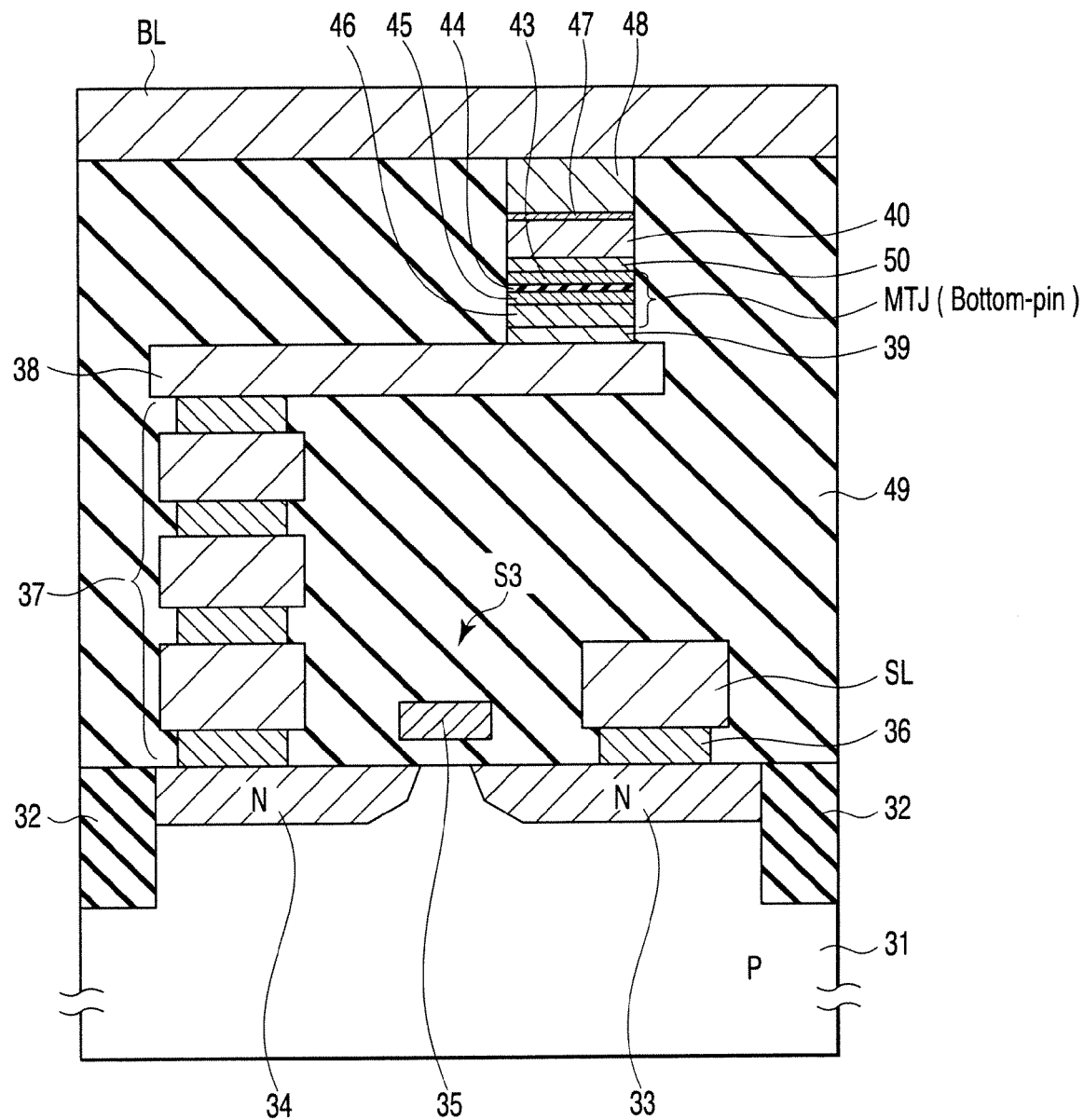
FIG. 19 is a sectional view showing a third basic structure of a spin memory.

In the present example, although the MTJ element is of a top pin type, the element may be of a bottom pin type, as shown in FIG. 19, for example, without being limited thereto.

In the case of the top pin type, as shown in FIG. 18, a multiferroric layer (spin filter layer) 40, a nonmagnetic layer 50, a ferromagnetic layer 43, a tunnel barrier layer 44, a ferromagnetic layer 45, and an anti-ferromagnetic layer 46 are formed in this order on the amorphous buffer 39.

In contrast, in the case of the bottom pin type, as shown in FIG. 19, an anti-ferromagnetic layer 46, a ferromagnetic layer 45, a tunnel barrier layer 44, a ferromagnetic layer 43, a nonmagnetic layer 50, and a multiferroric layer (spin filter layer) 40 are formed in this order on the amorphous buffer 39.

Both of them are identical to each other with respect to other constituent elements.

The top pin type MTJ element is more preferable than the bottom pin type MTJ element in terms of a manufacturing process and characteristics.

As has been described above, according to the third basic structure, a spin memory with low power consumption and high reliability can be achieved in accordance with a new writing principle utilizing a multiferroric layer whose magnetization direction is changed by an electric field.

D. Fourth Basic Structure

Figure 20:
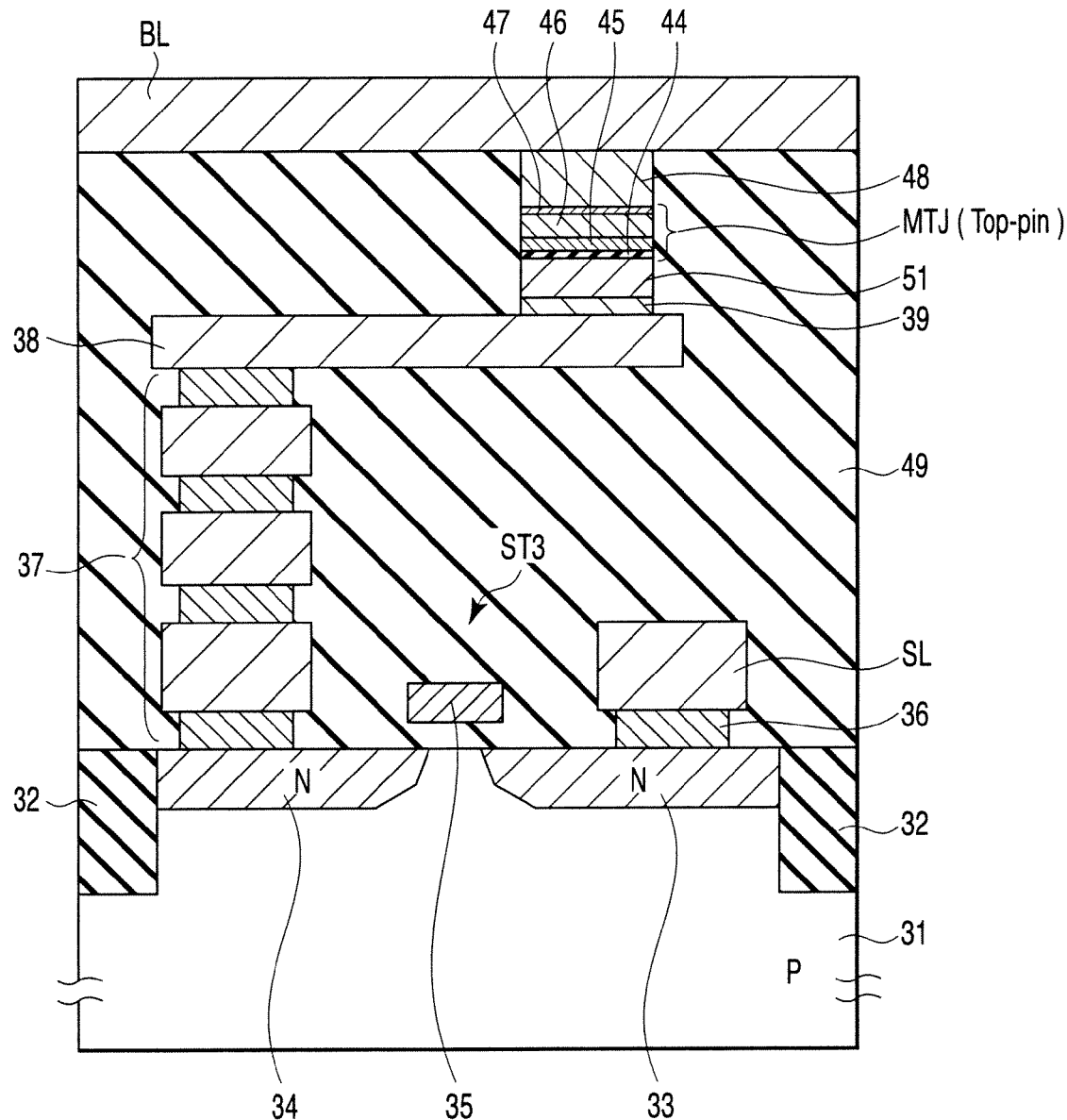
FIG. 20 is a sectional view showing a fourth basic structure of a spin memory.

FIG. 20 shows a fourth basic structure of a sin memory.

The fourth basic structure relates to a spin memory that executes data writing in accordance with a spin injection writing system or only an electric field.

An element separation layer 32 having an STI structure is formed in a semiconductor substrate 11. An N-channel MOS transistor ST3 serving as a selector switch is formed in an element region enclosed by the element separation layer 32. A structure of the MOS transistor ST3 is identical to the first basic structure.

On a lower electrode 38, memory cells according to an example of the present invention are formed via an amorphous buffer layer 39.

Each memory cell is composed of a top pin type MTJ element. The MTJ element is composed of a multiferroric layer (ferromagnetic layer) 51; a tunnel barrier layer 44 on the multiferroric layer 51; a ferromagnetic layer 45 on the tunnel barrier layer 44; and an anti-ferromagnetic layer 46 on the ferromagnetic layer 45.

A magnetic free layer is composed of a multiferroric layer 51. The multiferroric layer 51 is disposed on the amorphous buffer layer 39, and is composed of a composite material or the like that is a ferromagnetic ferroelectric material, a ferrimagnetic ferroelectric or an anti-ferromagnetic ferroelectric material whose magnetization direction is changed by an electric field, and that is not zero in net magnetic moment on an interface between the adjacent ferromagnetic layers, a composite material having a ferromagnetic nano-structure and a ferroelectric nano-structure.

In addition, the multiferroric layer 51 may have a function serving as a spin filter layer of sampling electrons (spin polarization electrons) whose spin directions are uniform at the time of write processing, thereby inverting magnetization of the magnetic free layer of the MTJ element.

A magnetic pinned layer is composed of a ferromagnetic layer 45. The magnetization direction of the ferromagnetic layer 45 is fixedly deposited by means of an anti-ferromagnetic layer 46. The magnetization direction of the ferromagnetic layer 45 can also be carried out by increasing a coercive force of the ferromagnetic layer 45 instead of applying the anti-ferromagnetic layer 46.

However, from the viewpoints of stability and long-term reliability, it is preferable to fixedly deposit the magnetization direction of the magnetic pinned layer by means of the anti-ferromagnetic layer 46.

An upper face of the MTJ element is connected to a bit line BL via a cap layer 47 and a contact layer (for example, metal) 48 having a function of protecting the MTJ element. The memory cell and selector switch are covered with an insulation layer 49, and then, the bit line BL is provided on the insulation layer 49, for example.

In the thus structured spin memory, data is written by turning ON a MOS transistor ST3, for example, and then, supplying a spin injection current to a memory cell.

A value of write data is determined by controlling an orientation of the spin injection current by turning ON/OFF the P-channel MOS transistors P1 and P2 and the N-channel MOS transistors N1 and N2 shown in FIG. 12, for example.

Here, at the time of spin injection writing, a predetermined voltage is applied to a multiferroric layer 51, and an electric field is generated inside thereof. Due to this magnetic field, distortion occurs in the multiferroric layer 51. Thus, magnetization of the multiferroric layer 51 serving as a magnetic free layer is easily inverted by the spin injection writing system.

In addition, in the case of the structure according to the present example, data writing can be executed by only an electric field instead of a spin injection writing system.

Data is read out by turning ON the MOS transistor ST3, for example, and then, supplying a read current to a memory cell. The read current is set at a value smaller than a spin injection current in order to prevent erroneous writing at the time of read.

Therefore, according to the fourth basic structure, the current density of the spin injection current can be reduced more significantly than that in a case in which magnetization reversal is carried out in accordance with only the spin injection writing system, making it possible to promote low power consumption and improvement of reliability.

Figure 21:
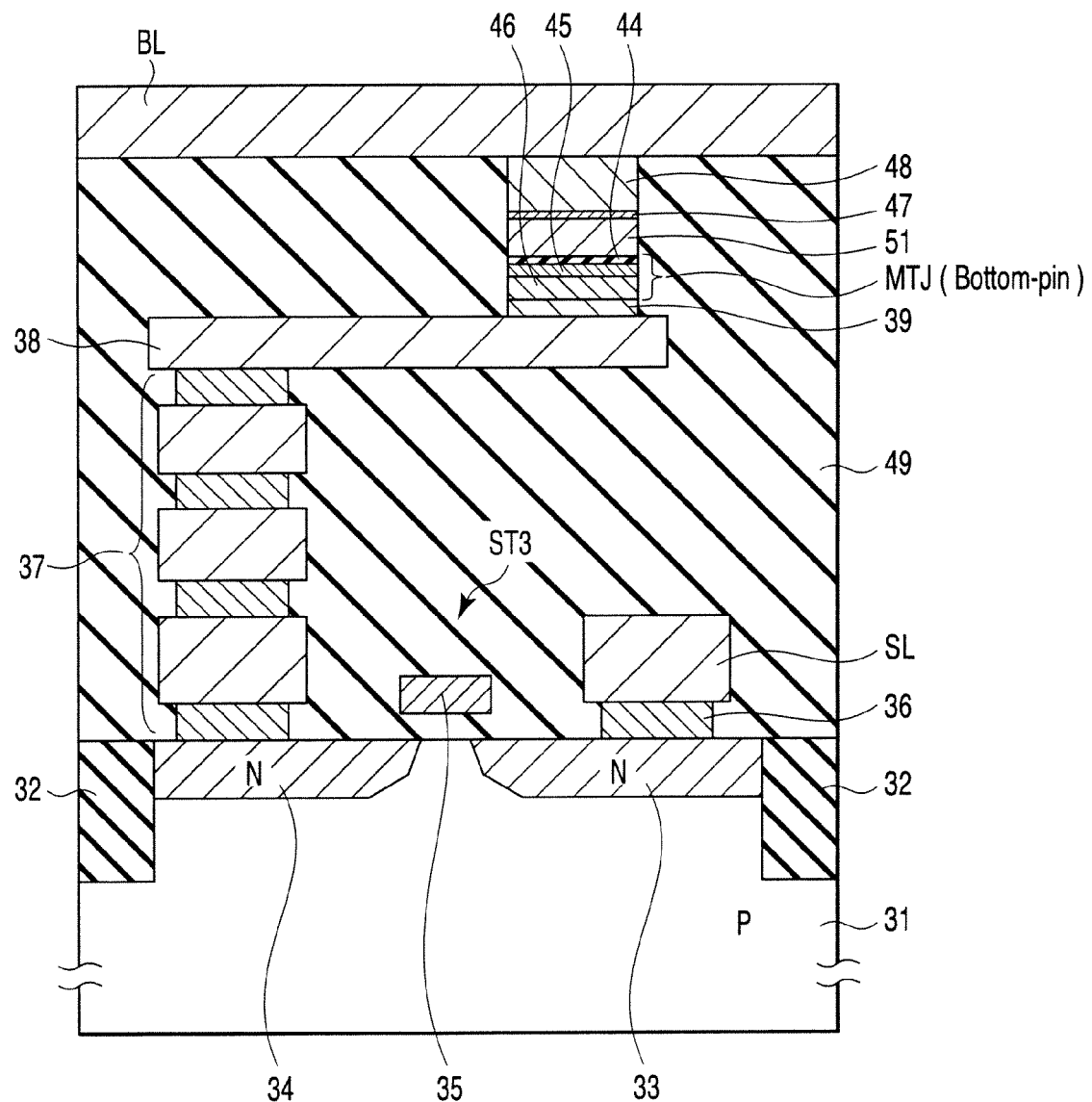
FIG. 21 is a sectional view showing a fourth basic structure of a spin memory.

In the present example, although the MTJ element is of a top pin type, the element may be of a bottom pin type without being limited thereto, for example, as shown in FIG. 21.

In the case of the top pin type, as shown in FIG. 20, a multiferroric layer (ferromagnetic layer) 51, a tunnel barrier layer 44, a ferromagnetic layer 45, and an anti-ferromagnetic layer 46 are formed in this order on the amorphous buffer 39.

In contrast, in the case of the bottom pin type, as shown in FIG. 21, an anti-ferromagnetic layer 46, a ferromagnetic layer 45, a tunnel barrier layer 44, and a multiferroric layer (ferromagnetic layer) 51 are formed in this order on the amorphous buffer 39.

Both of them are identical to each other with respect to other constituent elements.

The top pin type MTJ element is more preferable than the bottom pin type MTJ element in terms of a manufacturing process and characteristics.

As has been described above, according to the fourth basic structure, a spin memory with low power consumption and high reliability can be achieved in accordance with a new writing principle utilizing a multiferroric layer whose magnetization direction is changed by an electric field.

3. Material Examples

A description will be given with respect to examples of materials for use in a magnetic recording unit of a spin FET and memory cells of a spin memory according to an example of the present invention A multiferroric layer whose magnetization direction is changed by an electric field is composed of a composite material that is a ferromagnetic ferroelectric material, a ferrimagnetic ferroelectric or an anti-ferromagnetic ferroelectric material that is not zero in net magnetic moment on an interface between the adjacent ferromagnetic layers (in the direction to which magnetization is changed), a composite material having a ferromagnetic nano-structure and a ferroelectric nano-structure. For example, examples of such a multiferroric layer include: $Bi_2FeCrO_6$, $BiFeO_3$, $Bi_{1-x}Ba_xFe_3O_4$ and the like as an ferromagnetic ferroelectric material; $Cr_2O_3$ and the like as a ferrimagnetic ferroelectric material or an anti-ferromagnetic ferroelectric material; and a $BaTiO_3$—$CoFe_2O_4$ nano-structure, a $PbTO_3$—$CoFe_2O_4$ nano-structure and the like as a composite material having a ferromagnetic nano-structure and a ferroelectric nano-structure. $Bi_2FeCrO_6$ and $BiFeO_3$ each have an excellent property at a high temperature as well.

In addition, in order to have the property as explained in the embodiment described above, with respect to $Cr_2O_3$, for example, it is preferable to direct its crystalline structure in a (111) orientation, and then, to apply an electric field in a [111] direction, and magnetization can be changed in the [111] direction. In addition, it is possible to use $Bi_2FeCrO_6$ and $BiFeO_3$, and, for example, it is preferable to direct its crystalline structure in the (111) direction, and then, to apply an electric field in the [111] direction. In addition, with respect to a $BaTiO_3$—$CoFe_2O_4$ nano-structure and a $PbTiO_3$—$CoFe_2O_4$ nano-structure, for example, it is preferable to direct its crystalline structure in a (001) orientation, and then, to apply an electric field in the (001) direction. Magnetization can be changed in a vertical direction with respect to the [001] direction.

The nano-structure denotes a crystalline structure controlled in nano-order, and, for example, a structure made of a set of a plurality of crystalline columns is equivalent thereto.

A multiferroric layer other than a multiferroric layer whose magnetization direction is changed by such an electric field, for example, is composed of a laminate of one or at least two of an alloy such as Ne—Fe, Co—Fe, and Co—Fe—Ni, an amorphous material such as (Co, Fe, Ni)—(Si, B), (Co, Fe, Ni)—(Si, B)—(P, Al, Mo, Mb, Mn), and Co—(Zr, Hf, Nb, Ta, Ti) (selecting one of the materials enclosed in parentheses); a Heuslar alloy such as $Co_2$ $(Cr_2Fe_{1-x})$ Al (0<x<1), $Co_2$ $(Cr_xFe_{1-x})$ Si (0<x<1), $Co_2MnGe$, and $Co_2MnSi$; and the rare thin-magnetic semiconductors such as SiMn, GeMn, and $Fe_3Si$.

The magnetization direction of the residual magnetization of a multiferroric layer may be either of a horizontal direction and a vertical direction with respect to a surface of a semiconductor substrate.

Figure 22:
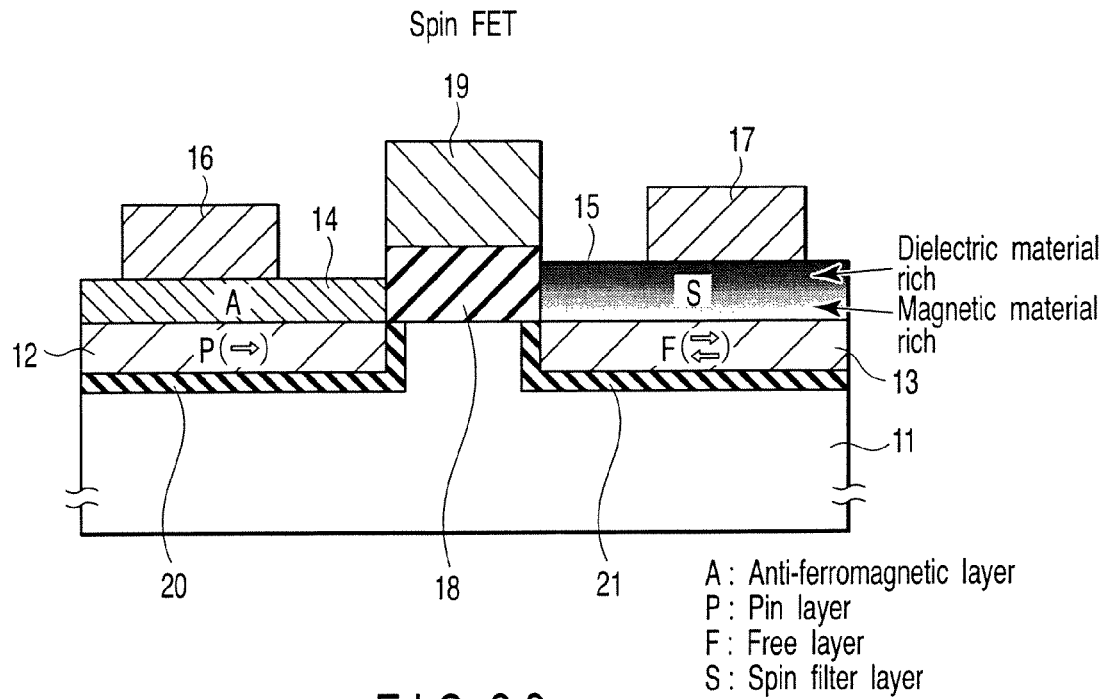
FIG. 22 is a sectional view showing a material example of a spin FET.
Figure 23:
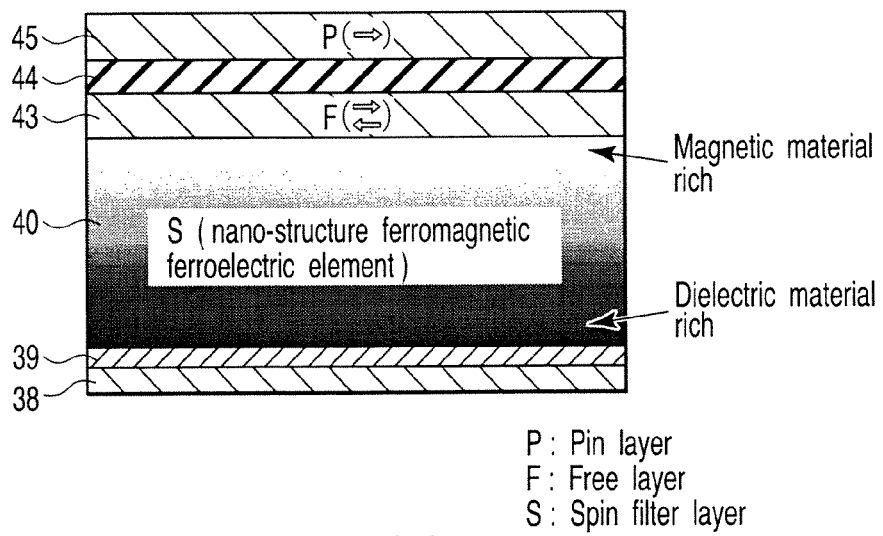
FIG. 23 is a sectional view showing a material example of memory cells of a spin memory.

First, in the case where the magnetization direction of the residual magnetization is oriented in a horizontal direction with respect to the surface of the semiconductor substrate, as shown in FIGS. 22 and 23, multiferroric layers 15 and 40 can be made of a composite material (nano-structure ferromagnetic ferroelectric material) having a ferromagnetic nano-structure and a ferroelectric nano-structure.

While FIG. 22 is equivalent to the second basic structure of the spin FET shown in FIG. 2, and FIG. 23 is equivalent to memory cells in the second basic structure of the spin memory shown in FIG. 16, this also applies to other basic structures.

It is the most preferable that the nano-structure ferromagnetic ferroelectric material should have a structure such that a rate of ferromagnetic material and a rate of ferroelectric material continuously change in a thickness direction (in a vertical direction with respect to a surface of the semiconductor substrate 11). A state in which a rate of ferromagnetic material is larger than that of ferroelectric material is referred to as magnetic material rich, and a state in which a rate of ferroelectric material is larger than that of ferromagnetic material is referred to as dielectric material rich.

A magnetic material rich region is made adjacent to ferromagnetic layers 13 and 43 serving as a magnetic free layer. The magnetization directions of the ferromagnetic layers 13 and 14 (indicated by the whitened arrow) are affected by a magnetic material rich region in particular of the multiferroric layers 15 and 40.

When the multiferroric layers 15 and 40 are composed of such a nano-structure ferromagnetic ferroelectric material, physical connection between the ferromagnetic layers 13 and 43 and the multiferroric layers 15 and 40 becomes continuous, and a magnetic interaction generated therebetween becomes uniform, thus decreasing distortion in orientation of an electronic spin.

Figure 24:
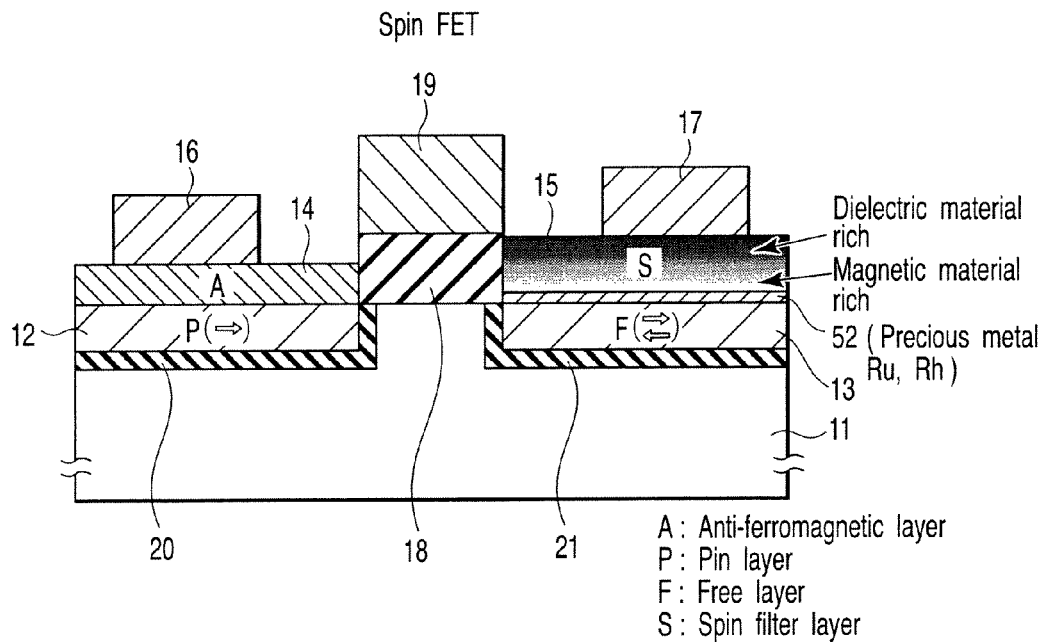
FIG. 24 is a sectional view showing a material example of a spin FET.
Figure 25:
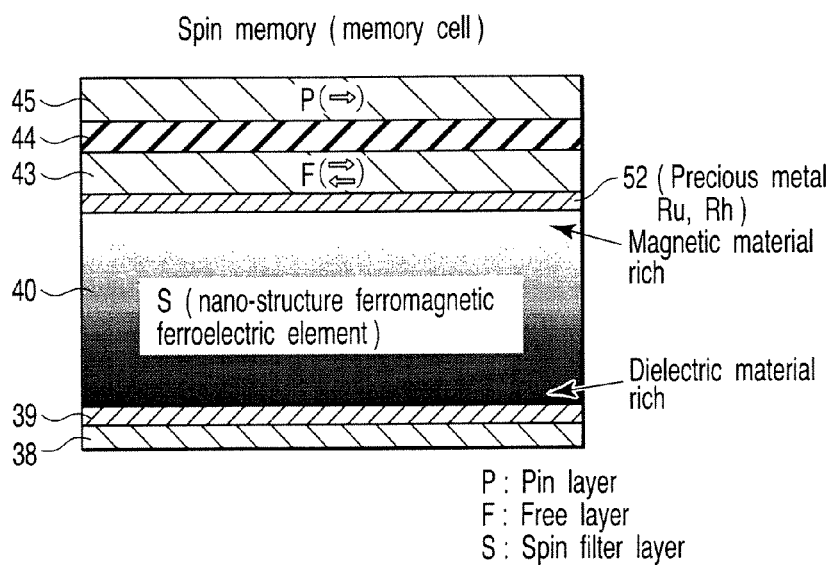
FIG. 25 is a sectional view showing a material example of memory cells of a spin memory.

As shown in FIGS. 24 and 25, even if a precious metal layer (for example, Ru or Rh) 52 is provided between the ferromagnetic layers 13 and 43 and the multiferroric layers 15 and 40, a similar advantageous effect can be attained.

Figure 26:
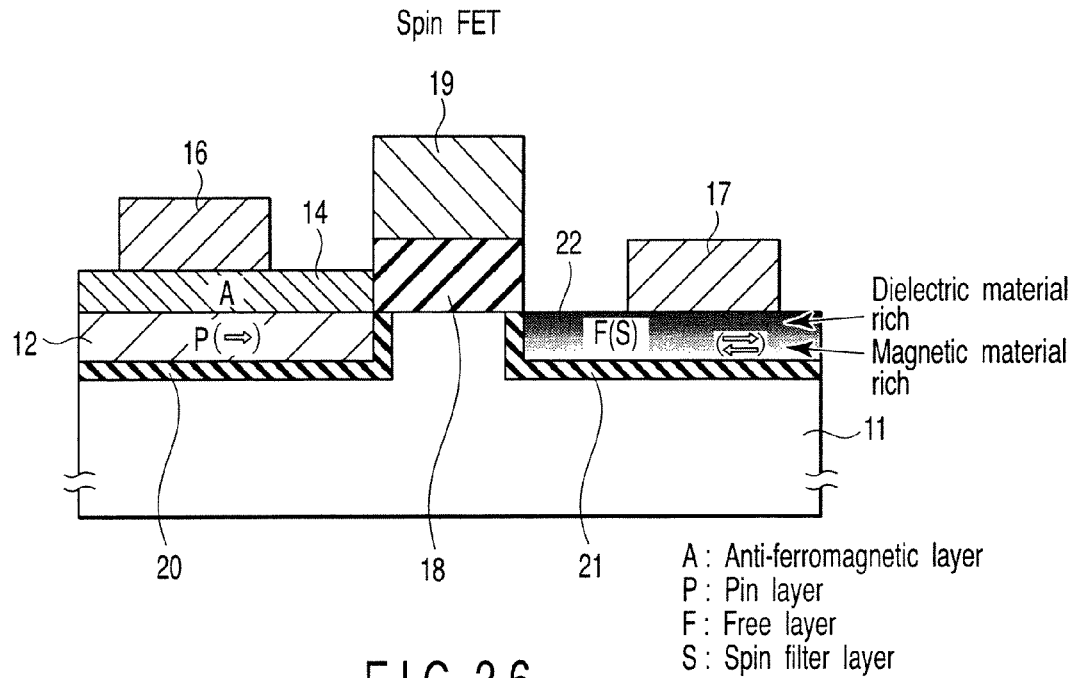
FIG. 26 is a sectional view showing a material example of a spin FET.
Figure 27:
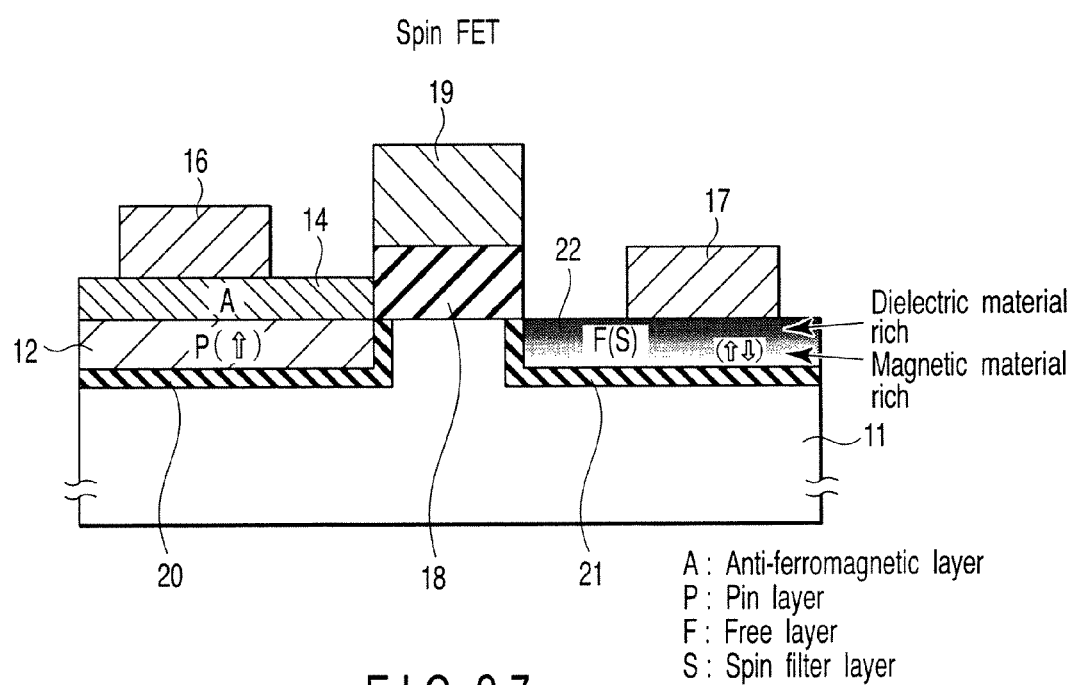
FIG. 27 is a sectional view showing a material example of a spin FET.

The spin FET shown in FIGS. 26 and 27 is equivalent to the sixth basic structure shown in FIG. 6, and is provided as an example in which a multiferroric layer 22 serving as a magnetic free layer is composed of a nano-structure ferromagnetic ferroelectric material.

In the spin FET shown in FIG. 26, the magnetization direction of the residual magnetization of the multiferroric layer 22 (indicated by the whitened arrow) is oriented in a horizontal direction (in-planar direction) with respect to a surface of the semiconductor substrate 11, and in the spin FET shown in FIG. 27, the magnetization direction of the residual magnetization of the multiferroric layer 22 (indicated by the whitened arrow) is oriented in a vertical direction with respect to the surface of the semiconductor substrate 11.

A nano-structure ferromagnetic ferroelectric material continuously changes in rate of ferromagnetic material and rate of ferroelectric material in a thickness direction (vertical direction with respect to the surface of the semiconductor substrate 11).

In the present example, the size of the read current is primarily affected by the magnetization direction of a magnetic material rich region.

When the multiferroric layer 22 is composed of such a nano-structure ferromagnetic ferroelectric material, the magnetic material rich region in the multiferroric layer 22 and a dielectric material rich region are physically continuous, thus decreasing the distortion in orientation of electronic spins in the multiferroric layer 22.

Figure 28:
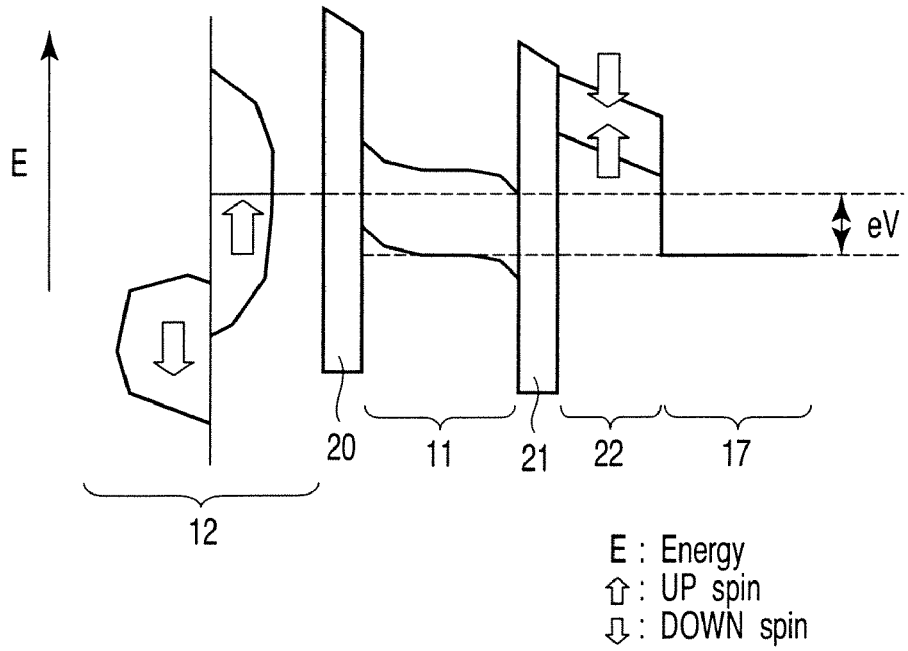
FIG. 28 is an energy band chart of the spin FET shown in FIGS. 26 and 27.

FIG. 28 shows an energy band chart of a spin FET shown in each of FIGS. 26 and 27.

Figure 29:
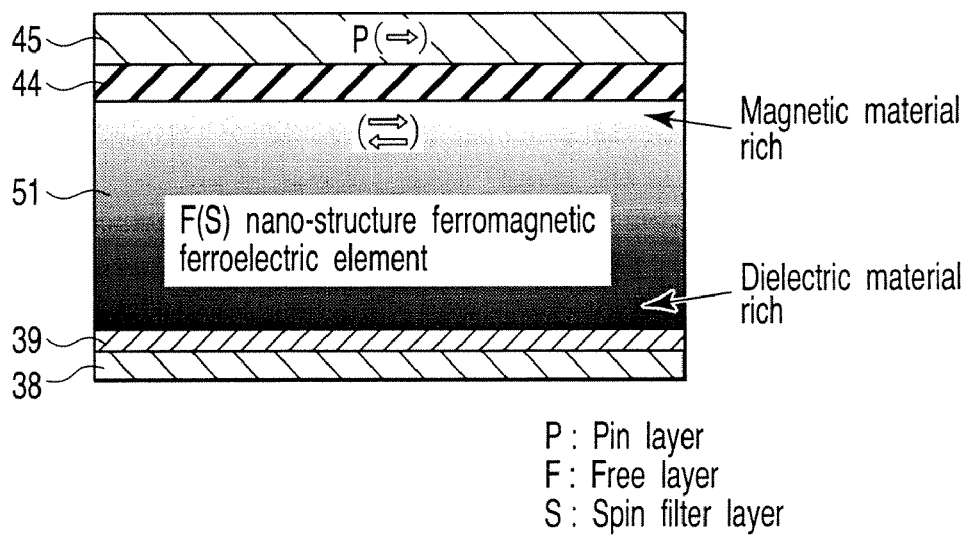
FIG. 29 is a sectional view showing a material example of memory cells of a spin memory.
Figure 30:
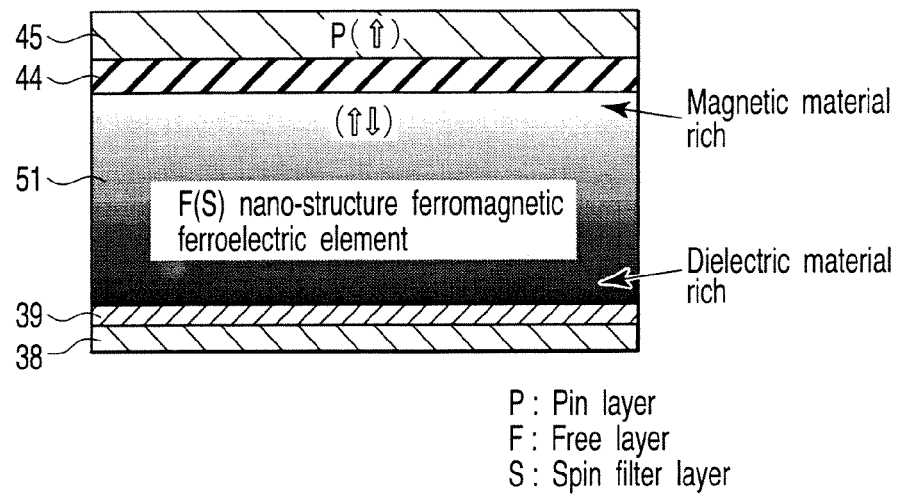
FIG. 30 is a sectional view showing a material example of memory cells of a spin memory.

The memory cells of the spin memory shown in each of FIGS. 29 and 30 are equivalent to the fourth basic structure shown in FIG. 20, and are provided an example in which a multiferroric layer 51 serving as a magnetic free layer is composed of a nano-structure ferromagnetic ferroelectric material.

In the memory cells of the spin memory shown in FIG. 29, the magnetization direction of the residual magnetization of the multiferroric layer 51 (indicated by the whitened arrow) is oriented in a horizontal direction (in-planar direction) with respect to the surface of the semiconductor substrate 11, and, in the memory cells of the spin memory shown in FIG. 30, the magnetization direction of the residual magnetization of the multiferroric layer 51 (indicated by the whitened arrow) is oriented in a vertical direction with respect to the surface of the semiconductor substrate 11.

A nano-structure ferromagnetic ferroelectric material continuously changes in rate of ferromagnetic material and rate of ferroelectric material in a thickness direction (vertical direction with respect to the surface of the semiconductor substrate 11).

In the present example, the size of the read current is primarily affected by the magnetization direction of a magnetic material rich region.

When the multiferroric layer 51 is composed of such a nano-structure ferromagnetic ferroelectric material, the magnetic material rich region in the multiferroric layer 51 and a dielectric material rich region are physically continuous, thus decreasing the distortion in orientation of electronic spins in the multiferroric layer 51.

Figure 31:
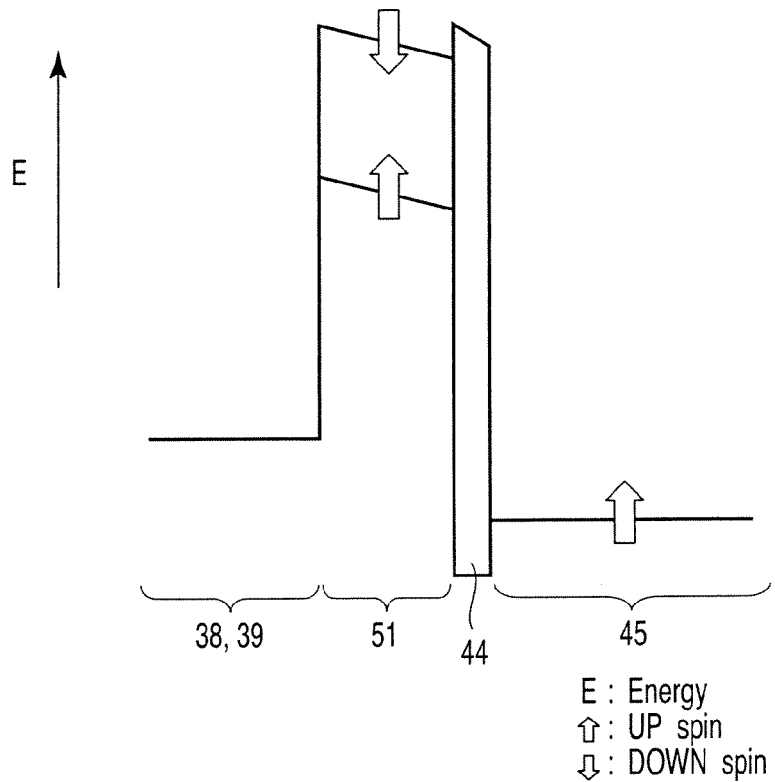
FIG. 31 is an energy band chart of memory cells of the spin memory shown in FIGS. 29 and 30.

FIG. 31 shows an energy band chart of the spin memory shown in FIGS. 29 and 30.

Figure 32:
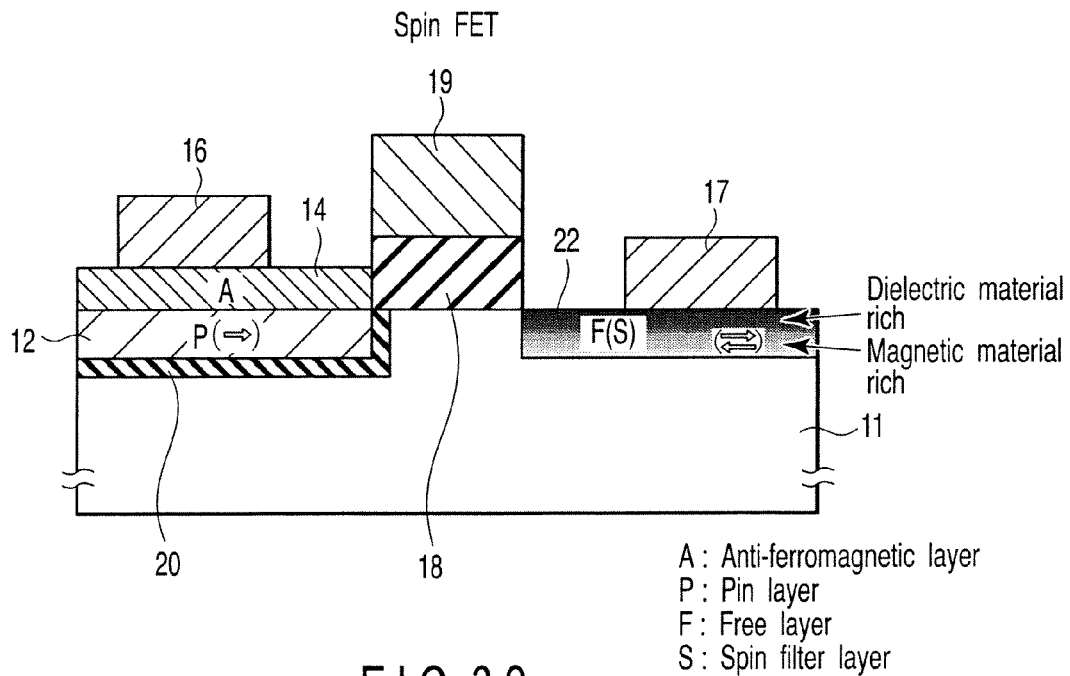
FIG. 32 is a sectional view showing a material example of a spin FET.
Figure 33:
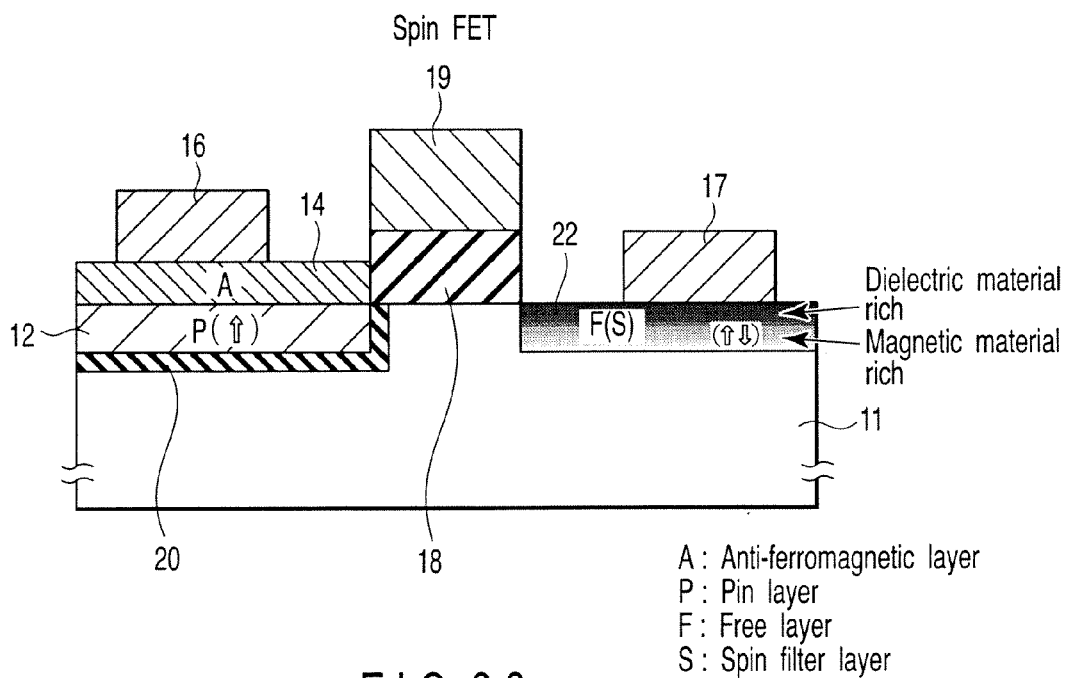
FIG. 33 is a sectional view showing a material example of a spin FET.

FIGS. 32 and 33 each show a first example of an optimal structure when the multiferroric layer 22 is composed of a nano-structure ferromagnetic ferroelectric material.

In comparison with the structures shown in each of FIGS. 26 and 27, this structure is featured in that the multiferroric layer 22 comes into direct contact with the semiconductor substrate 11, and a tunnel barrier layer does not exist between the semiconductor substrate 11 and the multiferroric layer 22.

According to such a structure, the distortion in orientation of electronic spins in the multiferroric layer 22 can be decreased, and the ON resistance of the spin FET at the time of read can be reduced.

Figure 34:
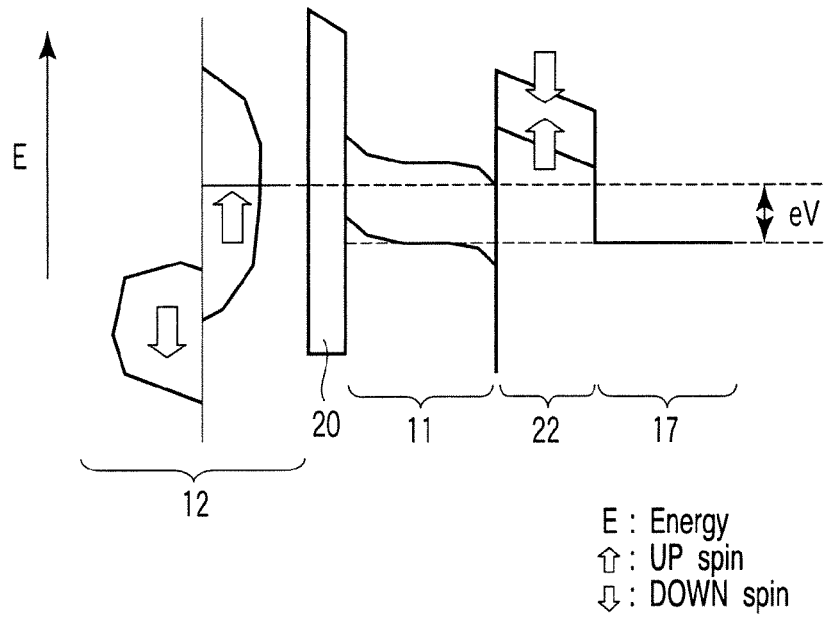
FIG. 34 is an energy band chart of the spin FET shown in FIGS. 32 and 33.

FIG. 34 shows an energy band chart of the spin FET shown in FIGS. 32 and 33.

Figure 35:
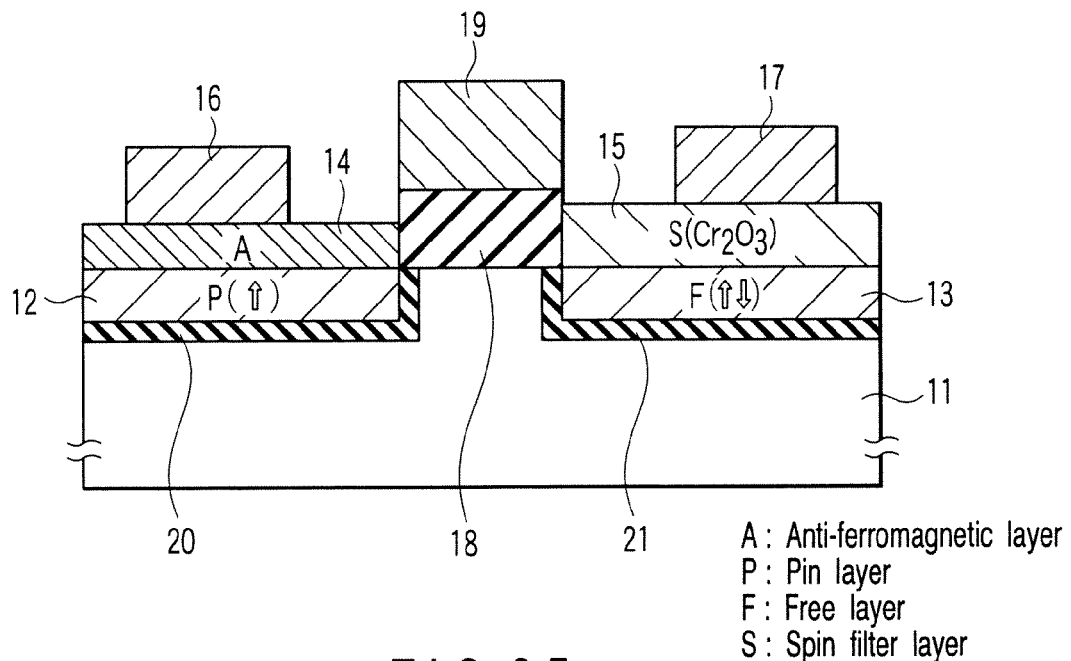
FIG. 35 is a sectional view showing a material example of a spin FET.
Figure 36:
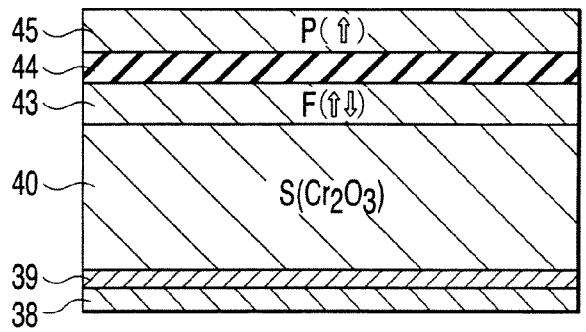
FIG. 36 is a sectional view showing a material example of memory cells of a spin memory.

FIGS. 35 and 36 each show a second example of an optimal structure when the multiferroric layers 15 and 40 are composed of a ferrimagnetic ferroelectric material or an antiferromagnetic ferroelectric material.

In comparison with the structures shown in each of FIGS. 22 and 23, this structure is featured in that magnetization direction of the residual magnetization of ferromagnetic layers 12, 13, 43, and 45 is oriented in a thickness direction (vertical direction with respect to the surface of the semiconductor substrate 11), and the multiferroric layers 15 and 40 are composed of $Cr_2O_3$.

According to such a structure, physical connection between the ferromagnetic layers 13 and 43 and the multiferroric layers 15 and 40 becomes continuous, and the magnetic interaction produced therebetween becomes uniform, thus decreasing distortion in orientation of an electronic spin.

Figure 37:
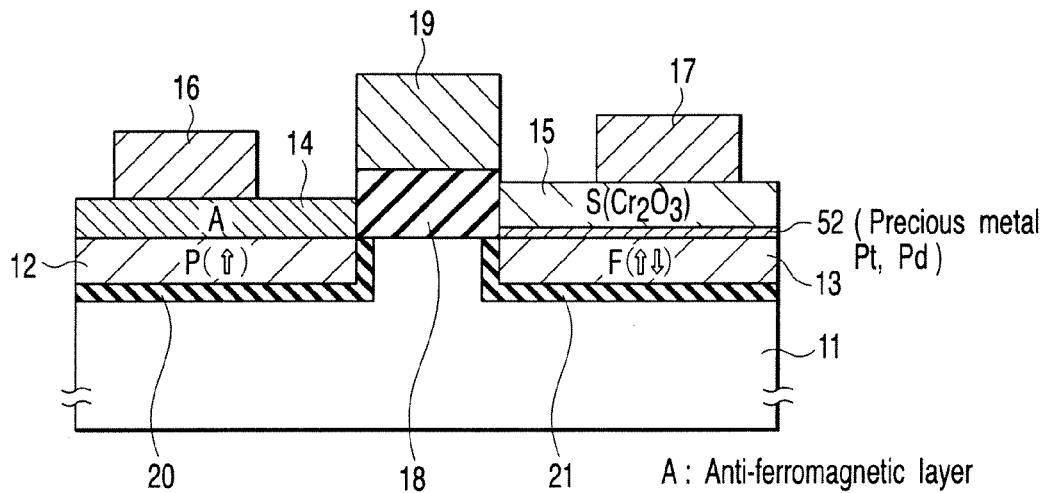
FIG. 37 is a sectional view showing a material example of a spin FET.
Figure 38:
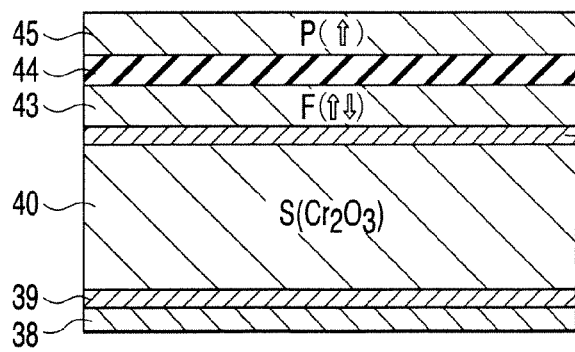
FIG. 38 is a sectional view showing a material example of memory cells of a spin memory.

As shown in FIGS. 37 and 38, even if a precious metal layer (for example, Ru or Rh) 52 is provided between the ferromagnetic layers 13 and 43 and the multiferroric layers 15 and 40, a similar advantageous effect can be attained.

FIGS. 39 and 40 each show a third example of an optimal structure when the multiferroric layers 15 and 40 are composed of a ferrimagnetic ferroelectric material or an antiferromagnetic ferroelectric material.

In comparison with the structure shown in each of FIGS. 22 and 23, this structure is featured in that the ferromagnetic layers 12, 13, and 45 each are composed of a laminate of CoFeB/CoPt/Pt; the ferromagnetic layer 43 is composed of a laminate of CoPt/CoFeB; and the magnetization direction of the residual magnetization is oriented in a thickness direction (vertical direction with respect to the surface of the semiconductor substrate 11), and further in that the multiferroric layers 15 and 40 each are composed of $Cr_2O_3$.

With respect to the ferromagnetic layers 12, 13, 43, and 45, CoFeB is made adjacent to the tunnel barrier layers 20, 21, and 44 in order to increase an MR ratio (magneto-resistive ratio) of the magnetic recording unit.

A layer made adjacent to the tunnel barrier layers 20, 21, and 44 can use CoFe, CoFeBNi, NiFe (Fe rich), for example, instead of CoFeB, for example.

Among the ferromagnetic layers 12, 13, 43, and 45, a material having strong vertical magnetic anisotropy, for example, CoPt is used for a region that is not adjacent to the tunnel barrier layers 20, 21, and 44.

According to such a structure, a spin FET having a large MR ratio can be achieved.

As in examples shown in FIGS. 24 and 25, even if a precious metal layer (for example, Ru or Rh) is provided between the ferromagnetic layers 13 and 43 and the multiferroric layers 15 and 40, a similar advantageous effect can be attained.

In the meantime, among the examples described above, in the case where the magnetization direction of the residual magnetization is oriented in a vertical direction with respect to a surface of a semiconductor substrate, it is preferable that a primary material configuring the multiferroric layers 15, 22, 40, and 51 should be one of $Cr_2O_3$, $Bi_2FeCrO_6$, $BiFeO_3$ and $Bi_{1-x}Ba_xFe_3O_4$.

In this case, it is preferable that the ferromagnetic layers 12, 13, 43, and 45 serving as a magnetic free layer and a magnetic pinned layer should be composed of CoFe having a large magneto-resistive change rate and CoPt (or Co/Pt) having vertical magnetic anisotropy. In addition, the ferromagnetic layers 12, 13, 43, and 45 each may be composed of an alloy made of TbFeCo, FgFeCo and the like.

In addition, a magnetic free layer may be provided as a two-layered structure made of a soft magnetic layer/a ferromagnetic layer; a three-layered structure made of a ferromagnetic layer/a soft magnetic layer/a ferromagnetic layer; a three-layered structure made of a ferromagnetic layer/a nonmagnetic layer/a ferromagnetic layer; and further, a five-layered structure made of a ferromagnetic layer/a nonmagnetic layer/a ferromagnetic layer/a nonmagnetic layer/a ferromagnetic layer.

In the case where the size (planar size) of a magnetic free layer is downsized to be equal to or smaller than sub-microns, the strength, type, or thickness of the magnetic interaction of the ferromagnetic layers 13 and 43 configuring the magnetic free layer is controlled, preventing an increase of power consumption at the time of magnetization reversal.

The nonmagnetic materials include: Ag (silver), Cu (copper), Au (gold), Al (aluminum), Ru (ruthenium), Os (osmium), Re (rhenium), Si (silicon), Bi (bismuth), Ta (tantalum), B (boron), C (carbon), Pd (palladium), Pt (platinum), Zr (zirconium), Ir (iridium), W (tungsten), Mo (molybdenum), Nb (niobium), or an alloy thereof.

With respect to the ferromagnetic layers 12, 13, 43, and 45, nonmagnetic materials such as Ag (silver), Cu (copper), Al (aluminum), Au (gold), Al (aluminum), Ru (ruthenium), Os (osmium), Re (rhenium), Mg (magnesium), Si (sikicon), Bi (bismuth), Ta (tantalum), B (boron), C (carbon), O (oxygen), N (nitrogen), Pd (palladium), Pt (platinum), Zr (zirconium), Ir (iridium), W (tungsten), Mo (molybdenum), and Nb (niobium) are added into these layers, whereby physical properties such as magnetic property, crystalline property, mechanical property, and chemical property may be adjusted.

With respect to the ferromagnetic layers 12, 13, 43, and 45, it is not necessary to produce ultra-regular magnetic property, and the thickness is equal to or greater than 0.4 nm for that purpose.

With respect to the tunnel barrier layers 20, 21, and 44, it is preferable that oxide or nitride of one material should be selected from the group of Si, Ge, Al, Ga, Mg, and Ti, and the thickness thereof should be set at a value ranging from 0.1 nm to 100 nm.

In particular, in the case where MgO is used as tunnel barrier layers 20, 21, and 44, when CoFeB is used as the ferromagnetic layers 12, 13, 43, and 45, a large magneto-resistive change rate can be obtained.

With respect to the ferromagnetic layers 12 and 45 serving as the magnetic pinned layer, there is used a three-layered structure made of: Co (Co—Fe)/Ru (rhutenium)/Co (Co—Fe); Co (Co—Fe)/Ir (iridium)/Co (Co—Fe); Co (Co—Fe)/Os (osmium)/Co (Co—Fe); Co (Co—Fe)/Re (rhenium)/Co (Co—Fe); an amorphous material such as Co—Fe—B/Ru (rhutenium)/an amorphous material such as Co—Fe—B; an amorphous material such as Co—Fe—B/Ir (iridium)/an amorphous material such as Co—Fe—B; an amorphous material such as Co—Fe—B/Os (osmium)/an amorphous material such as Co—Fe—B; and an amorphous material such as Co—Fe—B/Re (rhenium)/an amorphous material such as Co—Fe—B.

In this case, it is preferable to add the ferromagnetic layer 14 for fixedly depositing its magnetization direction to the magnetic pinned layer. As the ferromagnetic layer 14, there is selectively used one or more of the materials made of Fe (iron)-Mn (manganese), Pt (platinum)-Mn (manganese), pt (platinum)-Cr (chromium)-Mn (manganese), Ni (nickel)-Mn (manganese), Ir (iridium)-Mn (manganese), NiO (nickel oxide), and $Fe_2O_3$ (iron oxide).

If a material is selected in such a combination, a magnetic field from a bit line or a word line hardly affects magnetization of a magnetic pinned layer so that magnetization of the magnetic pinned layer is fixedly deposited. In addition, a stray field from the magnetic pinned layer can be reduced (or adjusted). Thus, a condition for magnetization reversal of a magnetic free layer (magnetic recording layer) can be adjusted by the thickness of the ferromagnetic layers 12 and 45 configuring the magnetic pinned layer.

With respect to the spin FET, a stacked gate structure of allocating a floating gate between a gate insulation layer 18 and a gate electrode 19 may be provided. In addition, a reconfigurable logic circuit can be configured in combination with the spin FET and a general CMOS circuit (N-channel MOS transistor and P-channel MOS transistor).

With respect to the semiconductor substrate 11, there can be used an intrinsic semiconductor made of Si, Ge and the like or a compound semiconductor made of GaAs, ZnSe and the like.

4. Manufacturing Method

Now, a description will be given with respect to some examples of manufacturing methods according to examples of the present invention.

With respect to the memory cells of a spin memory, layers are patterned by merely laminating them. Now, a method for manufacturing the spin FET will be described here.

FIGS. 41 to 46 each show a first example of the method for manufacturing the spin FET according to examples of the present invention.

First, as shown in FIG. 41, an element separation layer 24 having an STI structure is formed in a semiconductor substrate (for example, silicon substrate) 11 by utilizing a method such as a CVD (chemical vapor deposition), PEP (photo engraving process), RIE (reactive ion etching) or the like. With respect to the element separation layer 24, a LOCOS structure may be provided instead of the STI structure.

In addition, an insulation layer is formed on the semiconductor substrate 11 in accordance with a thermal oxidization technique, and continuously, an electrically conductive poly-silicon layer including impurities is formed on an insulation layer in accordance with the CVD technique. Then, a resist pattern is formed on an electrically conductive poly-silicon layer.

With this resist matter being a mask, for example, in accordance with the RIE, a gate insulation layer 18 and a gate electrode 19 are formed by etching an electrically conductive poly-silicon layer and an insulation layer. Continuously, when the semiconductor substrate 11 is etched in accordance with the RIE using a fluorine ion, recessed portions are formed, respectively, at the left and right of the gate electrode 19 on the semiconductor substrate 11. Then, the resist pattern is removed.

Then, a tunnel barrier layer 25 covering at least a surface of the recessed portions of the semiconductor substrate 11 is formed in accordance with a sputtering technique.

Next, as shown in FIG. 42, a ferromagnetic material 26 filling the recessed portions of the semiconductor substrate 11 is formed in accordance with a strongly directive sputtering technique.

In addition, as shown in FIG. 43, one of the two recessed portions of the semiconductor substrate 11 is covered with a mask material, and a ferromagnetic material 26 in the recessed portion that is not covered with the mask material is removed. Then, the mask material is removed.

Next, as shown in FIG. 44, a ferromagnetic material (for example, spin filter layer) 27 filling the recessed portions of the semiconductor substrate 11 is formed again in accordance with a strongly directly sputtering technique.

In addition, as shown in FIG. 45, the other one of the two recessed portions of the semiconductor substrate 11 is covered with a mask material, removing the ferromagnetic layer 27 that exists on the ferromagnetic material 26 in the recessed portion that is not covered with the mask material. Then, the mask material is removed.

Next, as shown in FIG. 46, electrodes 16 and 17 are formed on the ferromagnetic layers 26 and 27, respectively, by the sputtering technique, thereby completing a spin FET.

According to the manufacturing method as described above, a tunnel barrier type spin FET in which a source/drain region is composed of a ferromagnetic material can be easily manufactured.

5. Testing Example

Samples are actually produced, and the results obtained by investigating characteristics thereof are shown below.

(1) First Testing Example

A first testing example relates to a spin FET shown in each of FIGS. 4 and 22.

A sample is produced in accordance with the procedures below.

$Si_3N_4$ is formed on a semiconductor substrate in accordance with a CVD technique using a silane gas and an ammonia gas, and then, a photoresist covering an element region is formed in accordance with PEP. In addition, with a photoresist being a mask, for example, $Si_3N_4$ is etched in accordance with an RIE, and then, a mask made of $Si_3N_4$ is formed. In addition, the semiconductor substrate is etched, and then, a groove is formed on the semiconductor substrate. Then, the photoresist is removed.

Then, $SiO_2$ is filled in the groove formed on the semiconductor substrate, and then, an element separation layer having an STI structure is formed.

The mask made of $Si_3N_4$ is removed by means of a phosphorus acid, an oxide on a surface of the semiconductor substrate is removed by means of a fluoric acid, and then, a gate insulation layer made of $SiO_2$ is formed on the semiconductor substrate in accordance with a thermal oxidization technique. Continuously, in accordance with a CVD technique, a poly-silicon layer including electrically conductive impurities is formed on this gate insulation layer.

A resist pattern is formed in accordance with the PEP. With this resist pattern being a mask, the poly-silicon layer and the gate insulation layer are etched in accordance with the RIE. As a result, a gate electrode is formed on the gate insulation layer existing on the semiconductor substrate.

Then, with the resist pattern being a mask, a semiconductor substrate 10 is etched in accordance with the RIE, a recessed portion is formed on the semiconductor substrate, and a resist pattern is removed. Then, a tunnel barrier layer covering at least the recessed portion formed on the semiconductor substrate is formed using a sputtering technique. The tunnel barrier layer is composed of MgO, for example.

Next, a recessed portion serving as a source is covered with a photoresist. A ferromagnetic layer serving as a magnetic free layer and a multiferroric layer whose magnetization direction is changed by an electric field are formed in a recessed portion serving as a drain. The ferromagnetic layer is composed of a laminate of CoFeB (ferromagnetic metal)/Ru, and the multiferroric layer whose magnetization direction is changed by an electric field is composed of $BaTiO_2$—$CoFe_2O_4$ that is a nano-structure ferromagnetic ferroelectric material.

$BaTiO_3$—$CoFe_2F_4$ is formed in accordance with a PLD technique, and, while in deposition, a ratio between $BaTiO_3$ and $CoFe_2O$ is changed.

In the first half of the deposition process, a rate of $BaTiO_3$ (0.35%)-$CoFe_2O_4$ (0.65%) is obtained, and in the latter half thereof, a rate of $BaTiO_3$ (0.65%)-$CoFe_2O_4$ (0.35%) is obtained.

In addition, an electrode is formed on a multiferroric layer whose magnetization direction is changed by an electric field in accordance with a strongly directive sputtering technique, and then, a photoresist is removed.

Next, the recessed portion serving as a drain is covered with the photoresist, and then, a ferromagnetic layer and an anti-ferromagnetic layer serving as magnetic pinned layers are formed in the recessed portion serving as a source. The ferromagnetic layer is composed of CoFe, and the anti-ferromagnetic layer is composed of a laminate of IrMn/Ru.

In addition, an electrode is formed on the anti-ferromagnetic layer in accordance with a strongly directive sputtering technique, and then, a photoresist is removed.

Lastly, an inter-layered insulation layer is formed, a contact hole reaching an electrode is formed in this inter-layered insulation layer. In addition, aluminum wires are formed on the inter-layered insulation layer and the contact hole. Further, annealing is carried out while a magnetic field in a channel length direction (long-axis direction) is applied to the magnetic free layer and the magnetic pinned layer.

With respect to the thus formed sample, when +2.3V (write gate voltage=+2.3V and drain side electrode=0V) is applied between a gate and a drain, it has been verified that the magnetization direction of the magnetic free layer is established in an anti-parallel state with respect to that of the magnetic pinned layer.

In addition, when −2.3V (write gate voltage=0V and drain side electrode=+2.3V) is applied between a gate and a drain, it has been verified that the magnetization direction of the magnetic free layer is established in a parallel state with respect to that of the magnetic pinned layer.

FIG. 47 shows a relationship between a drain current and a source-to-drain voltage (bias) with respect to the sample of the first testing example while a read gate voltage VGATE is defined as a parameter.

According to this relationship, in a region in which a source-to-drain voltage is equal to or smaller than 1V, even if the read gate voltage VGATE is equal thereto, it is found that a drain current is different depending on a magnetization state (parallel/anti-parallel) of the source and drain.

That is, it is possible to obtain an amplification action that, as the read gate voltage VGATE is increased, a difference between a drain current when a parallel state is established and a drain current when an anti-parallel state is established becomes large. Thus, a re-configurable logic circuit can be achieved.

However, the read gate voltage VGATE is set at a value lower than 2.3V in order to prevent erroneous writing into a magnetic recording unit.

(2) Second Testing Example

A second testing example also relates to a spin FET shown in each of FIGS. 4 and 35.

A sample is produced in accordance with a method similar to that according to the first testing example except the following points.

In the present example, a ferromagnetic layer serving as a magnetic free layer is composed of a laminate of CoFeB/CoPt/Pt, and a multiferroric layer whose magnetization direction is changed by an electric field is composed of $Cr_2O_3$ that is a ferromagnetic ferroelectric material. An anti-ferromagnetic layer is composed of PtMn.

With respect to this sample, when +2.1V (write gate voltage=+2.1V and drain side electrode=0V) is applied between a gate and a drain, it has been verified that the magnetization direction of a magnetic free layer is established in an anti-parallel state with respect to that of a magnetic pinned layer.

In addition, when −2.1V (write gate voltage=0V and drain side electrode=+2.1V) is applied between a gate and a drain, it has been verified that the magnetization direction of the magnetic free layer is established in a parallel state with respect to that of the magnetic pinned layer.

FIG. 48 shows a relationship between a drain current and a source-to-drain voltage (bias) with respect to the sample of the second testing example while the read gate voltage VGATE is defined as a parameter.

According to this relationship, in a region in which a source-to-drain voltage is equal to or smaller than 0.5V, even if the read gate voltage VGATE is equal thereto, it is found that a drain current is different depending on a magnetization state (parallel/anti-parallel) of the source and drain.

That is, it is possible to obtain an amplification action that, as the read gate voltage VGATE is increased, a difference between a drain current when a parallel state is established and a drain current when an anti-parallel state is established becomes large. Thus, a re-configurable logic circuit can be achieved.

However, the read gate voltage VGATE is set at a value lower than 2.1 V in order to prevent erroneous writing into a magnetic recording unit.

(3) Third Testing Example

A third testing example relates to a spin memory shown in each of FIGS. 16 and 23.

First, a sample is produced in accordance with the procedures below.

On a semiconductor substrate, an N-channel MOS transistor serving as a selector switch is formed in accordance with a well known technique. In addition, a lower electrode (Ta/Cu/Ta) connected via an intermediate layer is formed at a drain of the N-channel MOS transistor.

Then, a buffer layer made of a laminate of CoFeB/MgO is formed on the lower electrode. Then, in accordance with a PLD technique, on the buffer layer, $BaTiO_3$—$CoFe_2O_4$ that is a nano-structure ferromagnetic ferroelectric material is formed as a multiferroric layer whose magnetization direction is changed by an electric field.

$BaTiO_3$—$CoFe_2O_4$ changes a ratio between $BaTiO_3$ and $CoFe_2O_4$ while in deposition using the PLD technique.

Specifically, in the first half of the deposition process, a rate of $BaTiO_3$ (0.35%)—$CoFe_2O_4$ (0.65%) is obtained, and in the latter half thereof, a rate of $BaTiO_3$ (0.35%)—$CoFe_2O_4$ (0.65%) is obtained.

On the multiferroric layer whose magnetization direction is changed by an electric field, CoFeB is formed as a magnetic free layer, and then, on the magnetic free layer, a laminate made of Mg/MgO is formed as a tunnel barrier layer. In addition, on the tunnel barrier layer, a laminate made of CoFeB/Ru/Co—Fe is formed on a magnetic pinned layer, and then, a laminate made of IrMn/Ru/Ta is formed as an anti-ferromagnetic layer.

A cap layer and a contact layer are formed on the anti-ferromagnetic layer. Then, a pattern of memory cells is formed using a KrF stepper, an RIE, and a milling device.

In addition, an inter-layered insulation layer is formed, this inter-layered insulation layer is flattened, and a top face of the contact layer is exposed. Then, a bit line connected to the contact layer is formed on the inter-layered insulation layer. Further, annealing is carried out while a magnetic field in a channel length direction (long-axis direction) is applied to the magnetic free layer and the magnetic pinned layer.

With respect to the thus formed sample (spin memory), when +1.7V (source line=+1.7V and bit line=0V) is applied between a source line and a bit line, it has been verified that the magnetization direction of the magnetic free layer is established in an anti-parallel state with respect to that of the magnetic pinned layer.

In addition, when −1.7V (source line=0V and bit line=+1.7V) is applied between a source line and a bit line, it has been verified that the magnetization direction of the magnetic free layer is established in a parallel state with respect to that of the magnetic pinned layer.

Figure 49:
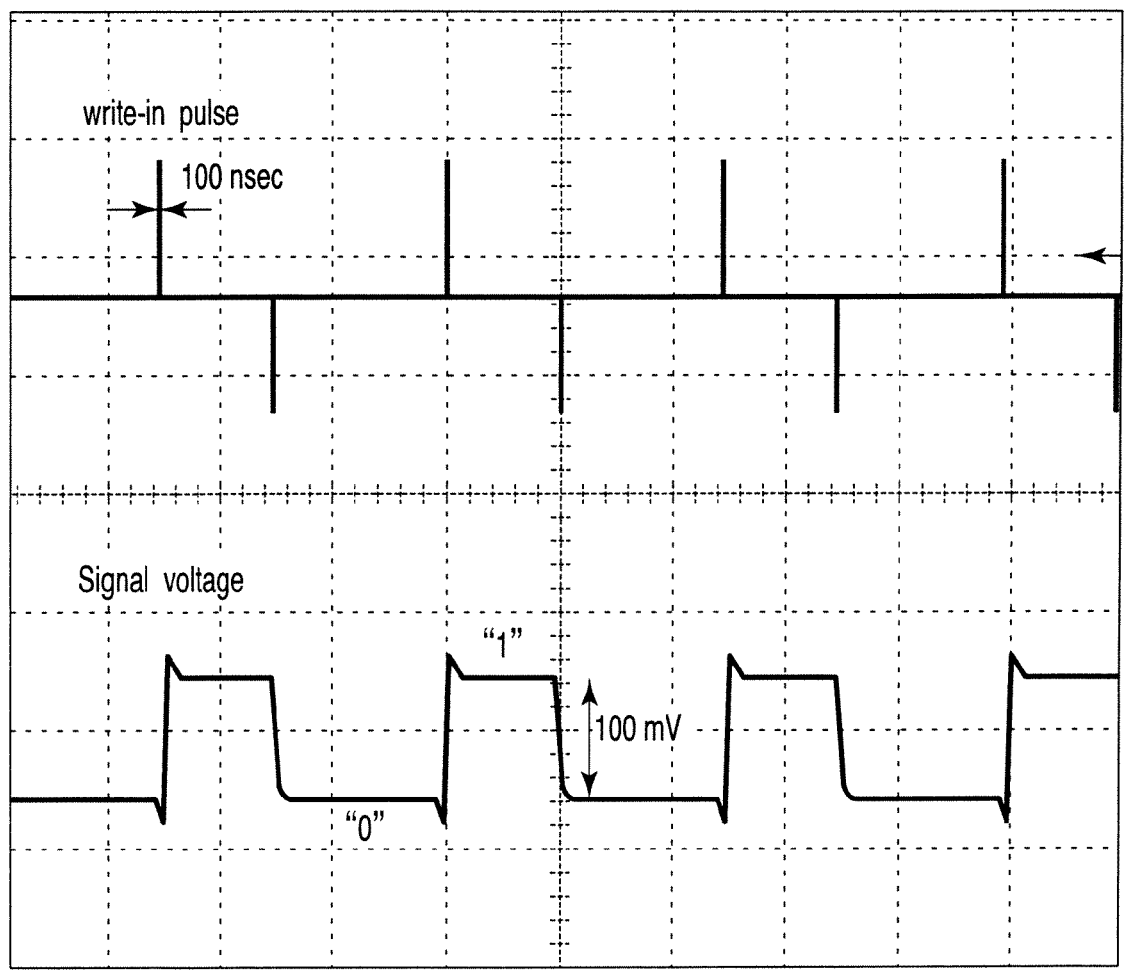
FIG. 49 is a view showing a write/read current waveform.

FIG. 49 shows how a signal voltage is obtained when a read gate voltage 0.2V that is lower than a value of a write pulse is applied to a memory cell after a write-in pulse is applied by ±1.7V and 100 nsec with respect to memory cells of the sample of the third testing example.

According to this figure, it is found that a value of a signal voltage "0" and "1", i.e., memory cell data (parallel/anti-parallel) changes depending on a type of a write pulse. In this manner, a basic operation serving as a spin memory has been verified.

(4) Fourth Testing Example

A fourth testing example relates to a spin memory shown in each of FIGS. 16 and 40.

First, a sample is produced in accordance with procedures below.

On a semiconductor substrate, an N-channel MOS transistor serving as a selector switch is formed in accordance with a well known technique. In addition, a lower electrode (Ta/Cu/Ta) connected via an intermediate layer is formed at a drain of the N-channel MOS transistor.

Then, a buffer layer made of a laminate of CoFeB/MgO is formed on a lower electrode. Then, in accordance with an RF sputtering technique, on the buffer layer, $Cr_2O_3$ that is a ferromagnetic ferroelectric material is formed as a multiferroric layer whose magnetization direction is changed by an electric field.

On the multiferroric layer whose magnetization direction is changed by an electric field, a laminate made of CoPt/CoFeB is formed as a magnetic free layer, and, on the magnetic free layer, a laminate made of Mg/MgO is formed as a tunnel barrier layer. In addition, on the tunnel barrier layer, a laminate made of CFeB/Co—Pt/Pt is formed as a magnetic pinned layer, and then, a laminate made of PtMn/Ru/Ta is formed as an anti-ferromagnetic layer.

A cap layer and a contact layer are formed on the anti-ferromagnetic layer. Then, a pattern of memory cells is formed using a KrF stepper, an RIE, and a milling device.

In addition, an inter-layered insulation layer is formed, this inter-layered insulation layer is flattened, and a top face of the contact layer is exposed. Then, a bit line connected to the contact layer is formed on the inter-layered insulation layer. Further, annealing is carried out while a magnetic field in a channel length direction (long-axis direction) is applied to the magnetic free layer and the magnetic pinned layer.

With respect to the thus formed sample (spin memory), when +1.6V (source line=+1.6V and bit line=0V) is applied between a source line and a bit line, it has been verified that the magnetization direction of the magnetic free layer is established in an anti-parallel state with respect to that of the magnetic pinned layer.

In addition, when −1.6V (source line=0V and bit line=+1.6V) is applied between a source line and a bit line, it has been verified that the magnetization direction of the magnetic free layer is established in a parallel state with respect to that of the magnetic pinned layer.

Figure 50:
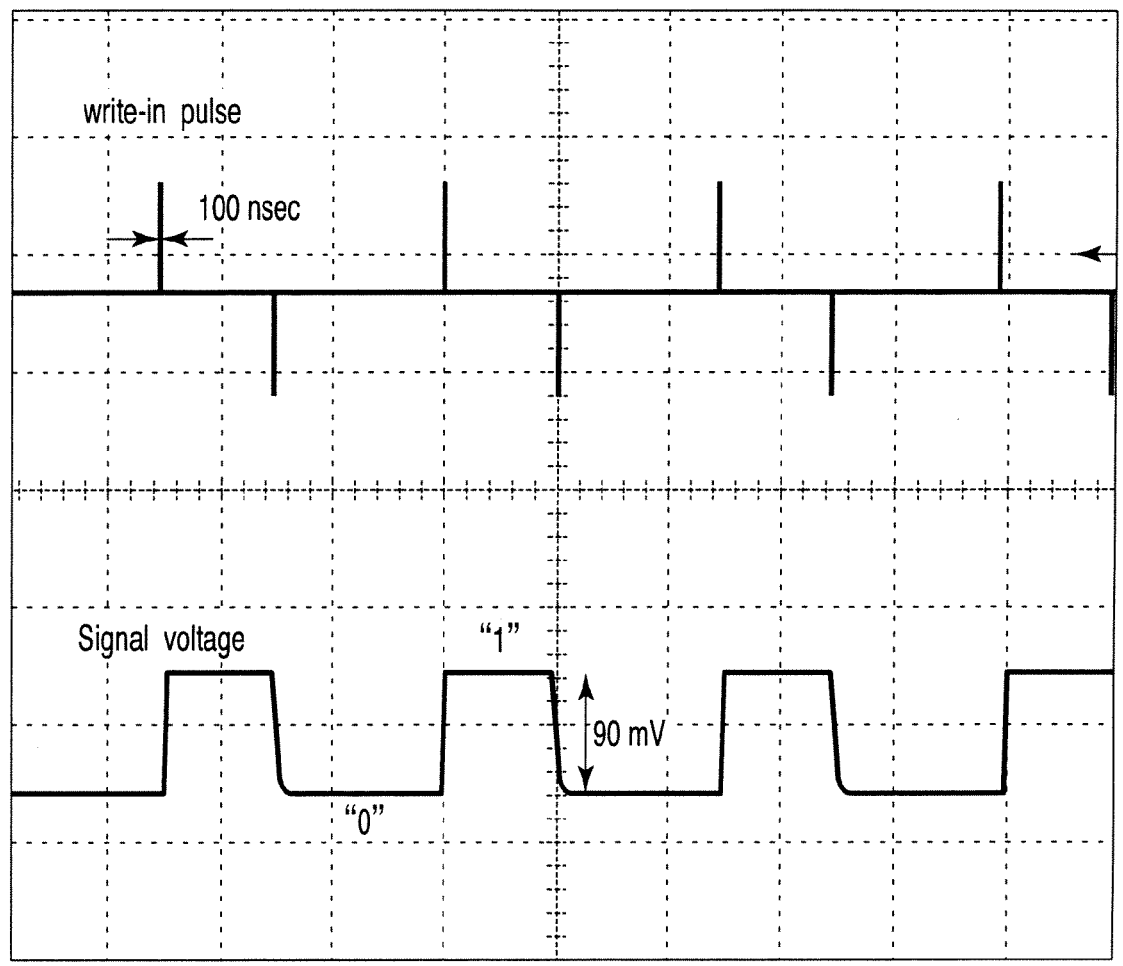
FIG. 50 is a view showing a write/read current waveform.

FIG. 50 shows how a signal voltage is obtained when a read gate voltage 0.2V that is lower than a value of a write pulse is applied to a memory cell after a write-in pulse is applied by ±1.6V and 100 nsec with respect to memory cells of the sample of the fourth testing example.

According to this figure, it is found that a value of a signal voltage "0" and "1", i.e., memory cell data (parallel/anti-parallel) changes depending on a type of a write pulse. In this manner, a basic operation serving as a spin memory has been verified.

(5) Fifth Testing Example

A fifth testing example relates to a spin FET shown in FIG. 33.

A sample is produced in accordance with a method similar to that according to the first testing example except the points below.

In the present example, a ferromagnetic layer serving as a magnetic free layer (multiferroric layer whose magnetization direction is changed by an electric field) is composed of $Cr_2O_3$ that is a ferromagnetic ferroelectric material. In addition, a ferromagnetic layer serving as a magnetic pinned layer is composed of a laminate of CoFeB/CoPt/Pt, and an anti-ferromagnetic layer is composed of a laminate of PtMn/Ru/Ta.

With respect to the thus formed sample, when +2.0V (write gate voltage=+2.0V and drain side electrode=0V) is applied between a gate and a drain, it has been verified that the magnetization direction of the magnetic free layer is established in an anti-parallel state with respect to that of the magnetic pinned layer.

In addition, when −2.0V (write gate voltage=0V and drain side electrode=+2.0V) is applied between a gate and a drain, it has been verified that the magnetization direction of the magnetic free layer is established in a parallel state with respect to that of the magnetic pinned layer.

Figure 51:
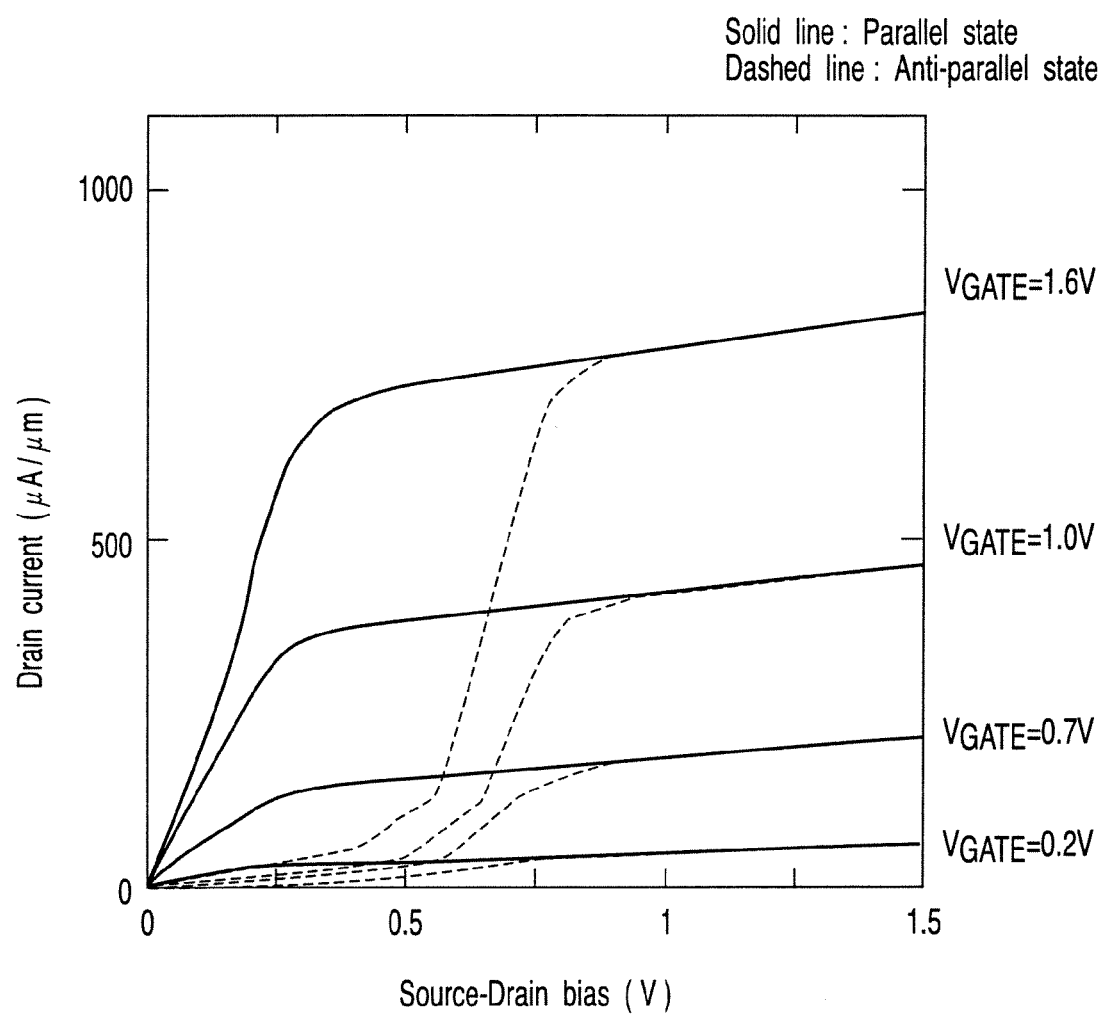
FIG. 51 is a view showing a characteristic of a sample.

FIG. 51 shows a relationship between a drain current and a source-to-drain voltage (bias) with respect to the sample of the fifth testing example while a read gate voltage VGATE is defined as a parameter.

According to this relationship, in a region in which a source-to-drain voltage is equal to or smaller than 0.75V, even if the read gate voltage VGATE is equal thereto, it is found that a drain current is different depending on a magnetization state (parallel/anti-parallel) of the source and drain.

That is, it is possible to obtain an amplification action that, as the read gate voltage VGATE is increased, a difference between a drain current when a parallel state is established and a drain current when an anti-parallel state is established becomes large. Thus, a re-configurable logic circuit can be achieved.

However, the read gate voltage VGATE is set at a value lower than 2.0V in order to prevent erroneous writing into a magnetic recording unit.

(6) Sixth Testing Example

A sixth testing example relates to a spin memory shown in FIG. 30.

A sample is produced in accordance with a method similar to that according to the third testing example except the points below.

In the present example, a ferromagnetic layer serving as a magnetic free layer (multiferroric layer whose magnetization direction is changed by an electric field) is composed of $Cr_2O_3$ that is a ferromagnetic ferroelectric material. In addition, a ferromagnetic layer serving as a magnetic pinned layer is composed of a laminate of CoFeB/CoPt/Pt, and an anti-ferromagnetic layer is composed of a laminate of PtMn/Ru/Ta.

With respect to the thus formed sample (spin memory), when +1.5V (source line=+1.5V and bit line=0V) is applied between a source line and a bit line, it has been verified that the magnetization direction of the magnetic free layer is established in an anti-parallel state with respect to that of the magnetic pinned layer.

In addition, when −1.5V (source line=0V and bit line +1.5V) is applied between a source line and a bit line, it has been verified that the magnetization direction of the magnetic free layer is established in a parallel state with respect to that of the magnetic pinned layer.

With respect to the memory cell of the sample according to the sixth testing example, it has been verified how a signal voltage is obtained when a read gate voltage 0.2V that is lower than a value of a write pulse is applied to the memory cell after a write-in pulse has been applied by ±1.5V and 100 nsec.

As a result, as in the third and fourth testing examples, a value of a signal voltage "0" or "1", i.e., memory cell data (parallel/anti-parallel) has changed according to a type of write pulse. In this manner, a basic operation of the spin memory has been verified according to the present testing example.

6. Application Examples

Now, a description will be given with respect to application examples of a spin FET and a spin memory according to examples of the present invention.

Here, a description will be given with respect to each of: a case in which the spin FET according to examples of the present invention is applied to a re-configurable logic circuit; a case in which the spin FET is applied to a semiconductor memory; and a case in which the spin FET is mounted on a chip, thereby configuring a system.

Further, in the case where the spin FET according to examples of the present invention is mounted on a chip, thereby configuring a system, a combination with the spin memory according to examples of the present invention is also mentioned.

(1) Case of Application to Re-Configurable Logic Circuit

A re-configurable logic circuit denotes a circuit capable of selectively achieving one of a plurality of logics by a single logic circuit based on program data.

The program data used here denotes data stored in a non-volatile memory such as FeRAM or MRAM in the same chip or different chip or control data.

In a conventional logic circuit, a type of logic (such as AND, NAND, OR, NOR, or Ex-OR) is determined by a connection relationship between a plurality of MIS transistors. Thus, if the logic is changed, the connection relationship between the MIS transistors must be changed by making redesign.

Thus, it is desired to achieve a re-configurable logic circuit capable of selectively achieving one of a plurality of logics by a single logic circuit.

It becomes possible to achieve a re-configurable logic circuit by using a spin FET according to examples of the present invention.

In actuality, in the case where a re-configurable logic circuit is configured using a spin FET, when AND and OR can be achieved, other logics can be achieved by using a combination of AND and OR. Hereinafter, a description will be given with respect to examples of a re-configurable logic circuit capable of selectively achieving AND and OR.

A. First Example

Figure 52:
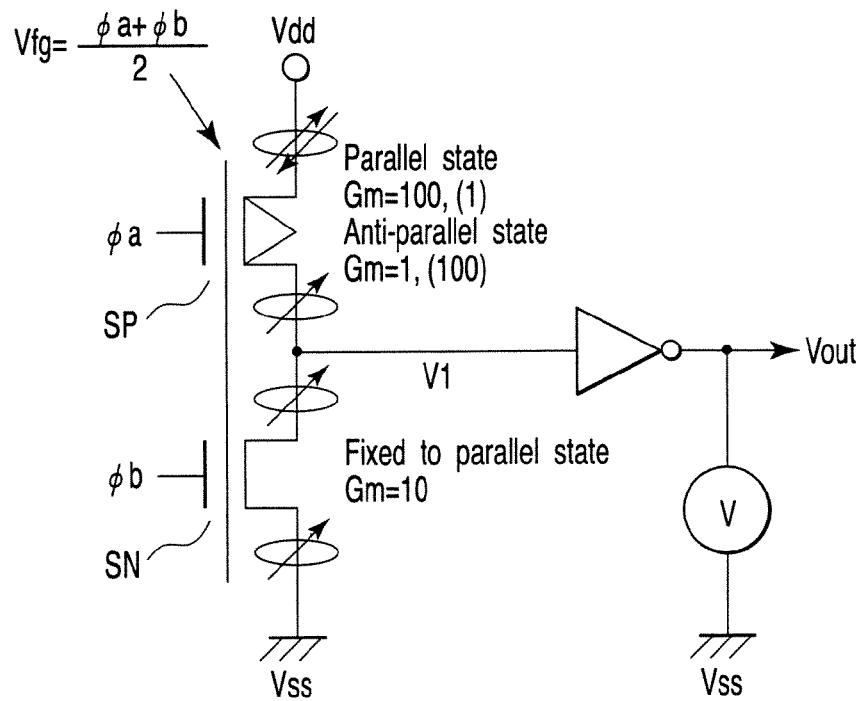
FIG. 52 is a circuit diagram showing a first example of a re-configurable logic circuit.

FIG. 52 shows a first example of a re-configurable logic circuit.

In the present example, a spin FET according to examples of the present invention is connected in series between power supply terminals Vdd and Vss.

A spin FET SP is a P-channel type, and an input signal φa is inputted to a gate. With respect to the spin FET SP, the magnetization state (parallel/anti-parallel) of a magnetic recording unit can be rewritten.

With respect to a conductance Gm of the spin FET SP, a material, a size and the like are determined so that a ratio between a value obtained when the parallel state is established and a value obtained when the anti-parallel state is established is "100:1", for example.

A ratio between the conductance Gm when the parallel state is established and the conductance Gm when the anti-parallel state is established may have a relationship reversed from the above-described one, i.e., "1:100".

A spin FET SN is of an N-channel type, and an input signal φb is inputted to a gate. With respect to the spin FET SN, the magnetization state of the magnetic recording unit is fixed, i.e., is fixed to the parallel state in the present example. The conductance Gm of the spin FET SN is set to "10" in the case where a ratio of the conductance Gm of the spin FET SP has the above-described relationship.

With respect to the spin FETs SP and SN, for example, a common floating gate can be provided. In this case, (φa+φb)/2 can be generated as a voltage Vfg of the floating gate. Thus, doing this is preferable when configuring a stable logic.

A signal V1 of a connection point between the spin FETs SP and SN is obtained as an output signal Vout via an inverter.

In a re-configurable logic circuit shown in FIG. 52, when the magnetization state of the magnetic recording unit of the spin FET SP is made parallel or anti-parallel, and then, its conductance Gm is set to "100" (in the case where the conductance Gm of the spin FET SN is set to "10"), the output signal Vout is obtained as AND (Y=A·B) of input signals A and B, as shown in Table 1.

TABLE 1

| SP: Parallel state (anti-parallel state) |
| Gm = 100 → AND gate Y = A · B |

| A | B | Vfg | SP | SN | V1 | Y(=Vout) |
|---|---|-----|----|----|----|----------|
| 0 | 0 | 0   | On | Off | 1 | 0 |
| 0 | 1 | ½   | On | On | 1 | 0 |
| 1 | 0 | ½   | On | On | 1 | 0 |
| 1 | 1 | 1   | Off | On | 0 | 1 |

However, in table 1, a logic value "1" is equivalent to "H (high)" and a logic value "0" is equivalent to "L (low)". A logic value "½" denotes an intermediate voltage of "H" and "L".

That is, when both of the input signals φa and φb are set to "1", the voltage Vfg of a common floating gate is set to "1". At this time, the spin FET SP is turned OFF, and the spin FET SN is turned ON. Thus, V1 is set to "0", and the output signal Vout is set to "1".

In addition, when both of the input signals φa and φb are set to "0", the voltage Vfg of the common floating gate is set to "0". At this time, the spin PET SP is turned ON, and the spin FET SN is turned OFF. Thus, V1 is set to "1", and the output signal Vout is set to "0".

Further, when one of the input signals φa and φb are set to "1" and the other one is set to "0", the voltage Vfg of the common floating gate is set to "½". At this time, both of the spin FETs SP and SN are turned ON.

However, the conductance Gm of the spin FET SP is set to "100", and the conductance Gm of the spin FET SN is set to "10". Thus, at this time, a ratio of a current flowing in the spin FETs SP and SN is set to "100:10"="10:1".

Therefore, a capability of pulling V1 up to Vdd (="1") supersedes a capability of pulling V1 down to Vss (="0"), V1 is set to "1", and the output signal Vout is set to "0".

In addition, in the re-configurable logic circuit shown in FIG. 52, when the magnetization state of the magnetic recording unit of the spin FET SP is made parallel or anti-parallel, and then, its conductance Gm is set to "1" (in the case where the conductance Gm of the spin FET SN is set to "10"), the output signal Vout is obtained as OR (Y=A+B) of input signals φa and φb, as shown in Table 2.

TABLE 2

| SP: Anti-parallel state (parallel state) |
| Gm = 1 → OR gate Y = A + B |

| A | B | Vfg | SP | SN | V1 | Y(=Vout) |
|---|---|-----|----|----|----|----------|
| 0 | 0 | 0   | On | Off | 1 | 0 |
| 0 | 1 | ½   | On | On | 0 | 1 |
| 1 | 0 | ½   | On | On | 0 | 1 |
| 1 | 1 | 1   | Off | On | 0 | 1 |

However, in Table 2, a logic value "1" is equivalent to "H (high)" and a logic value "0" is equivalent to "L (low)". A logic value "½" denotes an intermediate voltage of "H" and "L".

That is, when both of the input signals φa and φb are set to "1", the voltage Vfg of a common floating gate is set to "1". At this time, the spin FET SP is turned OFF, and the spin FET SN is turned ON. Thus, V1 is set to "0", and the output signal Vout is set to In addition, when both of the input signals φa and φb are set to "0", the voltage Vfg of the common floating gate is set to "0". At this time, the spin PET SP is turned ON, and the spin FET SN is turned OFF. Thus, V1 is set to "1", and the output signal Vout is set to "0".

Further, when one of the input signals φa and φb is set to "1" and the other one is set to "0", the voltage Vfg of the common floating gate is set to "½". At this time, both of the spin FETs SP and SN are turned ON.

However, the conductance Gm of the spin FET SP is set to "1", and the conductance Gm of the spin FET SN is set to "10". Thus, at this time, a ratio of a current flowing in the spin FETs SP and SN is set to "1:10".

Therefore, a capability of pulling V1 down to Vss (="0") supersedes a capability of pulling V1 up to Vdd (="1"), V1 is set to "0", and the output signal Vout is set to "1".

As has described above, according to a re-configurable logic circuit to which a spin FET according to examples of the present invention has been applied, for example, the spin FET SP state (parallel/anti-parallel) is rewritten based on program data, and then, its conductance Gm is changed, whereby one of a plurality of logics can be selectively achieved by a single logic circuit without making redesign.

In the re-configurable logic circuit according to the present example, the N-channel type spin FET SN is fixed to the parallel state, and its conductance Gm is fixed to "10".

Figure 53:
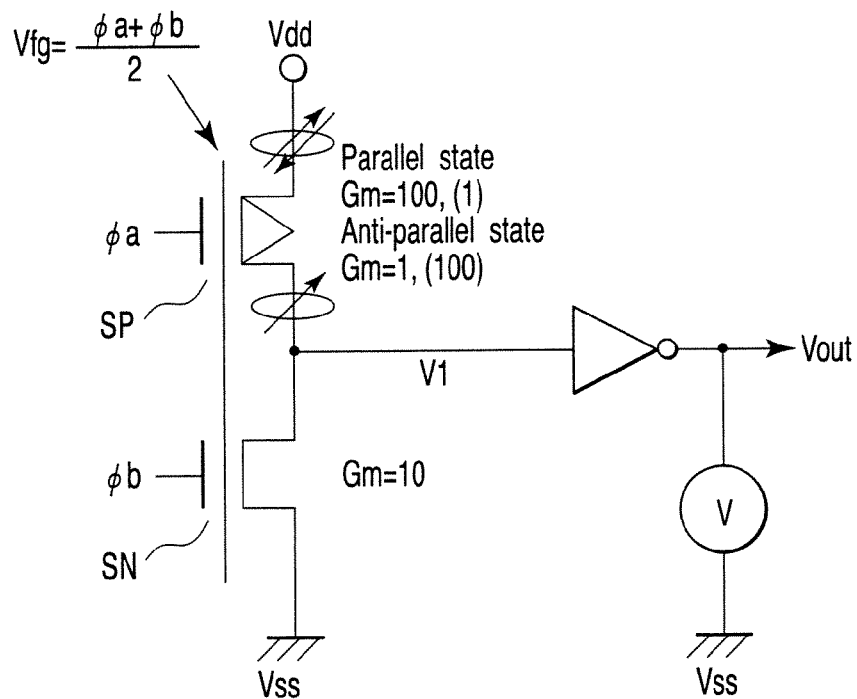
FIG. 53 is a circuit diagram showing a first example of a re-configurable logic circuit.

Here, with respect to the spin FET SN, its conductance Gm may be fixed to "10". Thus, for example, as shown in FIG. 53, a general N-channel MIS transistor SN may be used. Further, as shown in FIG. 54, an N-channel type spin FET SN in the anti-parallel state may be used.

Figure 54:
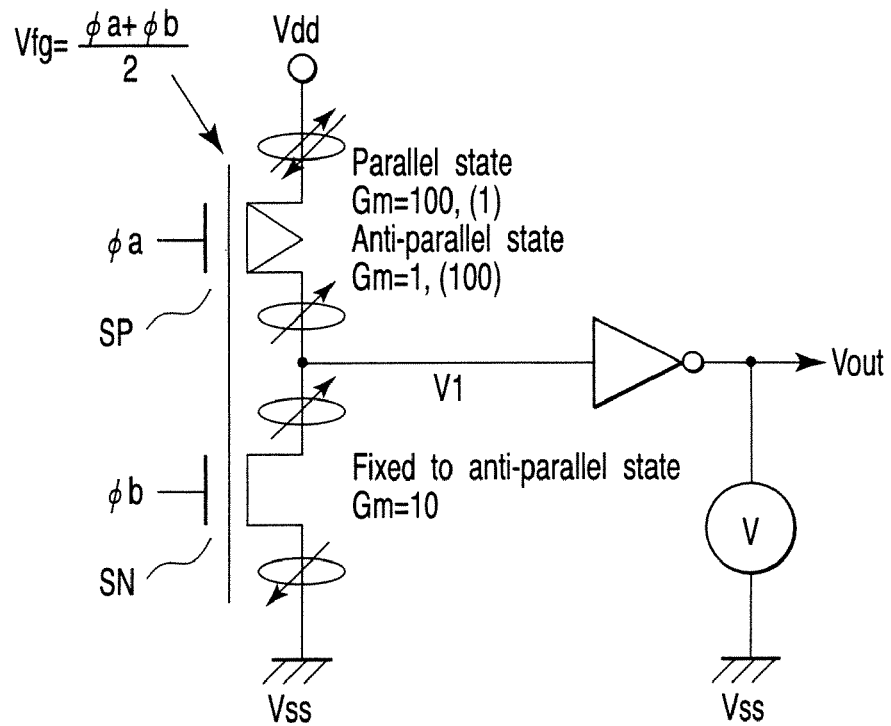
FIG. 54 is a circuit diagram showing a first example of a re-configurable logic circuit.
Figure 55:
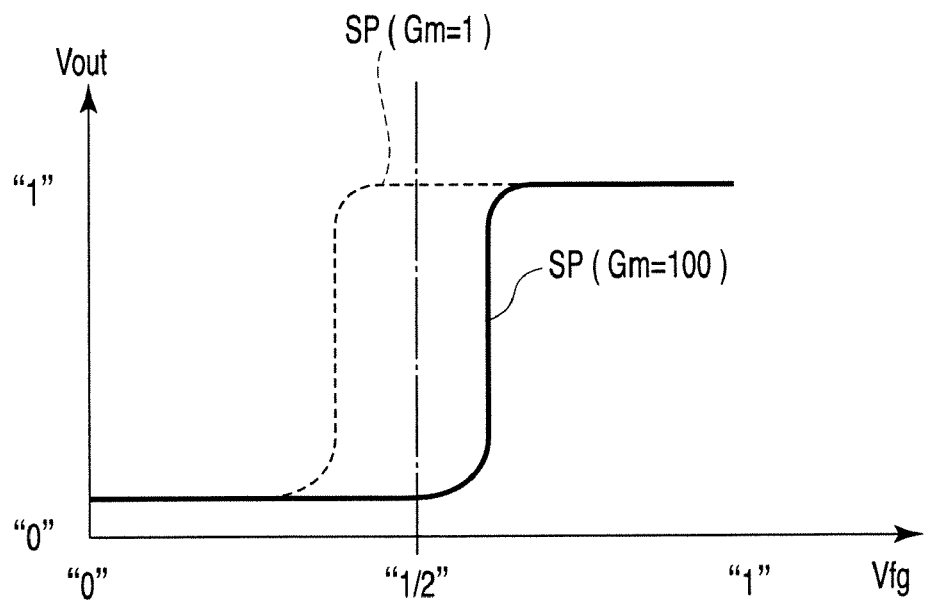
FIG. 55 is a view showing a relationship between a floating gate voltage Vfg and an output signal Vout.

FIG. 55 shows a relationship between a voltage Vfg and an output voltage Vout of a common floating gate in a re-configurable logic circuit shown in each of FIGS. 52 to 54.

This logic circuit is featured in that, when the voltage Vfg of the common floating gate is set to "½", an output voltage Vout changes according to the spin FET SP state (parallel/anti-parallel).

Now, a description will be given with respect to an example of a device structure of the re-configurable logic circuit shown in each of FIGS. 52 to 54.

FIG. 56 is a plan view showing a device structure of the re-configurable logic circuit shown in each of FIGS. 52 to 54; and FIG. 57 is a sectional view taken along the line LVII-LVII shown in FIG. 56.

This device is primarily featured in that floating gates FGs of the spin FETs SP and SN are electrically connected to each other, and is secondarily featured in that drains of the spin FETs SP and SN are composed of a ferromagnetic material 65a.

An element separation layer 62 having an STI structure, for example, is formed in a semiconductor substrate 61. In addition, an N-type well region 63a and a P-type well region 63b are formed in an element region surrounded by the element separation layer 62.

A ferromagnetic material 65a serving as a magnetic pinned layer whose magnetization direction is to be fixed is formed in a recessed portion provided at a boundary between the N-type well region 63a and the P-type well region 63b. The ferromagnetic material 65a is provided as a drain of each of the spin FETs SP and SN.

An anti-ferromagnetic material 67 is formed on the ferromagnetic material 65a. A tunnel barrier layer 64a is formed between the semiconductor substrate 61 and the ferromagnetic material 65a.

A ferromagnetic ferroelectric material (spin filter layer) 66 serving as a magnetic free layer whose magnetization direction changes is formed in a recessed portion provided in the N-type well region 63a. The ferromagnetic ferroelectric material 66 is provided as a source of the spin FET SP.

A ferromagnetic material 65b serving as a magnetic pinned layer whose magnetization direction is to be fixed is formed in a recessed portion provided in the P-type well region 63b. The ferromagnetic material 65b is provided as a source of the spin FET SN.

An anti-ferromagnetic material 67 is formed on the ferromagnetic material 65b. Tunnel barrier layers 64b are formed between the semiconductor substrate 61 and the ferromagnetic material 65b and between the semiconductor substrate 61 and the ferromagnetic ferroelectric material 66, respectively.

On a channel between the ferromagnetic material 65a and the ferromagnetic ferroelectric material 66, a floating gate FG is formed via a gate insulation layer. On the floating gate FG, for example, a gate to which an input signal φa is to be applied is formed via an insulation layer made of ONO (oxide/nitride/oxide).

Similarly, on a channel between the ferromagnetic materials 65a and 65b, a floating gate FG is formed via a gate insulation layer. On the floating gate FG, for example, a gate to which an input signal φb is to be applied is formed via an insulation layer made of ONO (oxide/nitride/oxide).

As has been described above, according to the first example, the spin FET according to examples of the present invention is applied to a re-configurable logic circuit, whereby a re-configurable logic circuit having excellent thermal stability can be achieved.

B. Second Example

FIG. 58 shows a second example of a re-configurable logic circuit.

In the present example, a spin FET according to examples of the present invention is connected in series between power supply terminals Vdd and Vss.

A spin FET SP is a P-channel type, and an input signal φa is inputted to a gate. With respect to the spin FET SP, the magnetization state of a magnetic recording unit is fixed to the parallel state in this example. A conductance Gm of the spin FET SP is set to "10", when the ratio of the conductance Gm of the spin FET SN has the following relationship.

A spin FET SN is an N-channel type, and an input signal φb is inputted to a gate. With respect to the spin FET SN, the magnetization state of a magnetic recording unit (parallel/anti-parallel) can be rewritten.

With respect to a conductance Gm of the spin FET SN, a material, a size and the like are determined so that a ratio between a value obtained when the parallel state is established and a value obtained when the anti-parallel state is established is "100:1", for example.

A ratio between the conductance Gm when the parallel state is established and the conductance Gm when the anti-parallel state is established may have a relationship reversed from the above-described one, i.e., "1:100".

With respect to the spin FETs SP and SN, as in the first example, a common floating gate can be provided. In this case, (φa+φb)/2 can be generated as a voltage Vfg of the floating gate. Thus, doing this is preferable when configuring a stable logic.

A signal V1 of a connection point between the spin FETs SP and SN is obtained as an output signal Vout via an inverter.

In a re-configurable logic circuit shown in FIG. 58, when the magnetization state of the magnetic recording unit of the spin FET SN is made parallel or anti-parallel, and then, its conductance Gm is set to "100" (in the case where the conductance Gm of the spin FET SP is set to "10"), the output signal Vout is obtained as OR (Y=A+B) of input signals φa and φb, as shown in Table 3.

TABLE 3

| SN: Parallel state (anti-parallel state) |
| Gm = 100 → OR gate Y = A + B |

| A | B | Vfg | SP | SN | V1 | Y(=Vout) |
|---|---|-----|-----|-----|-----|----------|
| 0 | 0 | 0   | On  | Off | 1   | 0        |
| 0 | 1 | ½   | On  | On  | 0   | 1        |
| 1 | 0 | ½   | On  | On  | 0   | 1        |
| 1 | 1 | 1   | Off | On  | 0   | 1        |

However, in Table 3, a logic value "1" is equivalent to "H (high)" and a logic value "0" is equivalent to "L (low)". A logic value "½" denotes an intermediate voltage of "H" and "L".

That is, when both of the input signals φa and φb are set to "1", the voltage Vfg of a common floating gate is set to "1". At this time, the spin FET SP is turned OFF, and the spin FET SN is turned ON. Thus, V1 is set to "0", and the output signal Vout is set to "1".

In addition, when both of the input signals φa and φb are set to "0", the voltage Vfg of the common floating gate is set to "0". At this time, the spin FET SP is turned ON, and the spin FET SN is turned OFF. Thus, V1 is set to "1", and the output signal Vout is set to "0".

Further, when one of the input signals φa and φb is set to "1" and the other one is set to "0", the voltage Vfg of the common floating gate is set to "½". At this time, both of the spin FETs SP and SN are turned ON.

However, the conductance Gm of the spin FET SP is set to "10", and the conductance Gm of the spin FET SN is set to "100". Thus, at this time, a ratio of a current flowing in the spin FETs SP and SN is set to "10:100"="1:10".

Therefore, a capability of pulling V1 down to Vss (="0") supersedes a capability of pulling V1 up to Vdd (="1"), V1 is set to "1", and the output signal Vout is set to "0".

In addition, in the re-configurable logic circuit shown in FIG. 58, when the magnetization state of the magnetic recording unit of the spin FET SN is made parallel or anti-parallel, and then, its conductance Gm is set to "1" (in the case where the conductance Gm of the spin FET SP is set to "10"), the output signal Vout is obtained as AND (Y=A·B) of input signals φa and φb, as shown in Table 4.

TABLE 4

SN: Anti-parallel state (parallel state)
Gm = 1 → AND gate Y = A · B

| A | B | Vfg | SP | SN | V1 | Y(=Vout) |
|---|---|-----|-----|-----|----|----------|
| 0 | 0 | 0   | On  | Off | 1  | 0        |
| 0 | 1 | ½   | On  | On  | 1  | 0        |
| 1 | 0 | ½   | On  | On  | 1  | 0        |
| 1 | 1 | 1   | Off | On  | 0  | 1        |

However, in Table 4, a logic value "1" is equivalent to "H (high)" and a logic value "0" is equivalent to "L (low)". A logic value "½" denotes an intermediate voltage of "H" and "L".

That is, when both of the input signals φa and φb are set to "1", the voltage Vfg of a common floating gate is set to "1". At this time, the spin FET SP is turned OFF, and the spin FET SN is turned ON. Thus, V1 is set to "0", and the output signal Vout is set to "1".

In addition, when both of the input signals φa and φb are set to "0", the voltage Vfg of the common floating gate is set to "0". At this time, the spin FET SP is turned ON, and the spin FET SN is turned OFF. Thus, V1 is set to "1", and the output signal Vout is set to "0".

Further, when one of the input signals φa and φb is set to "1" and the other one is set to "0", the voltage Vfg of the common floating gate is set to "½". At this time, both of the spin FETs SP and SN are turned ON.

However, the conductance Gm of the spin FET SP is set to "10", and the conductance Gm of the spin FET SN is set to "1". Thus, at this time, a ratio of a current flowing in the spin FETs SP and SN is set to "10:1".

Therefore, a capability of pulling V1 up to Vdd (="1") supersedes a capability of pulling V1 down to Vss (="0"), V1 is set to "1", and the output signal Vout is set to "0".

As has been described above, according to a re-configurable logic circuit to which a spin FET according to examples of the present invention has been applied, for example, the spin FET SN state (parallel/anti-parallel) is rewritten based on program data, and then, its conductance Gm is changed, whereby one of a plurality of logics can be selectively achieved by a single logic circuit without making redesign.

In the re-configurable logic circuit according to the present example, the P-channel type spin FET SP is fixed to the parallel state, and its conductance Gm is fixed to "10".

Here, with respect to the spin FET SP, its conductance Gm may be fixed to "10". Thus, for example, as shown in FIG. 59, a general P-channel MIS transistor SP may be used. Further, as shown in FIG. 60, a P-channel type spin FET SP in the anti-parallel state may be used.

Figure 60:
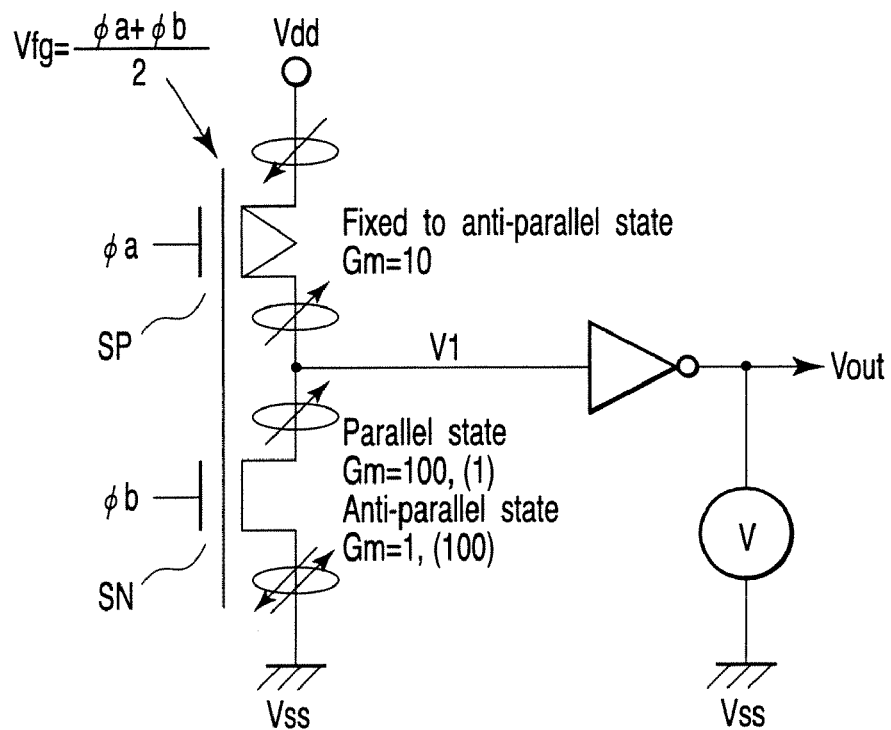
FIG. 60 is a circuit diagram showing a second example of a re-configurable logic circuit.
Figure 61:
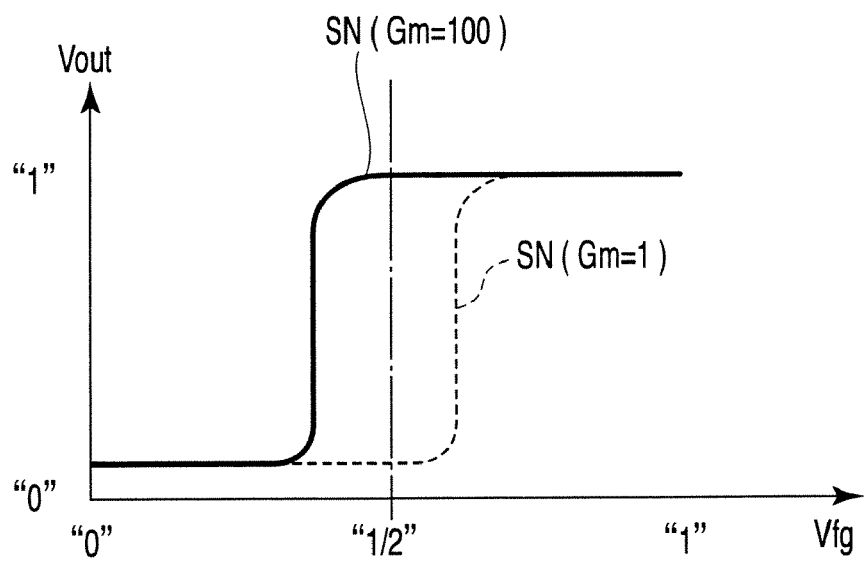
FIG. 61 is a view showing a relationship between a floating gate voltage Vfg and an output signal Vout.

FIG. 61 shows a relationship between a voltage Vfg and an output voltage Vout of a common floating gate in a re-configurable logic circuit shown in each of FIGS. 58 to 60.

This logic circuit is featured in that, when the voltage Vfg of the common floating gate is set to "½", an output voltage Vout changes according to the spin FET SN state (parallel/anti-parallel).

Now, a description will be given with respect to an example of a device structure of a re-configurable logic circuit shown in each of FIGS. 58 to 60.

FIG. 62 is a plan view showing a device structure of the re-configurable logic circuit shown in each of FIGS. 58 to 60; and FIG. 63 is a sectional view taken along the line LXIII-LXIII shown in FIG. 62.

This device is primarily featured in that floating gates FGs of the spin FETs SP and SN are electrically connected to each other, and is secondarily featured in that drains of the spin FETs SP and SN are composed of a ferromagnetic material 65*a*.

An element separation layer 62 having an STI structure, for example, is formed in a semiconductor substrate 62. In addition, an N-type well region 63*a* and a P-type well region 63*b* are formed in an element region surrounded by the element separation layer 62.

A ferromagnetic material 65*a* serving as a magnetic pinned layer whose magnetization direction is to be fixed is formed in a recessed portion provided at a boundary between the N-type well region 63*a* and the P-type well region 63*b*. The ferromagnetic material 65*a* is provided as a drain of each of the spin FETs SP and SN.

An anti-ferromagnetic material 67 is formed on the ferromagnetic material 65*a*. A tunnel barrier layer 64*a* is formed between the semiconductor substrate 61 and the ferromagnetic material 65*a*.

A ferromagnetic material 65*b* serving as a magnetic pinned layer whose magnetization direction is to be fixed is formed in a recessed portion provided in the N-type well region 63*a*. The ferromagnetic material 65*b* is provided as a source of the spin FET SP.

A ferromagnetic ferroelectric material (spin filter layer) 66 serving as a magnetic free layer whose magnetization direction changes is formed in a recessed portion provided in the P-type well region 63*b*. The ferromagnetic ferroelectric material 66 is provided as a source of the spin FET SN.

An anti-ferromagnetic material 67 is formed on the ferromagnetic material 65*b*. Tunnel barrier layers 64*b* are formed between the semiconductor substrate 61 and the ferromagnetic material 65*b* and between the semiconductor substrate 61 and the ferromagnetic ferroelectric material 66, respectively.

On a channel between the ferromagnetic materials 65*a* and 65*b*, a floating gate FG is formed via a gate insulation layer. On the floating gate FG, for example, a gate to which an input signal φa is to be applied is formed via an insulation layer made of ONO (oxide/nitride/oxide).

On a channel between the ferromagnetic material 65*a* and the ferromagnetic ferroelectric material 66, a floating gate FG is formed via a gate insulation layer. On the floating gate FG, for example, a gate to which an input signal φb is to be applied is formed via an insulation layer made of ONO (oxide/nitride/oxide).

As has been described above, according to the second example, the spin FET according to examples of the present invention is applied to a re-configurable logic circuit, whereby a re-configurable logic circuit having excellent thermal stability can be achieved.

C. Others

While the P-channel type spin FET and the N-channel type spine FET have been used in pair in the above first and second examples, an electric conductive type of a transistor is not limited in particular as long as the same logic can be achieved.

(2) Case of Application to Semiconductor Memory

Now, a description will be given with respect to an example in the case where a spin FET according to examples of the present invention is applied to a semiconductor memory.

A spin FET according to examples of the present invention itself can be used as memory cells of a semiconductor memory.

FIG. 64 shows an example of a semiconductor memory using a spin FET.

A memory cell array is composed of a plurality of spin FETs provided in an arrayed manner. In addition, for example, a single memory cell is composed of a single spin FET. One of the source/drain of the spin FET is connected to a bit line BL (L), and the other one is connected to a bit line BL (R). Both of the bit lines BL (L) and BL (R) extend in the same direction, in other words, in a column direction in the present example.

A CMOS type driver/sinker DS1 is connected to one end of the bit line BL (L). The driver/sinker DS1 is connected in series between power supply terminals Vdd and Vss, and is composed of a P-channel MOS transistor P1 and an N-channel MOS transistor N1 that control generation/shutdown of a spin injection current Is.

Then, one end of the bit line BL (L) is connected to a connection point of the MOS transistors P1 and N1; a control signal A is inputted to a gate of the P-channel MOS transistor P1; and a control signal C is inputted to a gate of the N-channel MOS transistor N1.

To the other end of the bit line BL (L), a sense amplifier S/A is connected via an N-channel MOS transistor ST1 serving as a column selector switch. The sense amplifier S/A is composed of a differential amplifier, for example, and judges a value of data stored in a spin FET based on a reference voltage Vref.

An output signal of the sense amplifier S/A is produced as read data DATA of the selected spin FET.

A control signal φj is produced as a column selector signal for selecting a column j, and is inputted to a gate of the N-channel MOS transistor ST1.

A CMOS type driver/sinker DS2 is connected to one end of the bit line BL (R). The driver/sinker DS2 is connected in series between the power supply terminals Vdd and Vss, and has a P-channel MOS transistor P2 and an N-channel MOS transistor N2 that control generation/shutdown of a spin injection current Is.

In addition, one end of the bit line BL (R) is connected to a connection point of the MOS transistors P2 and N2; a control signal B is inputted to a gate of the P-channel MOS transistor P2; and a control signal D is inputted to a gate of the N-channel MOS transistor N2.

An N-channel MOS transistor NE is connected between the bit line BL (R) and the power supply terminal Vss, and is turned ON at the time of read. A control signal E is provided as a row selector signal for selecting a row "i", and is inputted to a gate of the MOS transistor NE.

In such a semiconductor memory, for example, in the case where a spin FET serving as a memory cell is of N-channel type, writing into a magnetic recording unit of the spin FET is carried out as described below.

In the case where "0" is written, a control signal Wi is set to "H"; control signals A and C each are set to "L"; control signals B and D each are set to "H"; and a spin injection current "Is" flows from a driver/sinker DS1 to a driver/sinker DS2.

In the case where "1" is written, the control signal Wi is set to "H"; the control signals A and C each are set to "H"; the control signals B and D each are set to "L"; and the spin injection current "Is" flows from the driver/sinker DS2 to the driver/sinker DS1.

In addition, data is read out by setting the control signal Wi to "H"; the control signals A and B to "H"; the control signals C and D to "L"; and the control signals E and φj to "H"; and then, supplying a read current from the sense amplifier S/A to the MOS transistor NE via the spin FET.

A value of the read current is smaller than that of the spin injection current, preventing the occurrence of erroneous writing at the time of read.

(3) Case of Configuring System by Mounting on a Chip

Figure 65:
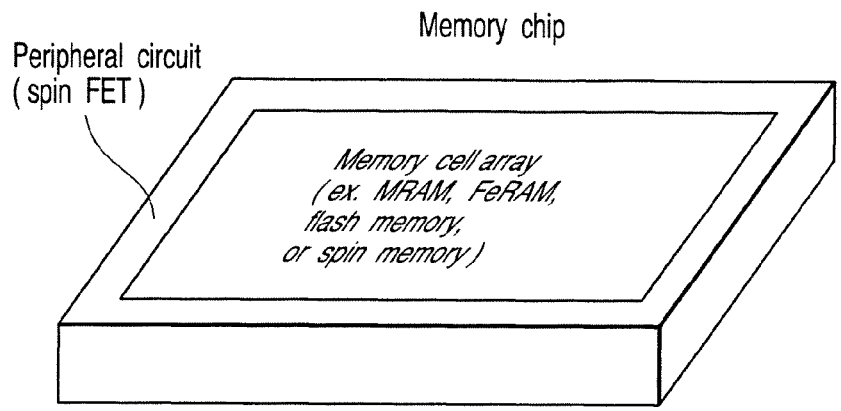
FIG. 65 is a view showing a memory chip.

FIG. 65 shows an example of a semiconductor memory.

A spin FET according to examples of the present invention is used for a peripheral circuit of a semiconductor memory. A memory cell array includes, for example, an MRAM (magnetic random access memory), a FeRAM (ferroelectric random access memory), or a flash memory (such as NAND-type or NOR-type).

In addition, as a memory cell array, it is possible to use a spin memory based on a new principle according to examples of the present invention.

Figure 66:
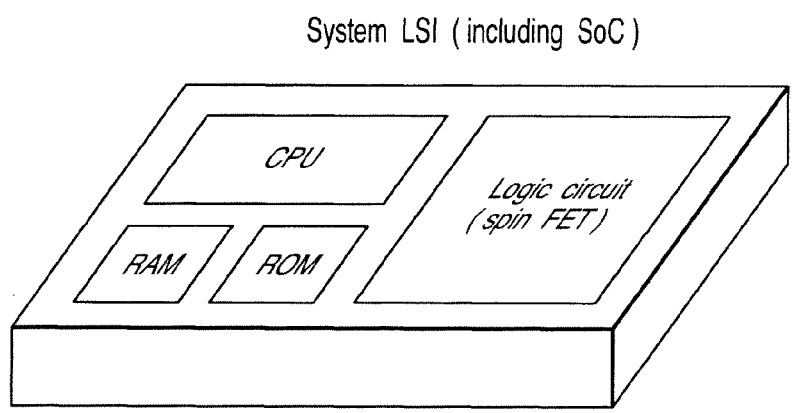
FIG. 66 is a view showing a system LSI.

FIG. 66 shows an example of a system LSI.

The system LSI includes a SoC (system on chip)

The spin FET according to examples of the present invention is used for a logic circuit configuring a system LSI, for example. A CPU (central processing unit) may be composed of a general CMOS circuit or may be composed of the spin FET according to examples of the present invention.

In addition, with respect to a ROM (read only memory), in addition to a nonvolatile semiconductor memory such as a flash memory, there can be used a semiconductor memory using the spin FET according to examples of the present invention as a memory cell, a spin memory and the like according to examples of the present invention.

A RAM (random access memory) is composed of a memory that enables high speed operation such as SRAM or DRAM.

Figure 67:
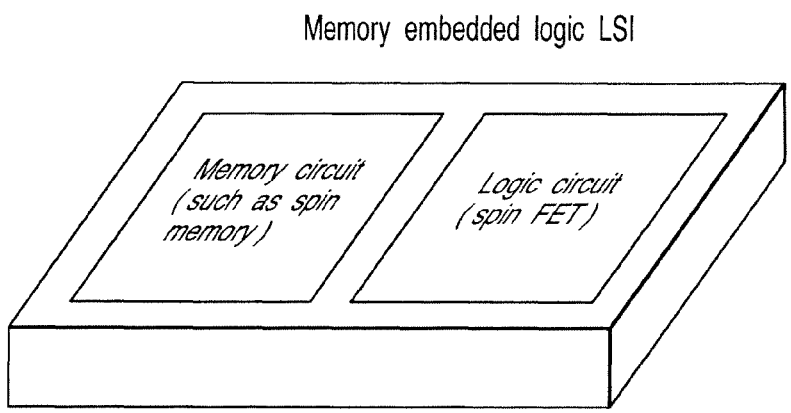
FIG. 67 is a view showing a memory embedded logic LSI.

FIG. 67 shows an example of a memory embedded logic LSI.

A spin FET according to examples of the present invention is used for a logic circuit. In addition, with respect to a memory circuit, in addition to a general semiconductor memory, there can be used a semiconductor memory using the spin FET according to examples of the present invention as a memory cell, a spin memory and the like according to examples of the present invention.

7. Others

According to examples of the present invention, low power consumption and high reliability of a spin FET and a spin memory can be achieved. In addition, in the case of the spin FET, a re-configurable logic circuit that is mountable with a nonvolatile semiconductor memory can be achieved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A spin FET comprising:
   a magnetic pinned layer whose magnetization direction is fixed;
   a magnetic free layer whose magnetization direction is changed;
   a channel between the magnetic pinned layer and the magnetic free layer;
   a gate electrode provided on the channel via a gate insulation layer;
   a multiferroic layer having a magnetic coupling with the magnetic free layer, which is provided on the magnetic free layer, a magnetization direction of the multiferroic layer being changed by an electric field within the multiferroic layer; and
   a driver/sinker which supplies a spin injection current to the magnetic free layer and the multiferroic layer,
   wherein the multiferroic layer generates spin polarization electrons and generates the electric field by the spin injection current, the magnetization reversal of the magnetic free layer is executed by the spin polarization electrons, and the magnetic coupling between the multiferroic layer and the magnetic free layer.

2. The spin FET according to claim 1, further comprising a tunnel barrier layer which is provided at least one of between the magnetic pinned layer and the channel and between the magnetic free layer and the channel.

3. The spin FET according to claim 1, wherein the multiferroic layer is composed of one of a ferromagnetic ferroelectric material, a ferrimagnetic ferroelectric or an anti-ferromagnetic ferroelectric material which is not zero in net magnetic moment on an interface between adjacent ferromagnetic layers, and a composite material having a ferromagnetic nano-structure and a ferroelectric nano-structure.

4. The spin FET according to claim 1, wherein the multiferroic layer is composed of one of $Cr_2O_3$, $Bi_2FeCrO_6$, $BiFeO_3$, $Bi_{1-x}Ba_xFe_3O_4$, a $BaTiO_3$—$CoFe_2O_4$ nano structure, and a $PbTiO_3$—$CoFe_2O_4$ nano-structure.

5. The spin FET according to claim 1, wherein a magnetization direction of the magnetic free layer is determined depending on an orientation of a voltage applied to the multiferroic layer.

6. The spin FET according to claim 1, wherein the multiferroic layer is composed of a composite material in which a rate of a ferromagnetic material and a rate of a ferroelectric material continuously change in a thickness direction of the multiferroic layer.

7. The spin FET according to claim 6, wherein the thickness direction of the multiferroic layer is a vertical direction that is vertical to a surface of a semiconductor substrate, and magnetization direction of residual magnetization of the ferromagnetic material is the vertical direction.

8. The spin FET according to claim 6, wherein the thickness direction of the multiferroic layer is a vertical direction that is vertical to a surface of a semiconductor substrate, and magnetization direction of residual magnetization of the ferromagnetic material is a horizontal direction that is horizontal to a surface of the semiconductor substrate.

9. The spin FET according to claim 1, wherein the multiferroic layer is composed of one of a ferrimagnetic ferroelectric material and an anti-ferromagnetic ferroelectric material.

10. The spin FET according to claim 9, wherein the multiferroic layer is $Cr_2O_3$.

11. The spin FET according to claim 1, wherein a magnetization reversal of the magnetic free layer is performed by spin polarization electrons which is generated by a spin injection current, and is assisted by a magnetization reversal of the multiferroic layer.

12. The spin FET according to claim 11, wherein the electric field is generated when the spin injection current flows through the multiferroic layer.

13. A spin FET comprising:
    a magnetic pinned layer whose magnetization direction is fixed;
    a magnetic free layer whose magnetization direction is changed;
    a channel between the magnetic pinned layer and the magnetic free layer;
    a gate electrode provided on the channel via a gate insulation layer; and
    a multiferroic layer having a magnetic coupling with the magnetic free layer, which is provided on the magnetic free layer, a magnetization direction of the multiferroic layer being changed by an electric field which is generated within the multiferroic layer by applying a voltage between the gate electrode and the multiferroic layer, and a magnetization reversal of the magnetic free layer executed by the magnetic coupling between the multiferroic layer and the magnetic free layer.

14. The spin FET according to claim 13, wherein the multiferroic layer is composed of one of a ferromagnetic ferroelectric material, a ferrimagnetic ferroelectric or an anti-ferromagnetic ferroelectric material which is not zero in net magnetic moment on an interface between adjacent ferromagnetic layers, and a composite material having a ferromagnetic nano-structure and a ferroelectric nano-structure.

15. The spin FET according to claim 13, wherein the multiferroic layer is composed of one of $Cr_2O_3$, $Bi_2FeCrO_6$, $BiFeO_3$, $Bi_{1-x}Ba_xFe_3O_4$, a $BaTiO_3$—$CoFe_2O_4$ nano structure, and a $PbTiO_3$—$CoFe_2O_4$ nano-structure.

16. The spin FET according to claim 13, wherein a magnetization direction of the magnetic free layer is determined depending on an orientation of a voltage applied to the multiferroic layer.

17. The spin FET according to claim 13, wherein the multiferroic layer is composed of a composite material in which a rate of a ferromagnetic material and a rate of a ferroelectric material continuously change in a thickness direction of the multiferroric layer.

18. The spin FET according to claim 17, wherein the thickness direction of the multiferroic layer is a vertical direction that is vertical to a surface of a semiconductor substrate, and magnetization direction of residual magnetization of the ferromagnetic material is the vertical direction.

19. The spin FET according to claim 17, wherein the thickness direction of the multiferroic layer is a vertical direction that is vertical to a surface of a semiconductor substrate, and magnetization direction of residual magnetization of the ferromagnetic material is a horizontal direction that is horizontal to a surface of the semiconductor substrate.

20. The spin FET according to claim 13, wherein the multiferroic layer is composed of one of a ferrimagnetic ferroelectric material and an anti-ferromagnetic ferroelectric material.

21. The spin FET according to claim 20, wherein the multiferroic layer is $Cr_2O_3$.

22. The spin FET according to claim 13, further comprising a source/drain electrode which is provided on the multiferroic layer,
    wherein the magnetization direction of the multiferroic layer is changed by supplying a voltage between the gate electrode and the source/drain electrode.

* * * * *